(12) United States Patent
Kanaya

(10) Patent No.: US 8,085,385 B2
(45) Date of Patent: Dec. 27, 2011

(54) MOVABLE BODY DRIVE METHOD AND MOVABLE BODY DRIVE SYSTEM, AND PATTERN FORMATION METHOD AND PATTERN FORMATION APPARATUS

(75) Inventor: Yuho Kanaya, Kumagaya (JP)

(73) Assignee: Nikon Corporation, Tokyo (JP)

( * ) Notice: Subject to any disclaimer, the term of this patent is extended or adjusted under 35 U.S.C. 154(b) by 558 days.

(21) Appl. No.: 12/230,068

(22) Filed: Aug. 22, 2008

(65) Prior Publication Data

US 2009/0073405 A1   Mar. 19, 2009

Related U.S. Application Data

(60) Provisional application No. 60/960,157, filed on Sep. 18, 2007.

(30) Foreign Application Priority Data

Aug. 24, 2007   (JP) .................................. 2007-219103

(51) Int. Cl.
*G03B 27/58* (2006.01)
*G03B 27/62* (2006.01)

(52) U.S. Cl. ........................................... 355/72; 355/75

(58) Field of Classification Search .................... 355/53, 355/72–76; 310/10, 12; 318/640, 649
See application file for complete search history.

(56) References Cited

U.S. PATENT DOCUMENTS

| | | | |
|---|---|---|---|
| 5,003,342 A | 3/1991 | Nishi | |
| 5,424,552 A | 6/1995 | Tsuji et al. | |
| 6,819,433 B2 | 11/2004 | Takai et al. | |
| 6,859,260 B2 | 2/2005 | Nelson et al. | |
| 6,897,963 B1 * | 5/2005 | Taniguchi et al. | ............ 356/500 |
| 7,528,965 B2 * | 5/2009 | Loopstra et al. | ............ 356/614 |
| 2004/0179180 A1 | 9/2004 | Miura | |
| 2005/0128456 A1 | 6/2005 | Nelson et al. | |
| 2006/0187436 A1 | 8/2006 | Nelson et al. | |

(Continued)

FOREIGN PATENT DOCUMENTS

| | | |
|---|---|---|
| EP | 0 984 329 A2 | 3/2000 |
| EP | 1 582 933 A2 | 10/2005 |
| JP | A-61-196532 | 8/1986 |

(Continued)

OTHER PUBLICATIONS

Dec. 2, 2008 Written Opinion issued in Application No. PCT/JP2008/002265 (with English translation).

*Primary Examiner* — Hung Henry Nguyen
(74) *Attorney, Agent, or Firm* — Oliff & Berridge, PLC

(57) ABSTRACT

A first positional information of a wafer stage is measured using an interferometer system such as, for example, a Z interferometer. At the same time, a second positional information of the wafer stage is measured using a surface position measurement system such as, for example, two Z heads. Moving average is applied to a difference between the first positional information and the second positional information for a predetermined measurement time to set a coordinate offset, and the coordinate offset is used to inspect the reliability of output signals of the surface position measurement system. When the output signals are confirmed to be normal, servo control of the wafer stage is performed using a sum of the first positional information and the coordinate offset. According to the servo control by this hybrid method, drive control of the wafer stage which has the stability of the interferometer and the precision of the Z heads becomes possible.

30 Claims, 29 Drawing Sheets

U.S. PATENT DOCUMENTS

| | | |
|---|---|---|
| 2006/0238731 A1 | 10/2006 | Beems et al. |
| 2007/0051160 A1 | 3/2007 | Pril et al. |
| 2007/0195296 A1 | 8/2007 | Van Der Pasch et al. |
| 2007/0263191 A1 | 11/2007 | Shibazaki |
| 2008/0043212 A1 | 2/2008 | Shibazaki |
| 2008/0088843 A1 | 4/2008 | Shibazaki |

FOREIGN PATENT DOCUMENTS

| | | |
|---|---|---|
| JP | A-05-160003 | 6/1993 |
| JP | A-5-160003 | 6/1993 |
| JP | A-6-241720 | 9/1994 |
| JP | A-2003-031493 | 1/2003 |
| JP | A-2003-31493 | 1/2003 |

\* cited by examiner

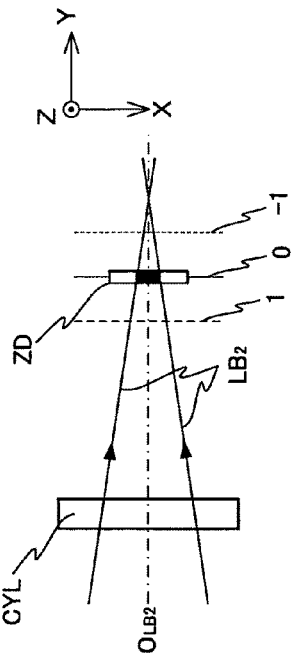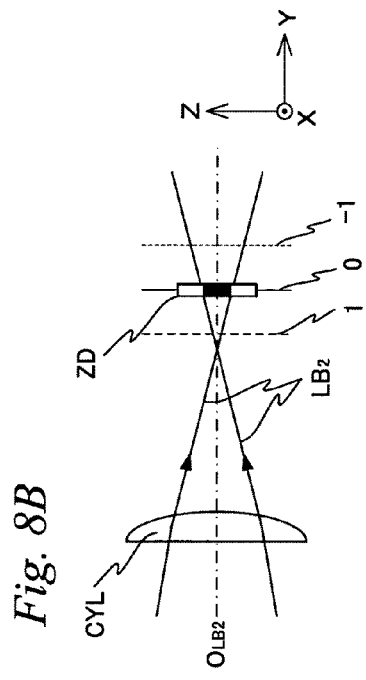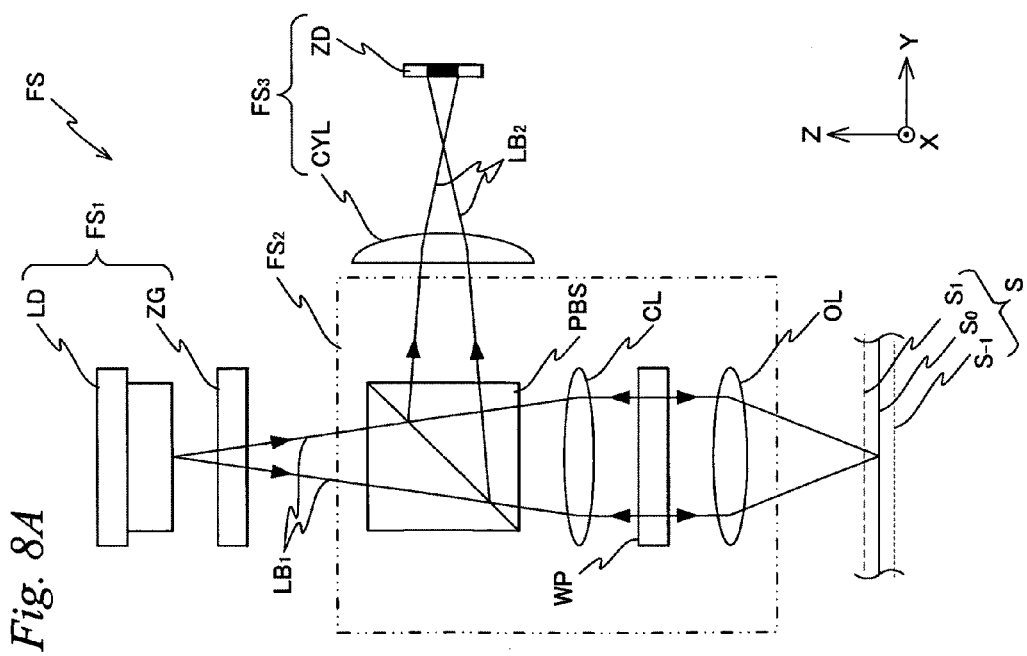

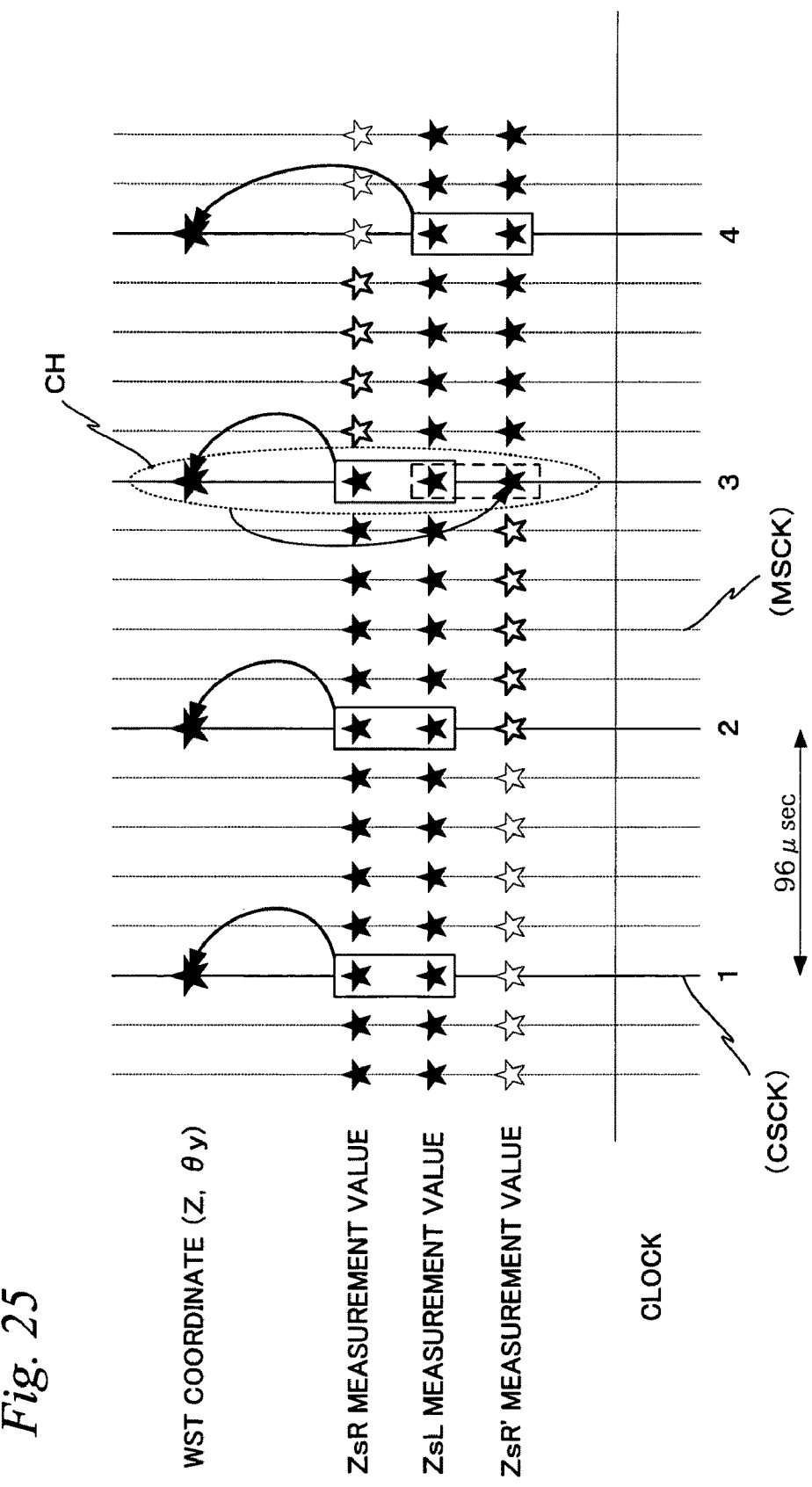

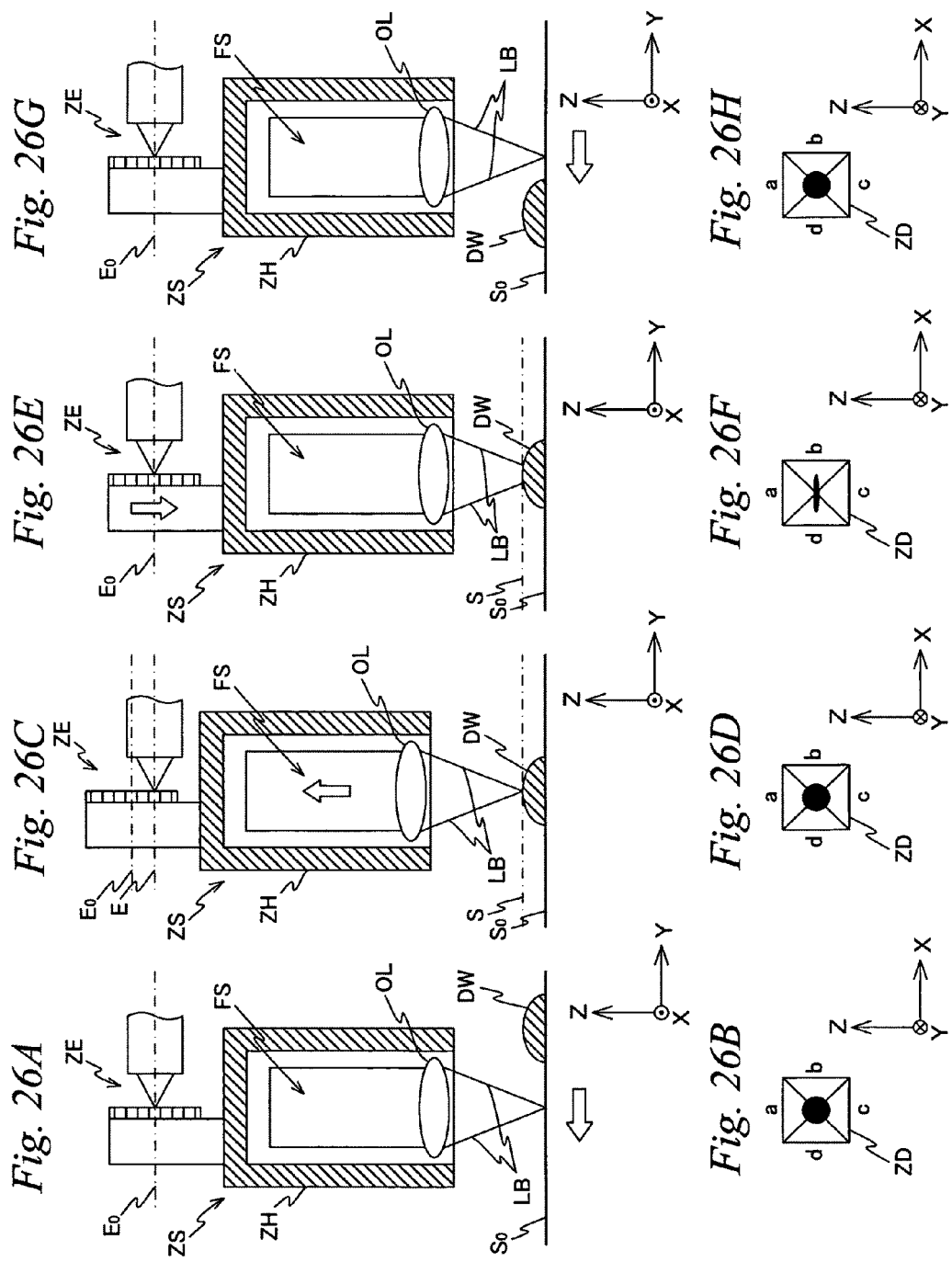

MOVABLE BODY DRIVE METHOD AND MOVABLE BODY DRIVE SYSTEM, AND PATTERN FORMATION METHOD AND PATTERN FORMATION APPARATUS

CROSS-REFERENCE TO RELATED APPLICATIONS

This non-provisional application claims the benefit of Provisional Application No. 60/960,157 filed Sep. 18, 2007, the disclosure of which is hereby incorporated herein by reference in its entirety.

BACKGROUND OF THE INVENTION

1. Field of the Invention

The present invention relates to movable body drive methods and movable body drive systems, and pattern formation methods and pattern formation apparatuses, and more particularly, to a movable body drive method and a movable body drive system that drives a movable body substantially along a two-dimensional plane, and a pattern formation method using the movable body drive method and a pattern formation apparatus equipped with the movable body drive system.

2. Description of the Background Art

Conventionally, in a lithography process for manufacturing electron devices (microdevices) such as semiconductor devices (such as integrated circuits) and liquid crystal display devices, exposure apparatuses such as a projection exposure apparatus by a step-and-repeat method (a so-called stepper) and a projection exposure apparatus by a step-and-scan method (a so-called scanning stepper (which is also called a scanner) are mainly used.

However, the surface of a wafer serving as a substrate subject to exposure is not always flat, for example, by undulation and the like of the wafer. Therefore, especially in a scanning exposure apparatus such as a scanner and the like, when a reticle pattern is transferred onto a shot area on a wafer by a scanning exposure method, positional information (surface position information) related to an optical axis direction of a projection optical system of the wafer surface is detected at a plurality of detection points set in an exposure area, for example, using a multiple point focal point position detection system (hereinafter also referred to as a "multipoint AF system") and the like, and based on the detection results, a so-called focus leveling control is performed (refer to, for example, Kokai (Japanese Patent Unexamined Application Publication) No. 6-283403) to control the position in the optical axis direction and the inclination of a table or a stage holding a wafer so that the wafer surface constantly coincides with an image plane (within the focal depth of the image plane) of the projection optical system in the exposure area.

Further, with the stepper or the scanner and the like, wavelength of exposure light used with finer integrated circuits is becoming shorter year by year, and numerical aperture of the projection optical system is also gradually increasing (larger NA), which improves the resolution. Meanwhile, due to shorter wavelength of the exposure light and larger NA in the projection optical system, the depth of focus had become extremely small, which caused a risk of focus margin shortage during the exposure operation. Therefore, as a method of substantially shortening the exposure wavelength while substantially increasing (widening) the depth of focus when compared with the depth of focus in the air, the exposure apparatus that uses the liquid immersion method has recently begun to gather attention (refer to, for example, the pamphlet of International Publication No. 2004/053955).

However, in the exposure apparatus using this liquid immersion method or other exposure apparatus whose distance (working distance) between the lower end surface of the projection optical system and the wafer is small, it is difficult to place the multipoint AF system in the vicinity of the projection optical system. Meanwhile, in the exposure apparatus, in order to realize exposure with high precision, realizing surface position control of the wafer with high precision is required.

Further, with the stepper or the scanner or the like, position measurement of the stage (the table) which holds a substrate (for example, a wafer) subject to exposure is performed in general, using a laser interferometer having a high resolution. However, the optical path length of the laser interferometry beam which measures the position of the stage is around several hundred mm or more, and furthermore, due to finer patterns owing to higher integration of semiconductor devices, position control of the stage with higher precision is becoming required. Therefore, short-term variation of measurement values which is caused by air fluctuation which occurs due to the influence of temperature fluctuation or temperature gradient of the atmosphere on the beam optical path of the laser interferometer can no longer be ignored.

Accordingly, in the case of performing position control of the table in an optical axis direction and in a tilt direction with respect to the plane orthogonal to the optical axis, including focus leveling control of the wafer during exposure, based on measurement values of the interferometer, it is desirable to correct measurement errors caused by air fluctuation and the like of the interferometer by some sort of method.

SUMMARY OF THE INVENTION

According to a first aspect of the present invention, there is provided a movable body drive method in which a movable body is driven substantially along a two-dimensional plane, the method comprising: a drive process in which positional information of the movable body related to at least one of a direction orthogonal to the two dimensional plane and a tilt direction with respect to the two-dimensional plane is detected, using a first detection device which detects positional information of the movable body in a direction orthogonal to the two-dimensional plane from measurement results using measurement light irradiated along the two-dimensional plane between the outside of an operating area of the movable body and the movable body, and a second detection device that has at least one detection position placed in at least a part of an operating area of the movable body, and detects positional information of the movable body in a direction orthogonal to the two-dimensional plane using detection information detected when the movable body is positioned at the detection point, and the movable body is driven based on positional information detected by the first detection device in at least one of a direction orthogonal to the two-dimensional plane and a tilt direction with respect to the two-dimensional plane, and the movable body is also driven so that positional information detected by the first detection device when the movable body is positioned at the detection position of the second detection device is adjusted, using positional information detected by the second detection device.

According to this method, the movable body can be driven with good precision in at least one of a direction orthogonal to the two-dimensional plane and a tilt direction with respect to the two-dimensional plane, based on the positional information detected by the first detection device whose error component has been corrected, while correcting error components of the positional information detected by the first detection device caused by air fluctuation of a measurement beam irradiated along the two-dimensional plane between the outside of the operating area of the movable body and the movable body.

According to a second aspect of the present invention, there is provided a first pattern formation method to form a pattern on an object wherein a movable body on which the object is mounted is driven using the movable body drive method according to the present invention to perform pattern formation to the object.

According to this method, by forming a pattern on the object mounted on the movable body which is driven with good precision using the first movable body drive method of the present invention, it becomes possible to form a pattern on the object with good accuracy.

According to a third aspect of the present invention, there is provided a second pattern formation method in which a pattern is formed on an object held by a movable body moving substantially along a two-dimensional plane, the method comprising: a drive process in which while positional information of the movable body in a direction orthogonal to the two-dimensional plane and a tilt direction with respect to the two-dimensional plane is detected, using a first detection device that detects positional information of the movable body related to a direction orthogonal to the two-dimensional plane and a tilt direction with respect to the two-dimensional plane from measurement results using a measurement beam irradiated along the two-dimensional plane between the outside of the operating area of the movable body and the movable body, and a second detection device that has a plurality of detection positions and detects positional information of the movable body related to a direction orthogonal to the two-dimensional plane at each detection position, the movable body is driven in at least one of a direction orthogonal to the two-dimensional plane and a tilt direction with respect to the two-dimensional plane based on the information detected by the first detection device; and a calibration process in which a predetermined calibration processing is performed using the detection information of the second detection device to improve alignment precision of a pattern with the object in at least one of a direction orthogonal to the two-dimensional plane and a tilt direction with respect to the two-dimensional plane.

According to this method, the movable body is driven in a direction orthogonal to the two-dimensional plane and a tilt direction with respect to the two-dimensional plane, based on the information detected by the first detection device which is superior in long-term stability of the measurement by the measurement principle, and a predetermined calibration processing is performed in order to improve alignment accuracy of the pattern and the object in a direction orthogonal to the two-dimensional plane and the tilt direction with respect to the two-dimensional plane, using information detected by the second detection device whose short-term stability of measurement is superior (measurement with high precision is possible) when compared with the first detection device. As a consequence, it becomes possible to form a pattern on an object held by the movable body with high accuracy, for over a long period of time.

According to a fourth aspect of the present invention, there is provided a movable body drive system in which a movable body is driven along a substantially two-dimensional plane, the system comprising: a first detection device that detects positional information of the movable body in a direction orthogonal to the two-dimensional plane from measurement results using a measurement beam irradiated along the two-dimensional plane between the outside of the operating area of the movable body and the movable body; a second detection device that has at least one detection position placed in at least a part of an operating area of the movable body, and detects positional information of the movable body in a direction orthogonal to the two-dimensional plane using detection information detected when the movable body is positioned at the detection point; and a controller that detects positional information of the movable body in at least one of a direction orthogonal to the two-dimensional plane and a tilt direction with respect to the two-dimensional plane using the first detection device and the second detection device, and drives the movable body in at least one of a direction orthogonal to the two-dimensional plane and a tilt direction with respect to the two-dimensional plane based on positional information detected by the first detection device, while adjusting the positional information of the movable body detected by the first detection device using the positional information detected by the second detection device.

According to this method, the movable body can be driven with good precision in at least one of a direction orthogonal to the two-dimensional plane and a tilt direction with respect to the two-dimensional plane, based on the positional information detected by the first detection device whose error component has been corrected, while correcting error components of the positional information detected by the first detection device caused by air fluctuation of a measurement beam irradiated along the two-dimensional plane between the outside of the operating area of the movable body and the movable body.

According to a fifth aspect of the present invention, there is provided a first pattern formation apparatus that forms a pattern on an object, the apparatus comprising: a patterning device which generates a pattern on the object; and the movable body drive system according to the present invention, wherein drive of a movable body on which the object is mounted is performed by the movable body drive system for pattern formation with respect to the object.

According to this apparatus, by generating a pattern with a patterning device on the object on the movable body driven with good precision by the movable body drive system of the present invention, it becomes possible to form a pattern on the object with good precision.

According to a sixth aspect of the present invention, there is provided a second pattern formation apparatus in which a pattern is formed on an object held by a movable body moving substantially along a two-dimensional plane, the apparatus comprising: a first detection device that detects positional information of the movable body related to a direction orthogonal to the two-dimensional plane and a tilt direction with respect to the two-dimensional plane from measurement results using a measurement beam irradiated along the two-dimensional plane between the outside of the operating area of the movable body and the movable body; a second detection device that has a plurality of detection positions, and detects positional information of the movable body related to a direction orthogonal to the two-dimensional plane at each detection position; and a controller which drives the movable body in at least one of a direction orthogonal to the two-dimensional plane and a tilt direction with respect to the two-dimensional plane based on information detected by the first detection device, while detecting positional information of the movable body in a direction orthogonal to the two-dimensional plane and a tilt direction with respect to the two-dimensional plane, using the first detection device and the second detection device, as well as performs a predetermined calibration processing using the detection information of the second detection device to improve alignment precision of a pattern with the object in at least one of a direction orthogonal to the two-dimensional plane and a tilt direction with respect to the two-dimensional plane.

According to this apparatus, the controller drives the movable body in a direction orthogonal to the two-dimensional plane and a tilt direction with respect to the two-dimensional plane, based on the information detected by the first detection device which is superior in long-term stability of the measurement by the measurement principle, and performs a predetermined calibration processing in order to improve alignment accuracy of the pattern and the object in a direction orthogonal to the two-dimensional plane and the tilt direction with respect to the two-dimensional plane, using information detected by the second detection device whose short-term stability of measurement is superior (measurement with high precision is possible) when compared with the first detection device. As a consequence, it becomes possible to form a pattern on an object held by the movable body with high accuracy, for over a long period of time.

BRIEF DESCRIPTION OF THE DRAWINGS

In the accompanying drawings:

FIG. 8A is a view showing an example of a focus sensor, FIGS. 8B and 8C are views used to explain the shape and function of a cylindrical lens in FIG. 8A;

FIG. 25 is a view conceptually showing position control of the wafer stage, uptake of a measurement value of the Z head, and the switching timing of the Z head;

FIGS. 26A to 26H are views to explain a handling procedure at the time of temporary abnormality output of the Z head, using the two states, which are scale servo and focus servo;

DESCRIPTION OF THE EMBODIMENTS

Hereinafter, an embodiment of the present invention will be described, referring to FIGS. 1 to 29.

Figure 1:
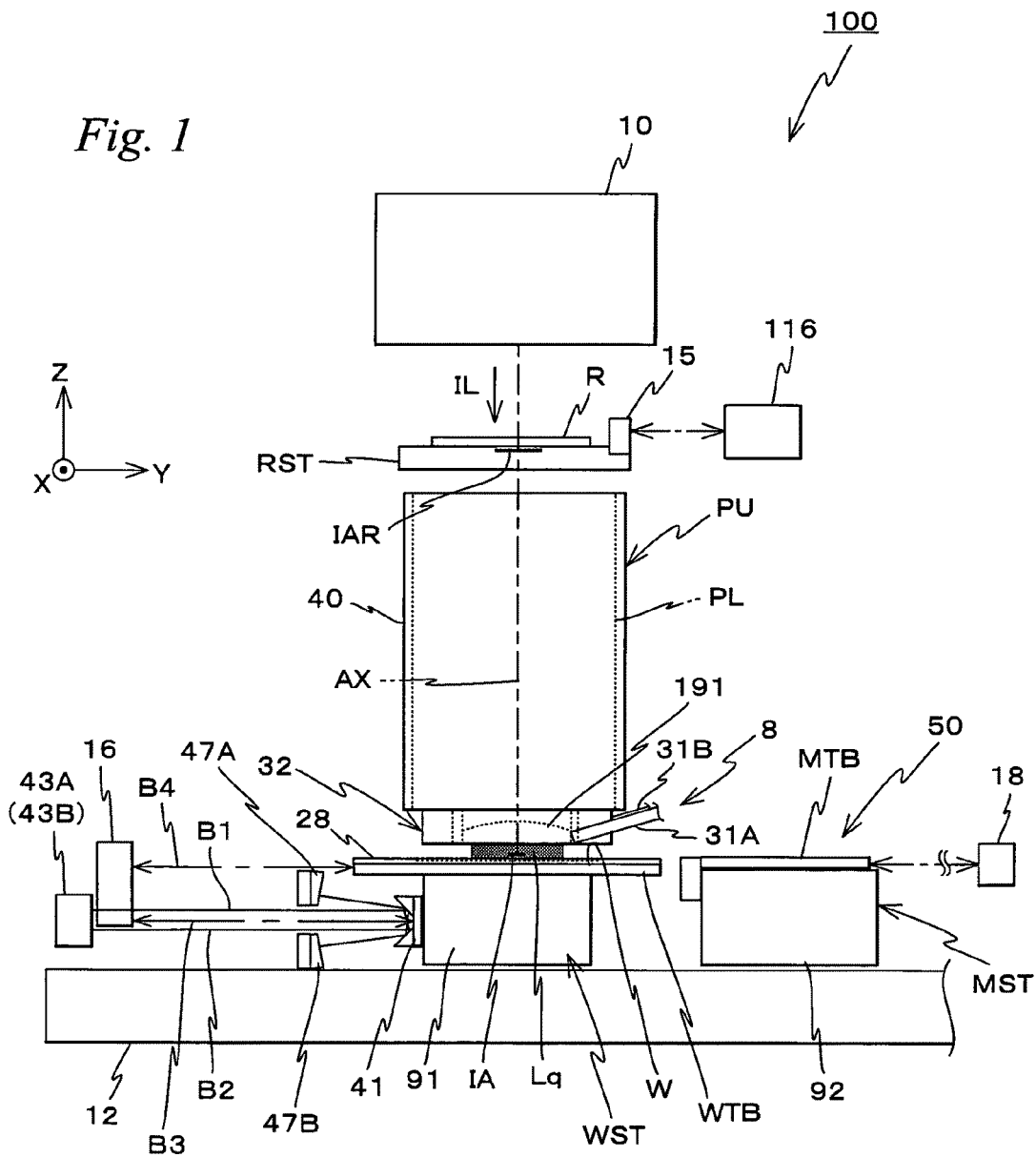
FIG. 1 is a view that schematically shows a configuration of an exposure apparatus of an embodiment.

FIG. 1 shows a schematic configuration of an exposure apparatus 100 in the embodiment. Exposure apparatus 100 is a projection exposure apparatus of the step-and-scan method, namely the so-called scanner. As it will be described later, a projection optical system PL is arranged in the embodiment, and in the description below, a direction parallel to an optical axis AX of projection optical system PL will be described as the Z-axis direction, a direction within a plane orthogonal to the Z-axis direction in which a reticle and a wafer are relatively scanned will be described as the Y-axis direction, a direction orthogonal to the Z-axis and the Y-axis will be described as the X-axis direction, and rotational (inclination) directions around the X-axis, the Y-axis, and the Z-axis will be described as θx, θy, and θz directions, respectively.

Exposure apparatus 100 is equipped with an illumination system 10, a reticle stage RST that holds a reticle R that is illuminated by an illumination light for exposure (hereinafter, referred to as illumination light, or exposure light) IL from illumination system 10, a projection unit PU that includes projection optical system PL that projects illumination light IL emitted from reticle R on a wafer W, a stage device 50 that has a wafer stage WST and a measurement stage MST, their control system, and the like. On wafer stage WST, wafer W is mounted.

Illumination system 10 includes a light source, an illuminance uniformity optical system, which includes an optical integrator and the like, and an illumination optical system that has a reticle blind and the like (none of which are shown), as is disclosed in, for example, Kokai (Japanese Patent Unexamined Application Publication) No. 2001-313250 (the corresponding U.S. Patent Application Publication No. 2003/0025890) and the like. Illumination system 10 illuminates a slit-shaped illumination area IAR which is set on reticle R with a reticle blind (a masking system) by illumination light (exposure light) IL with a substantially uniform illuminance. In this case, as illumination light IL, for example, an ArF excimer laser beam (wavelength 193 nm) is used. Further, as the optical integrator, for example, a fly-eye lens, a rod integrator (an internal reflection type integrator), a diffractive optical element or the like can be used.

On reticle stage RST, reticle R on which a circuit pattern or the like is formed on its pattern surface (the lower surface in FIG. 1) is fixed, for example, by vacuum chucking. Reticle stage RST is finely drivable or movable in within an XY plane by a reticle stage drive system 11 (not shown in FIG. 1, refer to FIG. 6) that includes a linear motor or the like, and reticle stage RST is also drivable in a scanning direction (in this case, the Y-axis direction, which is the lateral direction of the page surface in FIG. 1) at a designated scanning speed.

The positional information (including position (rotation) information in the θz direction) of reticle stage RST in the XY plane (movement plane) is constantly detected, for example, at a resolution of around 0.25 nm by a reticle laser interferometer (hereinafter referred to as a "reticle interferometer") 116, via a movable mirror 15 (the mirrors actually arranged are a Y movable mirror (or a retro reflector) that has a reflection surface which is orthogonal to the Y-axis direction and an X movable mirror that has a reflection surface orthogonal to the X-axis direction). The measurement values of reticle interferometer 116 are sent to a main controller 20 (not shown in FIG. 1, refer to FIG. 6). Main controller 20 computes the position of reticle stage RST in the X-axis direction, Y-axis direction, and the θz direction based on the measurement values of reticle interferometer 116, and also controls the position (and velocity) of reticle stage RST by controlling reticle stage drive system 11 based on the computation results. Incidentally, instead of movable mirror 15, the edge surface of reticle stage RST can be mirror polished so as to form a reflection surface (corresponding to the reflection surface of movable mirror 15). Further, reticle interferometer 116 can measure positional information of reticle stage RST related to at least one of the Z-axis, θx, and θy directions.

Projection unit PU is placed below reticle stage RST in FIG. 1. Projection unit PU includes a barrel 40, and projection optical system PL that has a plurality of optical elements which are held in a predetermined positional relation inside barrel 40. As projection optical system PL, for example, a dioptric system is used, consisting of a plurality of lenses (lens elements) that is disposed along an optical axis AX, which is parallel to the Z-axis direction. Projection optical system PL is, for example, a both-side telecentric dioptric system that has a predetermined projection magnification (such as one-quarter, one-fifth, or one-eighth times). Therefore, when illumination light IL from illumination system 10 illuminates illumination area IAR, a reduced image of the circuit pattern (a reduced image of a part of the circuit pattern) of reticle R within illumination area IAR is formed, with illumination light IL that has passed through reticle R which is placed so that its pattern surface substantially coincides with a first plane (an object plane) of projection optical system PL, in an area IA (also referred to as an exposure area) conjugate to illumination area IAR on wafer W whose surface is coated with a resist (a sensitive agent) and is placed on a second plane (an image plane) side, via projection optical system PL (projection unit PU). And by reticle stage RST and wafer stage WST being synchronously driven, the reticle is relatively moved in the scanning direction (the Y-axis direction) with respect to illumination area IAR (illumination light IL) while wafer W is relatively moved in the scanning direction (the Y-axis direction) with respect to exposure area IA (illumination light IL), thus scanning exposure of a shot area (divided area) on wafer W is performed, and the pattern of the reticle is transferred onto the shot area. That is, in the embodiment, the pattern is generated on wafer W according to illumination system 10, the reticle, and projection optical system PL, and then by the exposure of the sensitive layer (resist layer) on wafer W with illumination light IL, the pattern is formed on wafer W.

Incidentally, although it is not shown, projection unit PU is installed in a barrel platform supported by three struts via a vibration isolation mechanism. However, as well as such a structure, as is disclosed in, for example, the pamphlet of International Publication WO2006/038952 and the like, projection unit PU can be supported by suspension with respect to a mainframe member (not shown) placed above projection unit PU or with respect to a base member on which reticle stage RST is placed.

Incidentally, in exposure apparatus 100 of the embodiment, because exposure is performed applying a liquid immersion method, an opening on the reticle side becomes larger with the substantial increase of the numerical aperture NA of projection optical system PL. Therefore, in order to satisfy Petzval's condition and to avoid an increase in size of the projection optical system, a reflection/refraction system (a catodioptric system) which is configured including a mirror and a lens can be employed as a projection optical system. Further, in wafer W, in addition to a sensitive layer (a resist layer), for example, a protection film (a topcoat film) or the like which protects the wafer or a photosensitive layer can also be formed.

Figure 3:
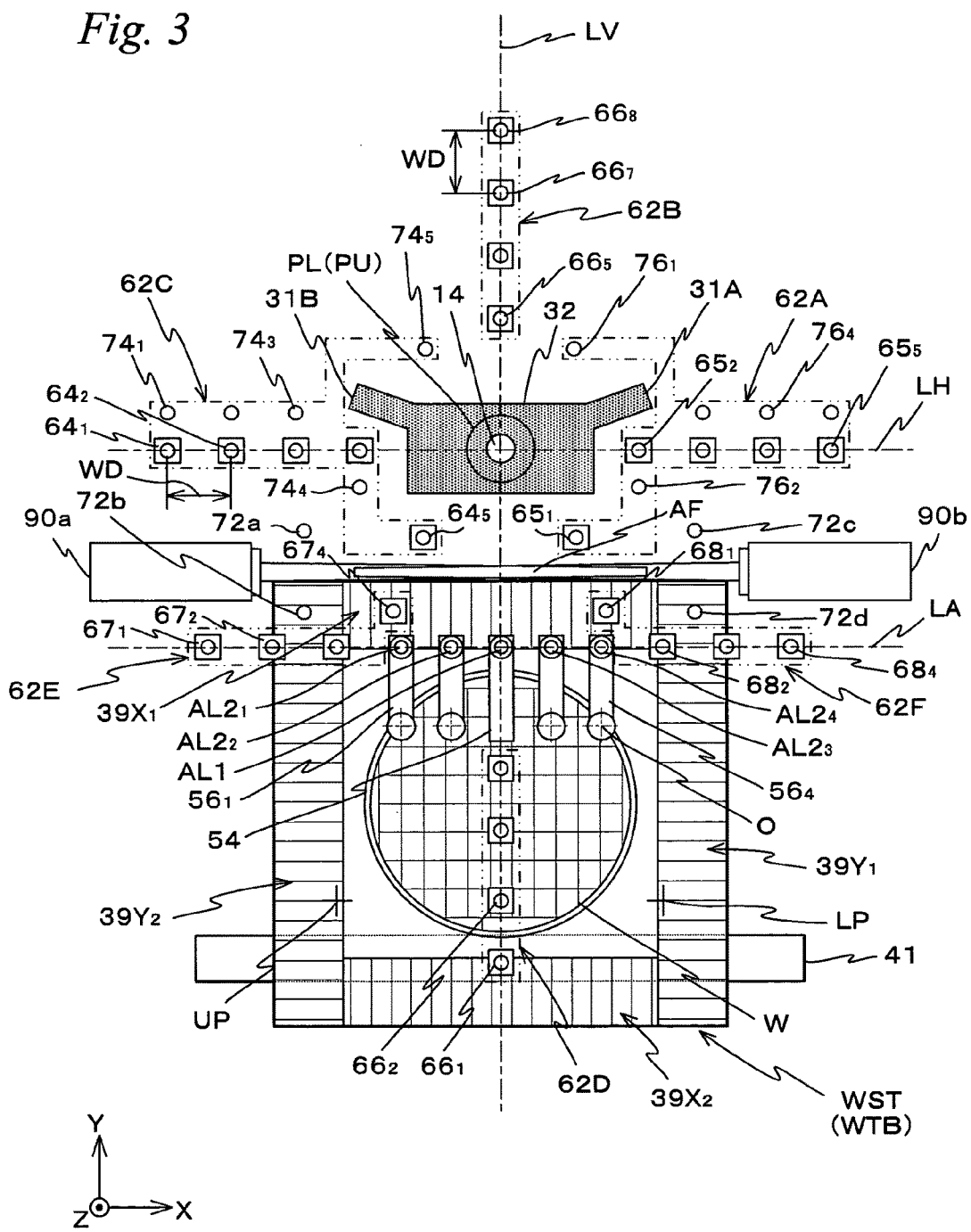
FIG. 3 is a planar view showing placement of various measurement devices (an encoder, alignment system, multipoint AF system, a Z head) which exposure apparatus of FIG. 1 comprises.

Further, in exposure apparatus 100 of the embodiment, in order to perform exposure applying the liquid immersion method, a nozzle unit 32 that constitutes part of a local liquid immersion device 8 is arranged so as to enclose the periphery of the lower end portion of barrel 40 that holds an optical element that is closest to an image plane side (wafer W side) that constitutes projection optical system PL, which is a lens (hereinafter, also referred to a "tip lens") 191 in this case. In the embodiment, as shown in FIG. 1, the lower end surface of nozzle unit 32 is set to be substantially flush with the lower end surface of tip lens 191. Further, nozzle unit 32 is equipped with a supply opening and a recovery opening of liquid Lq, a lower surface to which wafer W is placed facing and at which the recovery opening is arranged, and a supply flow channel and a recovery flow channel that are connected to a liquid supply pipe 31A and a liquid recovery pipe 31B respectively. Liquid supply pipe 31A and liquid recovery pipe 31B are slanted by around 45 degrees relative to the X-axis direction and the Y-axis direction in a planar view (when viewed from above) as shown in FIG. 3, and are placed symmetric to a straight line (a reference axis) LV which passes through the center (optical axis AX of projection optical system PL, coinciding also with the center of exposure area IA previously described in the embodiment) of projection unit PU and is also parallel to the Y-axis.

Figure 6:
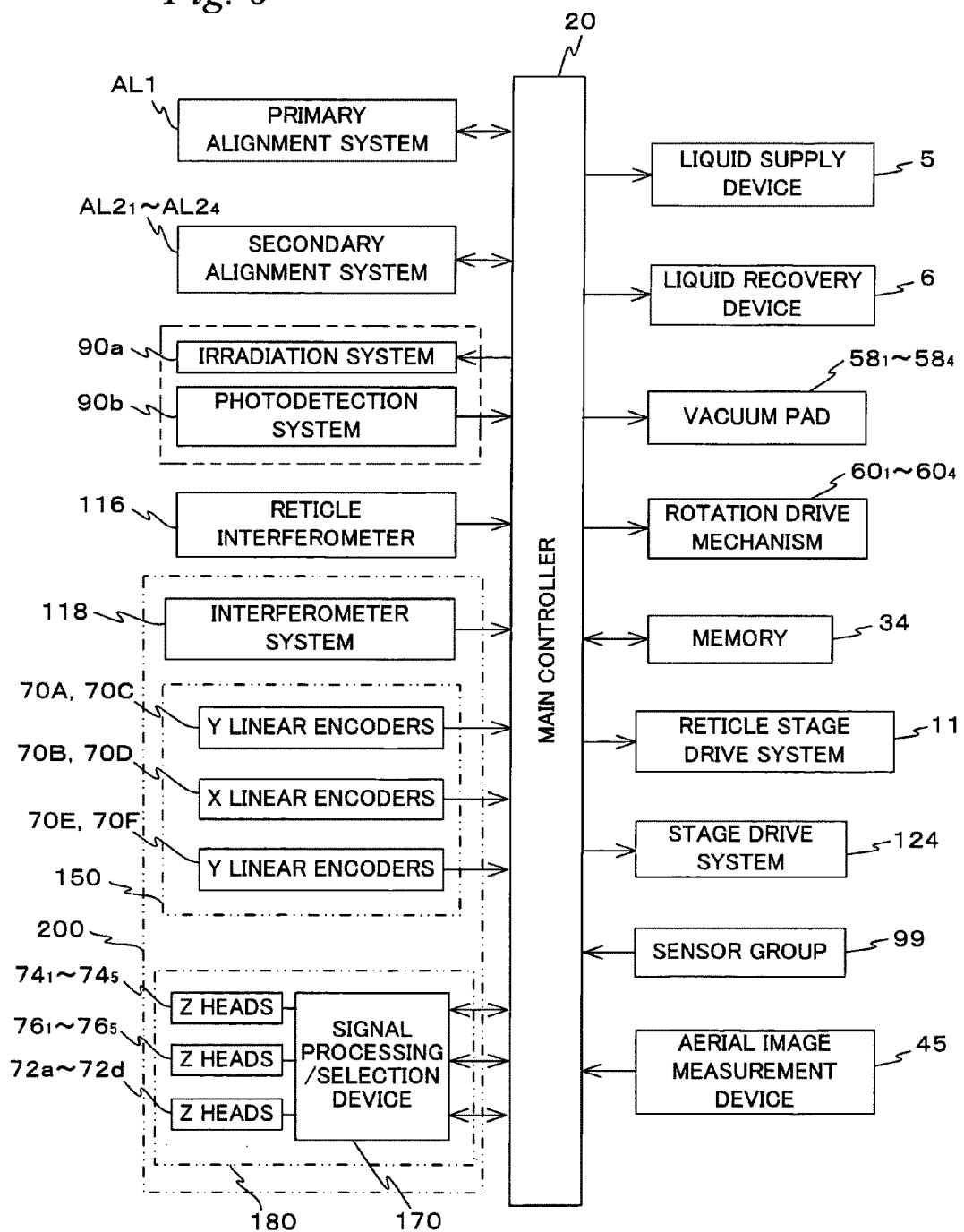
FIG. 6 is a block diagram showing a configuration of a control system of the exposure apparatus related to an embodiment.

One end of a supply pipe (not shown) is connected to liquid supply pipe 31A while the other end of the supply pipe is connected to a liquid supply device 5 (not shown in FIG. 1, refer to FIG. 6), and one end of a recovery pipe (not shown) is connected to liquid recovery pipe 31B while the other end of the recovery pipe is connected to a liquid recovery device 6 (not shown in FIG. 1, refer to FIG. 6).

Liquid supply device 5 includes a liquid tank for supplying liquid, a compression pump, a temperature controller, a valve for controlling supply/stop of the liquid to liquid supply pipe 31A, and the like. As the valve, for example, a flow rate control valve is preferably used so that not only the supply/stop of the liquid but also the adjustment of flow rate can be performed. The temperature controller adjusts the temperature of the liquid within the tank, for example, to nearly the same temperature as the temperature within the chamber (not shown) where the exposure apparatus is housed. Incidentally, the tank, the compression pump, the temperature controller, the valve, and the like do not all have to be equipped in exposure apparatus 100, and at least part of them can also be substituted by the equipment available in the plant or the like where exposure apparatus 100 is installed.

Liquid recovery device 6 includes a liquid tank for collecting liquid, a suction pump, a valve for controlling recovery/stop of the liquid via liquid recovery pipe 31B, and the like. As the valve, it is desirable to use a flow control valve similar to the valve of liquid supply device 5. Incidentally, the tank, the suction pump, the valve, and the like do not all have to be equipped in exposure apparatus 100, and at least part of them can also be substituted by the equipment available in the plant or the like where exposure apparatus 100 is installed.

In the embodiment, as liquid Lq described above, pure water (hereinafter, it will simply be referred to as "water" besides the case when specifying is necessary) that transmits the ArF excimer laser light (light with a wavelength of 193 nm) is to be used. Pure water can be obtained in large quantities at a semiconductor manufacturing plant or the like without difficulty, and it also has an advantage of having no adverse effect on the photoresist on the wafer, the optical lenses or the like.

Refractive index n of the water with respect to the ArF excimer laser light is around 1.44. In the water the wavelength of illumination light IL is 193 nm×1/n, shortened to around 134 nm.

Liquid supply device 5 and liquid recovery device 6 each have a controller, and the respective controllers are controlled by main controller 20 (refer to FIG. 6). According to instructions from main controller 20, the controller of liquid supply device 5 opens the valve connected to liquid supply pipe 31A to a predetermined degree to supply liquid (water) to the space between tip lens 191 and wafer W via liquid supply pipe 31A, the supply flow channel and the supply opening. Further, when the water is supplied, according to instructions from main controller 20, the controller of liquid recovery device 6 opens the valve connected to liquid recovery pipe 31B to a predetermined degree to recover the liquid (water) from the space between tip lens 191 and wafer W into liquid recovery device 6 (the liquid tank) via the recovery opening, the recovery flow channel and liquid recovery pipe 31B. During the supply and recovery operations, main controller 20 gives commands to the controllers of liquid supply device 5 and liquid recovery device 6 so that the quantity of water supplied to the space between tip lens 191 and wafer W constantly equals the quantity of water recovered from the space. Accordingly, a constant quantity of liquid (water) Lq (refer to FIG. 1) is held in the space between tip lens 191 and wafer W. In this case, liquid (water) Lq held in the space between tip lens 191 and wafer W is constantly replaced.

As is obvious from the above description, in the embodiment, local liquid immersion device 8 is configured including nozzle unit 32, liquid supply device 5, liquid recovery device 6, liquid supply pipe 31A and liquid recovery pipe 31B, and the like. Incidentally, a part of local liquid immersion device 8, for example, at least nozzle unit 32 may also be supported in a suspended state by a main frame (including the barrel platform previously described) that holds projection unit PU, or may also be arranged at another frame member that is separate from the main frame. Or, in the case projection unit PU is supported in a suspended state as is described earlier, nozzle unit 32 may also be supported in a suspended state integrally with projection unit PU, however, in the embodiment, nozzle unit 32 is arranged on a measurement frame that is supported in a suspended state independently from projection unit PU. In this case, projection unit PU does not have to be supported in a suspended state.

Incidentally, also in the case measurement stage MST is located below projection unit PU, the space between a measurement table (to be described later) and tip lens 191 can be filled with water in the similar manner to the manner described above.

Incidentally, in the description above, one liquid supply pipe (nozzle) and one liquid recovery pipe (nozzle) were arranged as an example, however, the present invention is not limited to this, and a configuration having multiple nozzles as is disclosed in, for example, the pamphlet of International Publication No. 99/49504, may also be employed, in the case such an arrangement is possible taking into consideration the relation with adjacent members. The point is that any configuration can be employed, as long as the liquid can be supplied in the space between optical member (tip lens) 191 in the lowest end constituting projection optical system PL and wafer W. For example, the liquid immersion mechanism disclosed in the pamphlet of International Publication No. 2004/053955, or the liquid immersion mechanism disclosed in the EP Patent Application Publication No. 1420298 can also be applied to the exposure apparatus of the embodiment.

Referring back to FIG. 1, stage device 50 is equipped with wafer stage WST and measurement stage MST placed above a base board 12, a measurement system 200 (refer to FIG. 6) which measures positional information of stages WST and MST, a stage drive system 124 (refer to FIG. 6) which drives stages WST and MST and the like. Measurement system 200 includes an interferometer system 118, an encoder system 150, and a surface position measurement system 180 as shown in FIG. 6. Incidentally, details on the configuration and the like of interferometer system 118, encoder system 150 and the like will be described later in the description.

Referring back to FIG. 1, on each bottom surface of wafer stage WST and measurement stage MST, a noncontact bearing (not shown), for example, a vacuum preload type hydrostatic air bearing (hereinafter, referred to as an "air pad") is arranged at a plurality of points, and wafer stage WST and measurement stage MST are supported in a noncontact manner via a clearance of around several μm above base board 12, by static pressure of pressurized air that is blown out from the air pad toward the upper surface of base board 12. Further, stages WST and MST are drivable independently within the XY plane, by stage drive system 124 (refer to FIG. 6) which includes a linear motor and the like.

Wafer stage WST includes a stage main section 91 and a wafer table WTB that is mounted on stage main section 91. Wafer table WTB and stage main section 91 are configured drivable in directions of six degrees of freedom (X, Y, Z, θx, θy, and θz) with respect to base board 12 by a drive system including a linear motor and a Z leveling mechanism (for example, including a voice coil motor and the like).

On wafer table WTB, a wafer holder (not shown) that holds wafer W by vacuum suction or the like is arranged. The wafer holder may also be formed integrally with wafer table WTB, but in the embodiment, the wafer holder and wafer table WTB are separately configured, and the wafer holder is fixed inside a recessed portion of wafer table WTB, for example, by vacuum suction or the like. Further, on the upper surface of wafer table WTB, a plate (liquid repellent plate) 28 is arranged, which has the surface (liquid repellent surface) substantially flush with the surface of wafer W mounted on the wafer holder to which liquid repellent processing with respect to liquid Lq is performed, has a rectangular outer shape (contour), and has a circular opening that is formed in the center portion and is slightly larger than the wafer holder (a mounting area of the wafer). Plate 28 is made of materials with a low coefficient of thermal expansion, such as glass or ceramics (e.g., such as Zerodur (the brand name) of Schott AG, $Al_2O_3$, or TiC), and on the surface of plate 28, a liquid repellent film is formed by, for example, fluorine resin materials, fluorine series resin materials such as polytetrafluoroethylene (Teflon (registered trademark)), acrylic resin materials, or silicon series resin materials. Further, as shown in a planar view of wafer table WTB (wafer stage WST) in FIG. 4A, plate 28 has a first liquid repellent area 28a whose outer shape (contour) is rectangular enclosing a circular opening, and a second liquid repellent area 28b that has a rectangular frame (annular) shape placed around the first liquid repellent area 28a. On the first liquid repellent area 28a, for example, at the time of an exposure operation, at least part of a liquid immersion area 14 (for example, refer to FIG. 13) that is protruded from the surface of the wafer is formed, and on the second liquid repellent area 28b, scales for an encoder system (to be described later) are formed. Incidentally, at least part of the surface of plate 28 does not have to be on a flush surface with the surface of the wafer, that is, may have a different height from that of the surface of the wafer. Further, plate 28 may be a single plate, however, in the embodiment, plate 28 is configured by combining a plurality of plates, for example, first and second liquid repellent plates that correspond to the first liquid repellent area 28a and the second liquid repellent area 28b respectively. In the embodiment, water is used as liquid Lq as is described above, and therefore, hereinafter the first liquid repellent area 28a and the second liquid repellent area 28b are also referred to as a first water repellent plate 28a and a second water repellent plate 28b.

In this case, exposure light IL is irradiated to the first water repellent plate 28a on the inner side, while exposure light IL is hardly irradiated to the second water repellent plate 28b on the outer side. Taking this fact into consideration, in the embodiment, a first water repellent area to which water repellent coat having sufficient resistance to exposure light IL (light in a vacuum ultraviolet region, in this case) is applied is formed on the surface of the first water repellent plate 28a, and a second water repellent area to which water repellent coat having resistance to exposure light IL inferior to the first water repellent area is applied is formed on the surface of the second water repellent plate 28b. In general, since it is difficult to apply water repellent coat having sufficient resistance to exposure light IL (in this case, light in a vacuum ultraviolet region) to a glass plate, it is effective to separate the water repellent plate into two sections, the first water repellent plate 28a and the second water repellent plate 28b which is the periphery of the first water repellent plate, in the manner described above. Incidentally, the present invention is not limited to this, and two types of water repellent coat that have different resistance to exposure light IL may also be applied on the upper surface of the same plate in order to form the first water repellent area and the second water repellent area. Further, the same kind of water repellent coat may be applied to the first and second water repellent areas. For example, only one water repellent area may also be formed on the same plate.

Figure 4A:
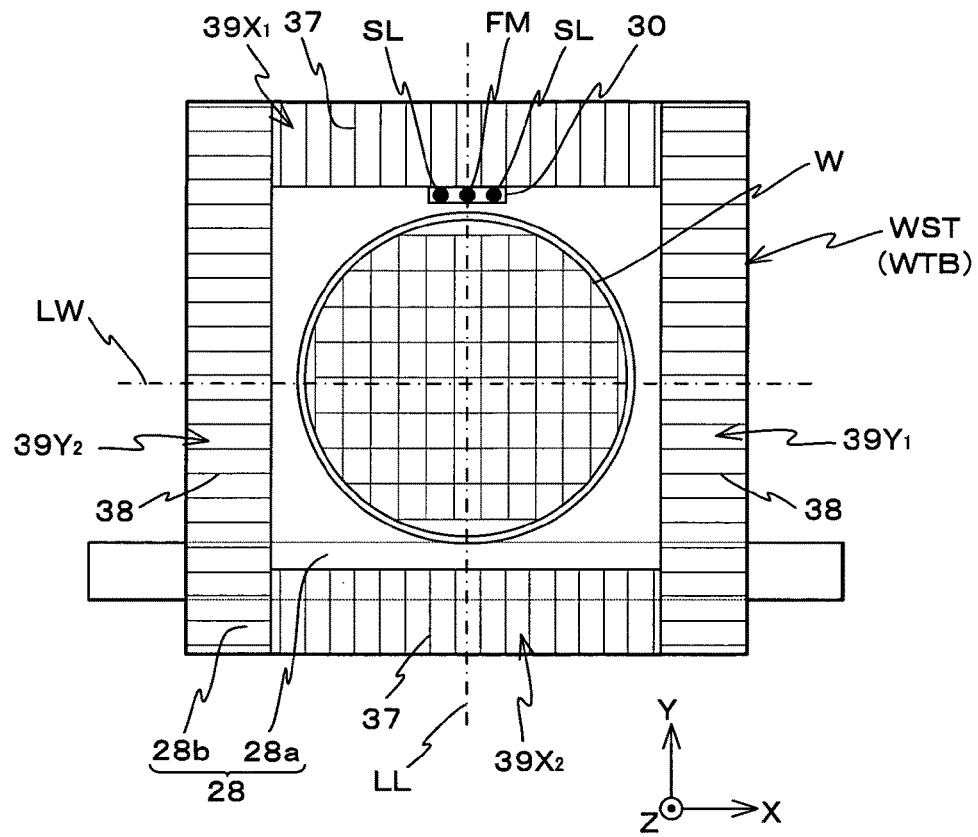
FIG. 4A is a planar view showing a wafer stage.

Further, as is obvious from FIG. 4A, at the end portion on the +Y side of the first water repellent plate 28a, a rectangular cutout is formed in the center portion in the X-axis direction, and a measurement plate 30 is embedded inside the rectangular space (inside the cutout) that is enclosed by the cutout and the second water repellent plate 28b. A fiducial mark FM is formed in the center in the longitudinal direction of measurement plate 30 (on a centerline LL of wafer table WTB), and a pair of aerial image measurement slit patterns (slit-shaped measurement patterns) SL are formed in the symmetrical placement with respect to the center of the fiducial mark on one side and the other side in the X-axis direction of fiducial mark FM. As each of aerial image measurement slit patterns SL, an L-shaped slit pattern having sides along the Y-axis direction and X-axis direction, or two linear slit patterns extending in the X-axis and Y-axis directions respectively can be used, as an example.

Figure 4B:
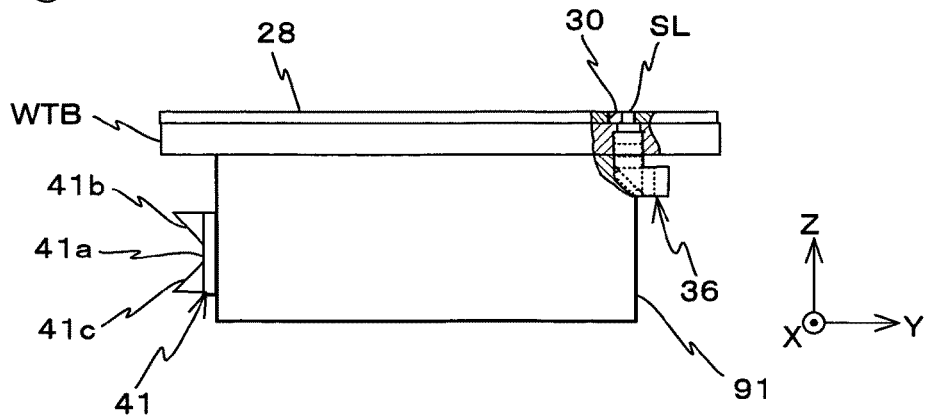
FIG. 4B is a schematic side view of a partially sectioned wafer stage WST.

Then, as is shown in FIG. 4B, inside wafer stage WST below each of aerial image measurement slit patterns SL, an L-shaped housing 36 in which an optical system containing an objective lens, a mirror, a relay lens and the like is housed is attached in a partially embedded state penetrating through part of the inside of wafer table WTB and stage main section 91. Housing 36 is arranged in pairs corresponding to the pair of aerial image measurement slit patterns SL, although omitted in the drawing.

The optical system inside housing 36 guides illumination light IL that has been transmitted through aerial image measurement slit pattern SL along an L-shaped route and emits the light toward a −Y direction. Incidentally, in the following description, the optical system inside housing 36 is described as a light-transmitting system 36 by using the same reference code as housing 36 for the sake of convenience.

Moreover, on the upper surface of the second water repellent plate 28b, multiple grid lines are directly formed in a predetermined pitch along each of four sides. More specifically, in areas on one side and the other side in the X-axis direction of second water repellent plate 28b (both sides in the horizontal direction in FIG. 4A), Y scales $39Y_1$ and $39Y_2$ are formed respectively, and Y scales $39Y_1$ and $39Y_2$ are each composed of a reflective grating (for example, a diffraction grating) having a periodic direction in the Y-axis direction in which grid lines 38 having the longitudinal direction in the X-axis direction are formed in a predetermined pitch along a direction parallel to the Y-axis (the Y-axis direction).

Similarly, in areas on one side and the other side in the Y-axis direction of second water repellent plate 28b (both sides in the vertical direction in FIG. 4A), X scales $39X_1$ and $39X_2$ are formed respectively in a state where the scales are placed between Y scales $39Y_1$ and $39Y_2$, and X scales $39X_1$ and $39X_2$ are each composed of a reflective grating (for example, a diffraction grating) having a periodic direction in the X-axis direction in which grid lines 37 having the longitudinal direction in the Y-axis direction are formed in a predetermined pitch along a direction parallel to the X-axis (the X-axis direction). As each of the scales, a scale is used that has a reflective diffraction grating made by, for example, hologram or the like, on the surface of the second water repellent plate 28b. In this case, each scale has gratings made up of narrow slits, grooves or the like that are marked at a predetermined distance (pitch) as graduations. The type of diffraction grating used for each scale is not limited, and not only the diffraction grating made up of grooves or the like that are mechanically formed, but also, for example, the diffraction grating that is created by exposing interference fringe on a photosensitive resin may be used. However, each scale is created by marking the graduations of the diffraction grating, for example, in a pitch between 138 nm to 4 μm, for example, a pitch of 1 μm on a thin plate shaped glass. These scales are covered with the liquid repellent film (water repellent film) described above. Incidentally, the pitch of the grating is shown much wider in FIG. 4A than the actual pitch, for the sake of convenience. The same is true also in other drawings.

In this manner, in the embodiment, since the second water repellent plate 28b itself constitutes the scale, a glass plate with low-thermal expansion is to be used as the second water repellent plate 28b. However, the present invention is not limited to this, and a scale member made up of a glass plate or the like with low-thermal expansion on which a grating is formed may also be fixed on the upper surface of wafer table WTB, for example, by a plate spring (or vacuum suction) or the like so as to prevent local shrinkage/expansion. In this case, a water repellent plate to which the same water repellent coat is applied on the entire surface may be used instead of plate 28. Or, wafer table WTB may also be formed by materials with a low coefficient of thermal expansion, and in such a case, a pair of Y scales and a pair of X scales may be directly formed on the upper surface of wafer table WTB.

Incidentally, in order to protect the diffraction grating, it is also effective to cover the grating with a glass plate with low thermal expansion that has water repellency (liquid repellency). In this case, as the glass plate, a plate whose thickness is the same level as the wafer, such as for example, a plate 1 mm thick, can be used, and the plate is set on the upper surface of wafer table WTB so that the surface of the glass plate becomes the same height (surface position) as the wafer surface.

Incidentally, a pattern for positioning is arranged for deciding the relative position between an encoder head and a scale near the edge of each scale (to be described later). The pattern for positioning is configured, for example, from grid lines that have different reflectivity, and when the encoder head scans the pattern, the intensity of the output signal of the encoder changes. Therefore, a threshold value is determined beforehand, and the position where the intensity of the output signal exceeds the threshold value is detected. Then, the relative position between the encoder head and the scale is set, with the detected position as a reference.

Figure 2:
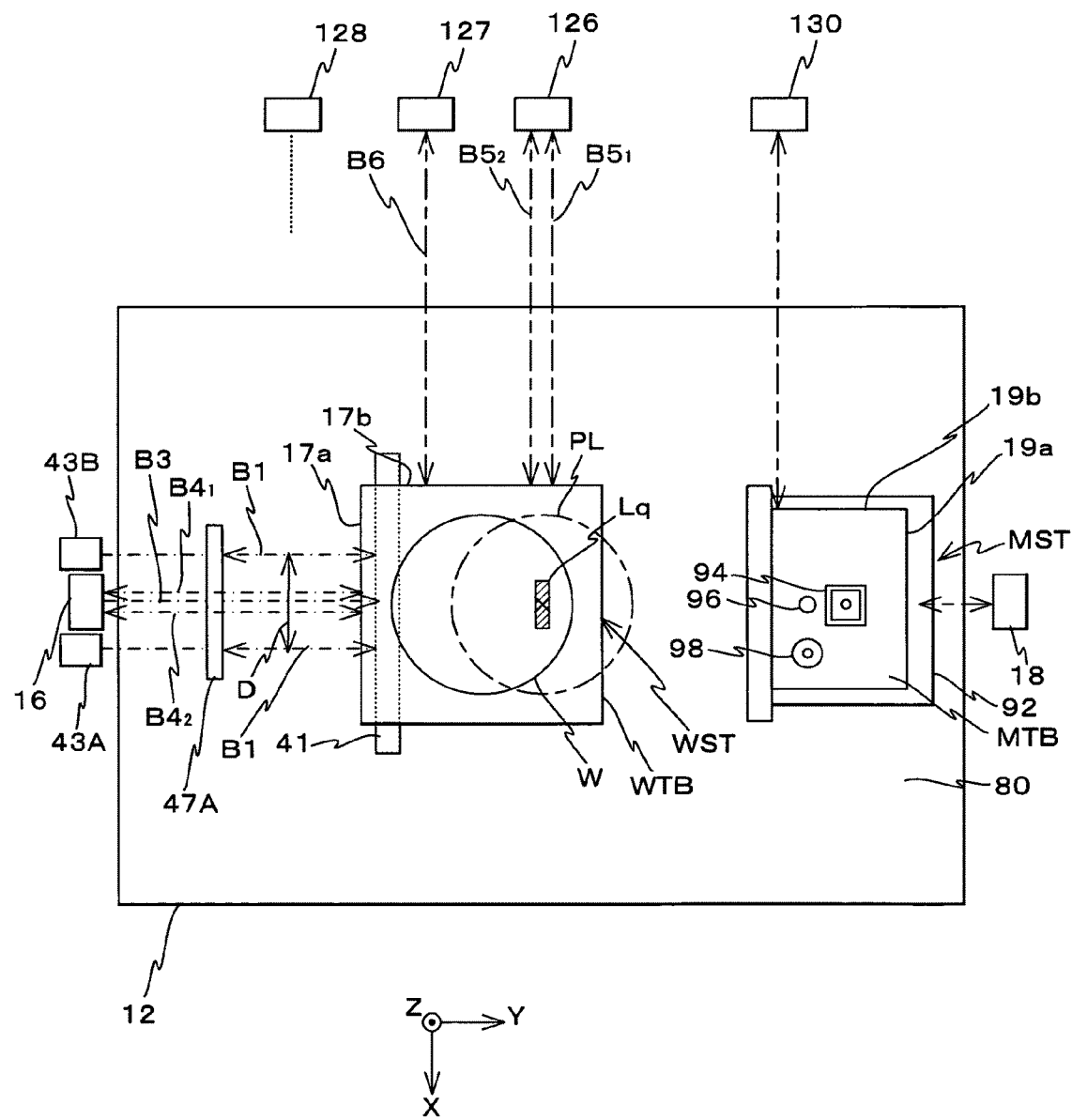
FIG. 2 is a planar view showing a stage device in FIG. 1.

To the −Y edge surface and the −X edge surface of wafer table WTB, mirror-polishing is applied, respectively, and as shown in FIG. 2, a reflection surface 17a and a reflection surface 17b are formed for interferometer system 118 which will be described later in the description.

Measurement stage MST includes a stage main section 92 driven in the XY plane by a linear motor and the like (not shown), and a measurement table MTB mounted on stage main section 92. Measurement stage MST is configured drivable in at least directions of three degrees of freedom (X, Y, and θz) with respect to base board 12 by a drive system (not shown).

Incidentally, the drive system of wafer stage WST and the drive system of measurement stage MST are included in FIG. 6, and are shown as stage drive system 124.

Figure 5A:
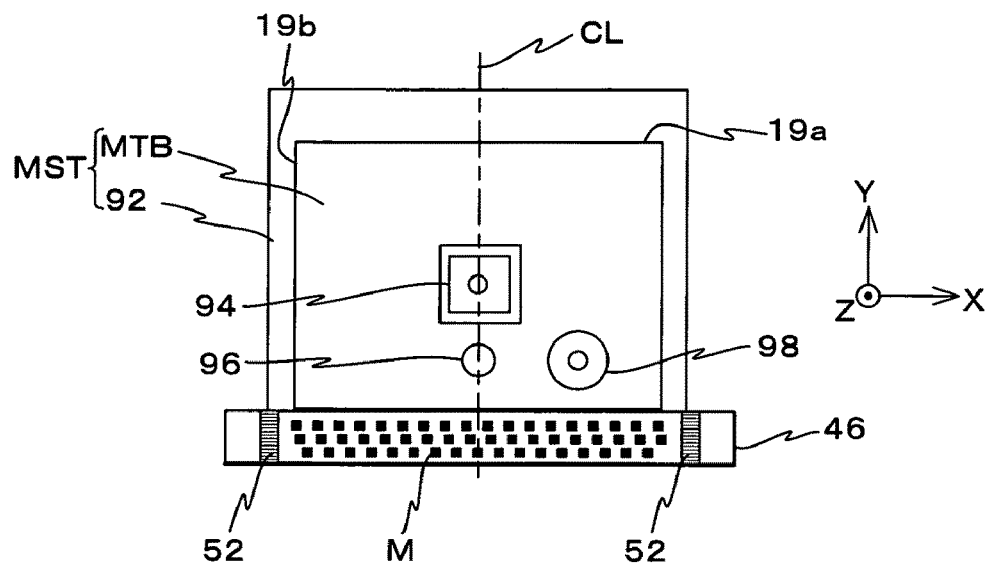
FIG. 5A is a planar view that shows a measurement stage MST.

Various measurement members are arranged at measurement table MTB (and stage main section 92). As such measurement members, for example, as shown in FIGS. 2 and 5A, members such as an uneven illuminance measuring sensor 94 that has a pinhole-shaped light-receiving section which receives illumination light IL on an image plane of projection optical system PL, an aerial image measuring instrument 96 that measures an aerial image (projected image) of a pattern projected by projection optical system PL, a wavefront aberration measuring instrument 98 by the Shack-Hartman method that is disclosed in, for example, the pamphlet of International Publication No. 03/065428 and the like are employed. As wavefront aberration measuring instrument 98, the one disclosed in, for example, the pamphlet of International Publication No. 99/60361 (the corresponding EP Patent No. 1,079,223) can also be used.

As uneven illuminance measuring sensor 94, the configuration similar to the one that is disclosed in, for example, Kokai (Japanese Unexamined Patent Application Publication) No. 57-117238 (the corresponding U.S. Pat. No. 4,465,368) and the like can be used. Further, as aerial image measuring instrument 96, the configuration similar to the one that is disclosed in, for example, Kokai (Japanese Unexamined Patent Application Publication) No. 2002-014005 (the corresponding U.S. Patent Application Publication No. 2002/0041377) and the like can be used. Incidentally, three measurement members (94, 96 and 98) are to be arranged at measurement stage MST in the embodiment, however, the types and/or the number of measurement members are/is not limited to them. As the measurement members, for example, measurement members such as a transmittance measuring instrument that measures a transmittance of projection optical system PL, and/or a measuring instrument that observes local liquid immersion device 8, for example, nozzle unit 32 (or tip lens 191) or the like may also be used. Furthermore, members different from the measurement members such as a cleaning member that cleans nozzle unit 32, tip lens 191 or the like may also be mounted on measurement stage MST.

In the embodiment, as can be seen from FIG. 5A, the sensors that are frequently used such as uneven illuminance measuring sensor 94 and aerial image measuring instrument 96 are placed on a centerline CL (Y-axis passing through the center) of measurement stage MST. Therefore, in the embodiment, measurement using these sensors can be performed by moving measurement stage MST only in the Y-axis direction without moving the measurement stage in the X-axis direction.

In addition to each of the sensors described above, an illuminance monitor that has a light-receiving section having a predetermined area size that receives illumination light IL on the image plane of projection optical system PL may also be employed, which is disclosed in, for example, Kokai (Japanese Unexamined Patent Application Publication) No. 11-016816 (the corresponding U.S. Patent Application Publication No. 2002/0061469) and the like. The illuminance monitor is also preferably placed on the centerline.

Incidentally, in the embodiment, liquid immersion exposure is performed in which wafer W is exposed with exposure light (illumination light) IL via projection optical system PL and liquid (water) Lq, and accordingly uneven illuminance measuring sensor 94 (and the illuminance monitor), aerial image measuring instrument 96 and wavefront aberration measuring instrument 98 that are used in measurement using illumination light IL receive illumination light IL via projection optical system PL and water. Further, only part of each sensor such as the optical system may be mounted on measurement table MTB (and stage main section 92), or the entire sensor may be placed on measurement table MTB (and stage main section 92).

Further, on the +Y edge surface and the −X edge surface of measurement table MTB, reflection surfaces 19a and 19b are formed similar to wafer table WTB previously described (refer to FIGS. 2 and 5A).

Figure 5B:
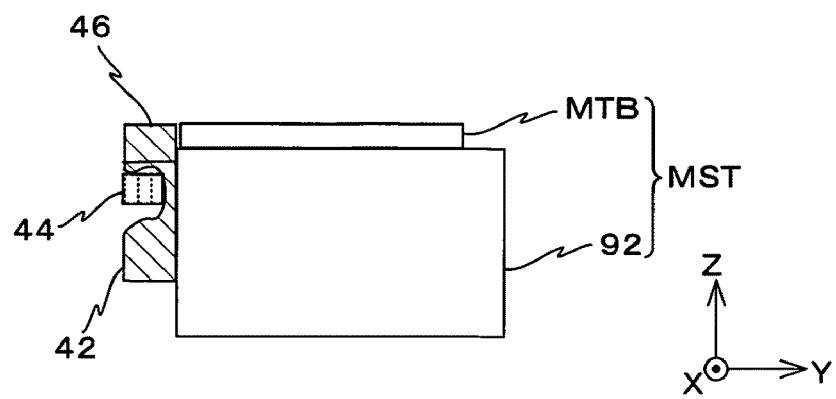
FIG. 5B is a partially sectioned schematic side view that shows measurement stage MST.

As shown in FIG. 5B, a frame-shaped attachment member 42 is fixed to the end surface on the −Y side of stage main section 92 of measurement stage MST. Further, to the end surface on the −Y side of stage main section 92, a pair of photodetection systems 44 are fixed in the vicinity of the center position in the X-axis direction inside an opening of attachment member 42, in the placement capable of facing a pair of light-transmitting systems 36 described previously. Each of photodetection systems 44 is composed of an optical system such as a relay lens, a light receiving element such as a photomultiplier tube, and a housing that houses them. As is obvious from FIGS. 4B and 5B and the description so far, in the embodiment, in a state where wafer stage WST and measurement stage MST are closer together within a predetermined distance in the Y-axis direction (including a contact state), illumination light IL that has been transmitted through each aerial image measurement slit pattern SL of measurement plate 30 is guided by each light-transmitting system 36 and received by the light-receiving element of each photodetection system 44. That is, measurement plate 30, light-transmitting systems 36 and photodetection systems 44 constitute an aerial image measurement device 45 (refer to FIG. 6), which is similar to the one disclosed in Kokai (Japanese Unexamined Patent Application Publication) No. 2002-014005 (the corresponding U.S. Patent Application Publication No. 2002/0041377) referred to previously, and the like.

On attachment member 42, a fiducial bar (hereinafter, shortly referred to as an "FD bar") 46 which is made up of a bar-shaped member having a rectangular sectional shape is arranged extending in the X-axis direction. FD bar 46 is kinematically supported on measurement stage MST by a full-kinematic mount structure.

Since FD bar 46 serves as a prototype standard (measurement standard), optical glass ceramics with a low coefficient of thermal expansion, such as Zerodur (the brand name) of Schott AG are employed as the materials. The flatness degree of the upper surface (the surface) of FD bar 46 is set high to be around the same level as a so-called datum plane plate. Further, as shown in FIG. 5A, a reference grating (for example, a diffraction grating) 52 whose periodic direction is the Y-axis direction is respectively formed in the vicinity of the end portions on one side and the other side in the longitudinal direction of FD bar 46. The pair of reference gratings 52 is formed placed apart from each other at a predetermined distance L, symmetric to the center in the X-axis direction of FD bar 46, or more specifically, formed in a symmetric placement to centerline CL previously described.

Further, on the upper surface of FD bar 46, a plurality of reference marks M are formed in a placement as shown in FIG. 5A. The plurality of reference marks M are formed in three-row arrays in the Y-axis direction in the same pitch, and the array of each row is formed being shifted from each other by a predetermined distance in the X-axis direction. As each of reference marks M, a two-dimensional mark having a size that can be detected by a primary alignment system and secondary alignment systems (to be described later) is used. Reference mark M may also be different in shape (constitution) from fiducial mark FM, but in the embodiment, reference mark M and fiducial mark FM have the same constitution and also they have the same constitution with that of an alignment mark of wafer W. Incidentally, in the embodiment, the surface of FD bar 46 and the surface of measurement table MTB (which may include the measurement members described above) are also covered with a liquid repellent film (water repellent film) severally.

In exposure apparatus 100 of the embodiment, although it is omitted in FIG. 1 from the viewpoint of avoiding intricacy of the drawing, a primary alignment system AL1 having a detection center at a position spaced apart from optical axis AX of projection optical system PL at a predetermined distance on the −Y side is actually placed on reference axis LV as shown in FIG. 3. Primary alignment system AL1 is fixed to the lower surface of a main frame (not shown) via a support member 54. On one side and the other side in the X-axis direction with primary alignment system AL1 in between, secondary alignment systems $AL2_1$ and $AL2_2$, and $AL2_3$ and $AL2_4$ whose detection centers are substantially symmetrically placed with respect to straight line LV are severally arranged. That is, five alignment systems AL1 and $AL2_1$ to $AL2_4$ are placed so that their detection centers are placed at different positions in the X-axis direction, that is, placed along the X-axis direction.

As is representatively shown by secondary alignment system $AL2_4$, each secondary alignment system $AL2_n$ (n=1 to 4) is fixed to a tip (turning end) of an arm $56_n$ (n=1 to 4) that can turn around a rotation center O as the center in a predetermined angle range in clockwise and anticlockwise directions in FIG. 3. In the embodiment, a part of each secondary alignment system $AL2_n$ (e.g. including at least an optical system that irradiates an alignment light to a detection area and also leads the light that is generated from a subject mark within the detection area to a light-receiving element) is fixed to arm $56_n$ and the remaining section is arranged at the main frame that holds projection unit PU. The X-positions of secondary alignment systems $AL2_1$, $AL2_2$, $AL2_3$, and $AL2_4$ are severally adjusted by rotating around rotation center O as the center. In other words, the detection areas (or the detection centers) of secondary alignment systems $AL2_1$, $AL2_2$, $AL2_3$, and $AL2_4$ are independently movable in the X-axis direction. Accordingly, the relative positions of the detection areas of primary alignment system AL1 and secondary alignment systems $AL2_1$, $AL2_2$, $AL2_3$, and $AL2_4$ are adjustable in the X-axis direction. Incidentally, in the embodiment, the X-positions of secondary alignment systems $AL2_1$, $AL2_2$, $AL2_3$, and $AL2_4$ are to be adjusted by the rotation of the arms. However, the present invention is not limited to this, and a drive mechanism that drives secondary alignment systems $AL2_1$, $AL2_2$, $AL2_3$, and $AL2_4$ back and forth in the X-axis direction may also be arranged. Further, at least one of secondary alignment systems $AL2_1$, $AL2_2$, $AL2_3$, and $AL2_4$ can be moved not only in the X-axis direction but also in the Y-axis direction. Incidentally, since part of each secondary alignment system $AL2_n$ is moved by arm $56_n$, positional information of the part that is fixed to arm $56_n$ is measurable by a sensor (not shown) such as, for example, an interferometer or an encoder. The sensor may only measure position information in the X-axis direction of secondary alignment system $AL2_n$, or may also be capable of measuring position information in another direction, for example, the Y-axis direction and/or the rotation direction (including at least one of the θx and θy directions).

On the upper surface of each arm $56_n$, a vacuum pad $58_n$ (n=1 to 4, not shown in FIG. 3, refer to FIG. 6) that is composed of a differential evacuation type air bearing is arranged. Further, arm $56_n$ can be turned by a rotation drive mechanism $60_n$ (n=1 to 4, not shown in FIG. 3, refer to FIG. 6) that includes, for example, a motor or the like, in response to instructions of main controller 20. Main controller 20 activates each vacuum pad $58_n$ to fix each arm $56_n$ to a main frame (not shown) by suction after rotation adjustment of arm $56_n$. Thus, the state of each arm $56_n$ after rotation angle adjustment, that is, a desired positional relation between primary alignment system AL1 and four secondary alignment systems $AL2_1$ to $AL2_4$ is maintained.

Incidentally, in the case a portion of the main frame facing arm $56_n$ is a magnetic body, an electromagnet may also be employed instead of vacuum pad 58.

In the embodiment, as each of primary alignment system AL1 and four secondary alignment systems $AL2_1$ to $AL2_4$, for example, an FIA (Field Image Alignment) system by an image processing method is used that irradiates a broadband detection beam that does not expose resist on a wafer to a subject mark, and picks up an image of the subject mark formed on a light-receiving plane by the reflected light from the subject mark and an image of an index (an index pattern on an index plate arranged within each alignment system) (not shown), using an imaging device (such as CCD), and then outputs their imaging signals. The imaging signal from each of primary alignment system AL1 and four secondary alignment systems $AL2_1$ to $AL2_4$ is supplied to main controller 20 in FIG. 6, via an alignment signal processing system (not shown).

Incidentally, each of the alignment systems described above is not limited to the FIA system, and an alignment sensor, which irradiates a coherent detection light to a subject mark and detects a scattered light or a diffracted light generated from the subject mark or makes two diffracted lights (e.g. diffracted lights of the same order or diffracted lights being diffracted in the same direction) generated from the subject mark interfere and detects an interference light, can naturally be used alone or in combination as needed. Further, in the embodiment, five alignment systems AL1 and $AL2_1$ to $AL2_4$ are to be fixed to the lower surface of the main frame that holds projection unit PU, via support member 54 or arm $56_n$. However, the present invention is not limited to this, and for example, the five alignment systems may also be arranged on the measurement frame described earlier.

Next, a configuration and the like of interferometer system 118 (refer to FIG. 6), which measures the positional information of wafer stage WST and measurement stage MST, will be described.

The measurement principle of the interferometer will now be briefly described, prior to describing a concrete configuration of the interferometer system. The interferometer irradiates a measurement beam (measurement light) on a reflection surface set at a measurement object. The interferometer receives a synthesized light of the reflected light and a reference beam, and measures the intensity of interference light, which is the reflected light (measurement light) and the reference beam made to interfere with each other, with their polarized directions arranged. In this case, due to optical path difference ΔL of the reflected light and the reference beam, the relative phase (phase difference) between the reflected light and the reference beam changes by KΔL. Accordingly, the intensity of the interference light changes in proportion to 1+α·cos(KΔL). In this case, homodyne detection is to be employed, and the wave number of the measurement light and the reference beam is the same, expressed as K. Constant a is decided by the intensity ratio of the measurement light and the reference beam. In this case, the reflection surface to the reference beam is arranged generally on the projection unit PU side surface (in some cases, inside the interferometer unit). The reflection surface of this reference beam becomes the reference position of the measurement. Accordingly, in optical path difference ΔL, the distance from the reference position to the reflection surface is reflected. Therefore, if the number of times (the number of fringes) of intensity change of the interference light with respect to the change of distance to the reflection surface is measured, displacement of the reflection surface provided in the measurement object can be computed by the product of the counter value and the measurement unit. The measurement unit is, in the case of an interferometer of a single-pass method is half the wavelength of the measurement light, and in the case of an interferometer of the double-pass method, one-fourth of the wavelength.

Now, in the case an interferometer of the heterodyne detection method is employed, wave number $K_1$ of the measurement light and wave number $K_2$ of the reference beam are slightly different. In this case, when the optical path length of the measurement light and the reference beam are $L_1$ and $L_2$, respectively, the phase difference between the measurement beam and the reference beam is given KΔL+ΔKL_1, and the intensity of the interference light changes in proportion to 1+a·cos(KΔL+ΔKL_1). However, optical path difference $ΔL=L_1-L_2$, $ΔK=K_1-K_2$, and $K=K_2$. When optical path $L_2$ of the reference beam is sufficiently short, and approximate $ΔL≈L_1$ stands, the intensity of the interference light changes in proportion to 1+a·cos[(K+ΔK)ΔL]. As it can be seen from above, the intensity of the interference light periodically vibrates at a wavelength 2π/K of the reference beam along with the change of optical path difference ΔL, and the envelope curve of the periodic vibration vibrates (beats) at a long cycle 2π/ΔK. Accordingly, in the heterodyne detection method, the changing direction of optical path difference ΔL, or more specifically, the displacement direction of the measurement object can be learned from the long-period beat.

Incidentally, as a major cause of error of the interferometer, the effect of temperature fluctuation (air fluctuation) of the atmosphere on the beam optical path can be considered. Assume that wavelength λ of the light changes to λ+Δλ by air fluctuation. Because the change of phase difference KΔL by minimal change Δλ of the wavelength is wave number K=2π/λ, $2πΔLΔλ/λ^2$ can be obtained. In this case, when wavelength of light λ=1 μm and minute change Δλ=1 nm, the phase change becomes 2π×100 with respect to an optical path difference ΔL=100 mm. This phase change corresponds to displacement which is 100 times the measurement unit. In the case the optical path length which is set is long as is described, the interferometer is greatly affected by the air fluctuation which occurs in a short time, and is inferior in short-term stability. In such a case, it is desirable to use a surface position measurement system which will be described later that has an encoder or a Z head.

Interferometer system 118 includes a Y interferometer 16, X interferometers 126, 127, and 128, and Z interferometers 43A and 43B for position measurement of wafer stage WST, and a Y interferometer 18 and an X interferometer 130 for position measurement of measurement stage MST, as shown in FIG. 2. By severally irradiating a measurement beam on reflection surface 17a and reflection surface 17b of wafer table WTB and receiving a reflected light of each beam, Y interferometer 16 and X interferometers 126, 127, and 128 (X interferometers 126 to 128 are not shown in FIG. 1, refer to FIG. 2) measure a displacement of each reflection surface from a reference position (for example, a fixed mirror is placed on the side surface of projection unit PU, and the surface is used as a reference surface), or more specifically, measure the positional information of wafer stage WST within the XY plane, and the positional information that have been measured is supplied to main controller 20. In the embodiment, as it will be described later on, as each interferometer a multiaxial interferometer that has a plurality of measurement axes is used with an exception for a part of the interferometers.

Meanwhile, to the side surface on the −Y side of stage main section 91, a movable mirror 41 having the longitudinal direction in the X-axis direction is attached via a kinematic support mechanism (not shown), as shown in FIGS. 4A and 4B. Movable mirror 41 is made of a member which is like a rectangular solid member integrated with a pair of triangular prisms adhered to a surface (the surface on the −Y side) of the rectangular solid member. As it can be seen from FIG. 2, movable mirror 41 is designed so that the length in the X-axis direction is longer than reflection surface 17a of wafer table WTB by at least the spacing between the two Z interferometers which will be described later.

To the surface on the −Y side of movable mirror 41, mirror-polishing is applied, and three reflection surfaces 41b, 41a, and 41c are formed, as shown in FIG. 4B. Reflection surface 41a configures a part of the edge surface on the −Y side of movable mirror 41, and reflection surface 41a is parallel with the XZ plane and also extends in the X-axis direction. Reflection surface 41b configures a surface adjacent to reflection surface 41a on the +Z side, forming an obtuse angle to reflection surface 41a, and spreading in the X-axis direction. Reflection surface 41c configures a surface adjacent to the −Z side of reflection surface 41a, and is arranged symmetrically with reflection surface 41b, with reflection surface 41a in between.

A pair of Z interferometers 43A and 43B (refer to FIGS. 1 and 2) that irradiates measurement beams on movable mirror 41 is arranged facing movable mirror 41.

As it can be seen when viewing FIGS. 1 and 2 together, Z interferometers 43A and 43B are placed apart on one side and the other side of Y interferometer 16 in the X-axis direction at a substantially equal distance and at positions slightly lower than Y interferometer 16, respectively.

From each of the Z interferometers 43A and 43B, as shown in FIG. 1, measurement beam B1 along the Y-axis direction is irradiated toward reflection surface 41b, and measurement beam B2 along the Y-axis direction is irradiated toward reflection surface 41c (refer to FIG. 4B). In the embodiment, fixed mirror 47B having a reflection surface orthogonal to measurement beam B1 sequentially reflected off reflection surface 41b and reflection surface 41c and a fixed mirror 47A having a reflection surface orthogonal to measurement beam B2 sequentially reflected off reflection surface 41c and reflection surface 41b are arranged, each extending in the X-axis direction at a position distanced apart from movable mirror 41 in the −Y-direction by a predetermined distance in a state where the fixed mirrors do not interfere with measurement beams B1 and B2.

Fixed mirrors 47A and 47B are supported, for example, by the same support body (not shown) arranged in the frame (not shown) which supports projection unit PU.

Y interferometer 16, as shown in FIG. 2 (and FIG. 13), irradiates measurement beams $B4_1$ and $B4_2$ on reflection surface 17a of wafer table WTB along a measurement axis in the Y-axis direction spaced apart by an equal distance to the −X side and the +X side from reference axis LV previously described, and by receiving each reflected light, detects the position of wafer table WTB in the Y-axis direction (a Y position) at the irradiation point of measurement beams $B4_1$ and $B4_2$. Incidentally, in FIG. 1, measurement beams $B4_1$ and $B4_2$ are representatively shown as measurement beam B4.

Further, Y interferometer 16 irradiates a measurement beam B3 toward reflection surface 41a along a measurement axis in the Y-axis direction with a predetermined distance in the Z-axis direction spaced between measurement beams $B4_1$ and $B4_2$, and by receiving measurement beam B3 reflected off reflection surface 41a, detects the Y position of reflection surface 41a (more specifically wafer stage WST) of movable mirror 41.

Main controller 20 computes the Y position (or to be more precise, displacement ΔY in the Y-axis direction) of reflection surface 17a, or more specifically, wafer table WTB (wafer stage WST), based on an average value of the measurement values of the measurement axes corresponding to measurement beams $B4_1$ and $B4_2$ of Y interferometer 16. Further, main controller 20 computes displacement (yawing amount) $\Delta\theta z^{(Y)}$ of wafer stage WST in the rotational direction around the Z-axis (the θz direction), based on a difference of the measurement values of the measurement axes corresponding to measurement beams $B4_1$ and $B4_2$. Further, main controller 20 computes displacement (pitching amount) Δθx in the θx direction of wafer stage WST, based on the Y position (displacement ΔY in the Y-axis direction) of reflection surface 17a and reflection surface 41a.

Figure 13:
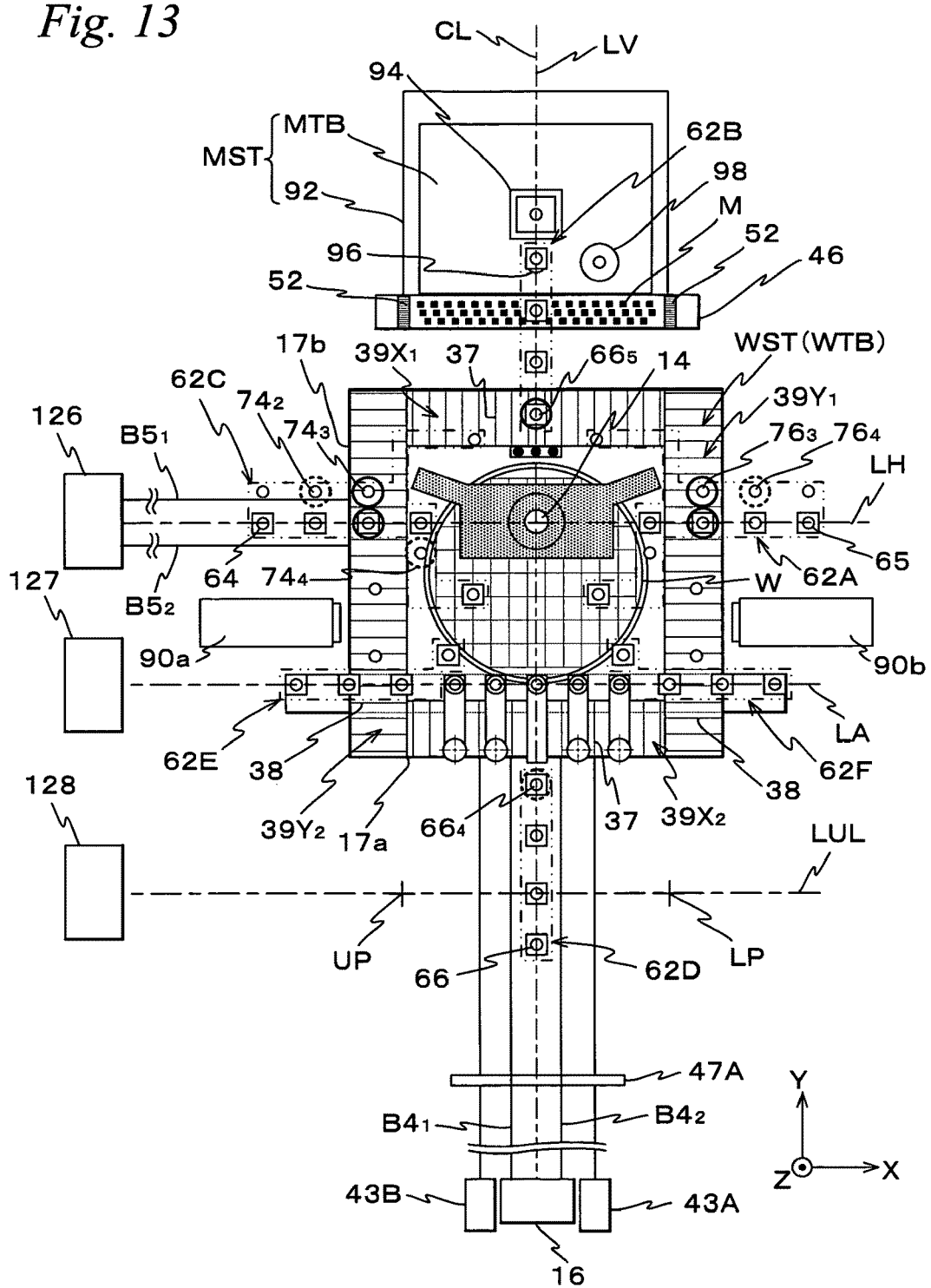
FIG. 13 is a view showing a state of the wafer stage and the measurement stage where exposure to a wafer on the wafer stage is performed by a step-and-scan method.

Further, as shown in FIGS. 2 and 13, X interferometer 126 irradiates measurement beams $B5_1$ and $B5_2$ on wafer table WTB along the dual measurement axes spaced apart from a straight line (a reference axis) LH in the X-axis direction that passes the optical axis of projection optical system PL by the same distance. And, based on the measurement values of the measurement axes corresponding to measurement beams $B5_1$ and $B5_2$, main controller 20 computes a position (an X position, or to be more precise, displacement ΔX in the X-axis direction) of wafer stage WST in the X-axis direction. Further, main controller 20 computes displacement (yawing amount) $\Delta\theta Z^{(x)}$ of wafer stage WST in the θz direction from a difference of the measurement values of the measurement axes corresponding to measurement beams $B5_1$ and $B5_2$. Incidentally, $\Delta\theta z^{(X)}$ obtained from X interferometer 126 and $\Delta\theta z^{(Y)}$ obtained from Y interferometer 16 are equal to each other, and represents displacement (yawing amount) Δθz of wafer stage WST in the θz direction.

Figure 14:
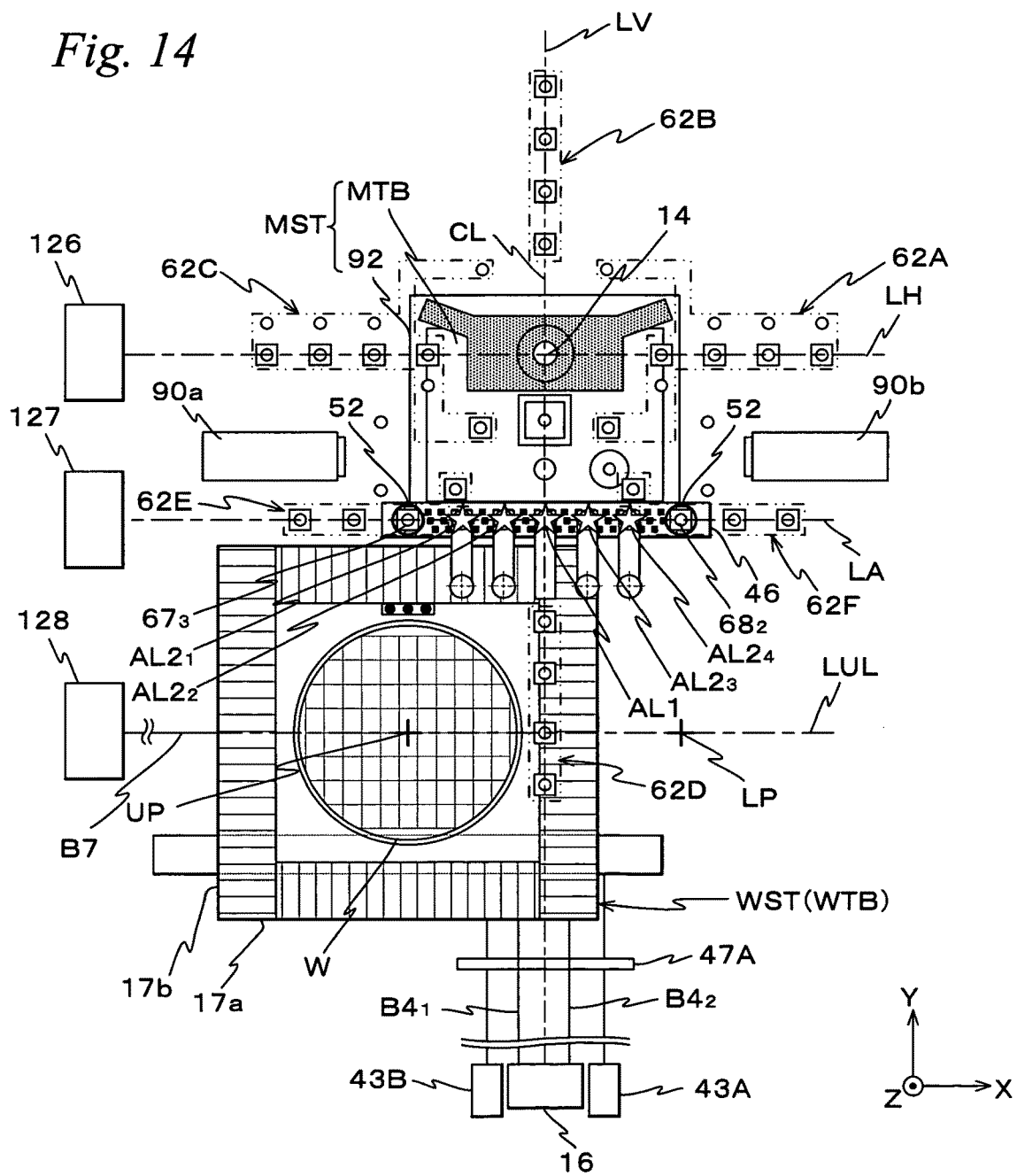
FIG. 14 is a view showing a state of both stages at the time of unloading of the wafer (when the measurement stage reaches the position where Sec-BCHK (interval) is performed)
Figure 15:
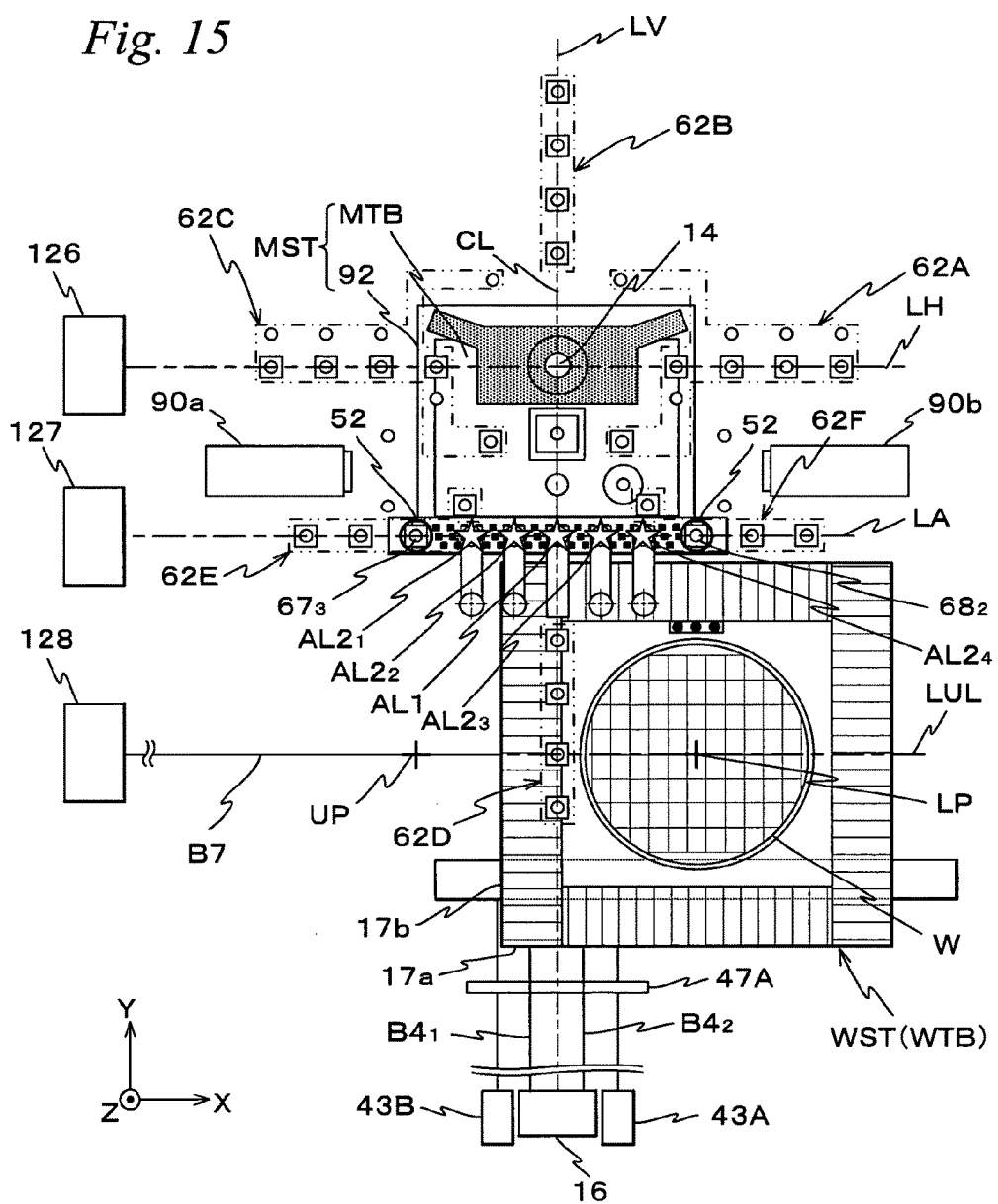
FIG. 15 is a view showing a state of both stages at the time of loading of the wafer.
Figure 16:
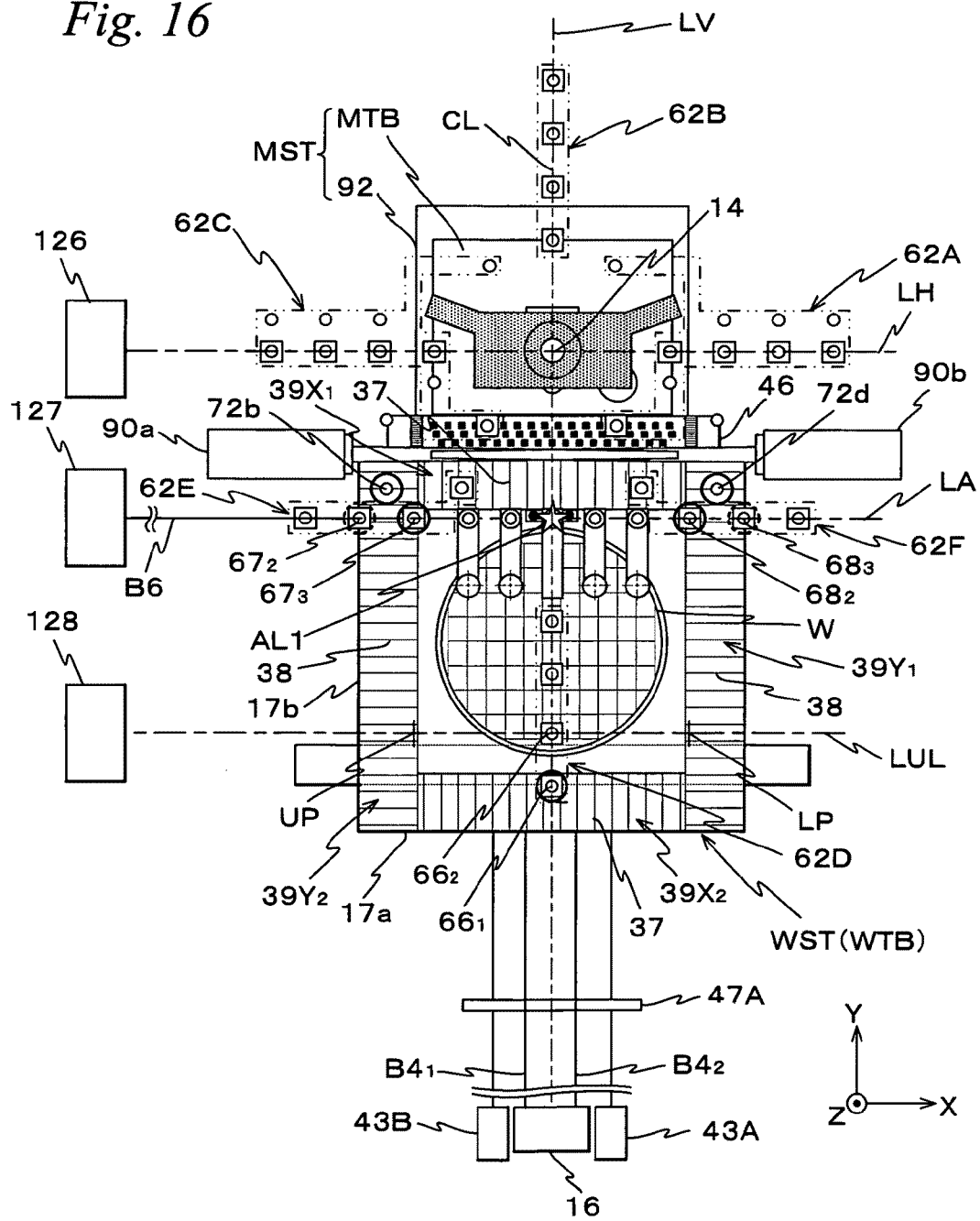
FIG. 16 is a view showing the state of both stages in the (when a wafer stage moved to the position which processed of the first half of Pri-BCHK) at switching time from stage servo control by the interferometer to stage servo control by the encoder.
Figure 17:
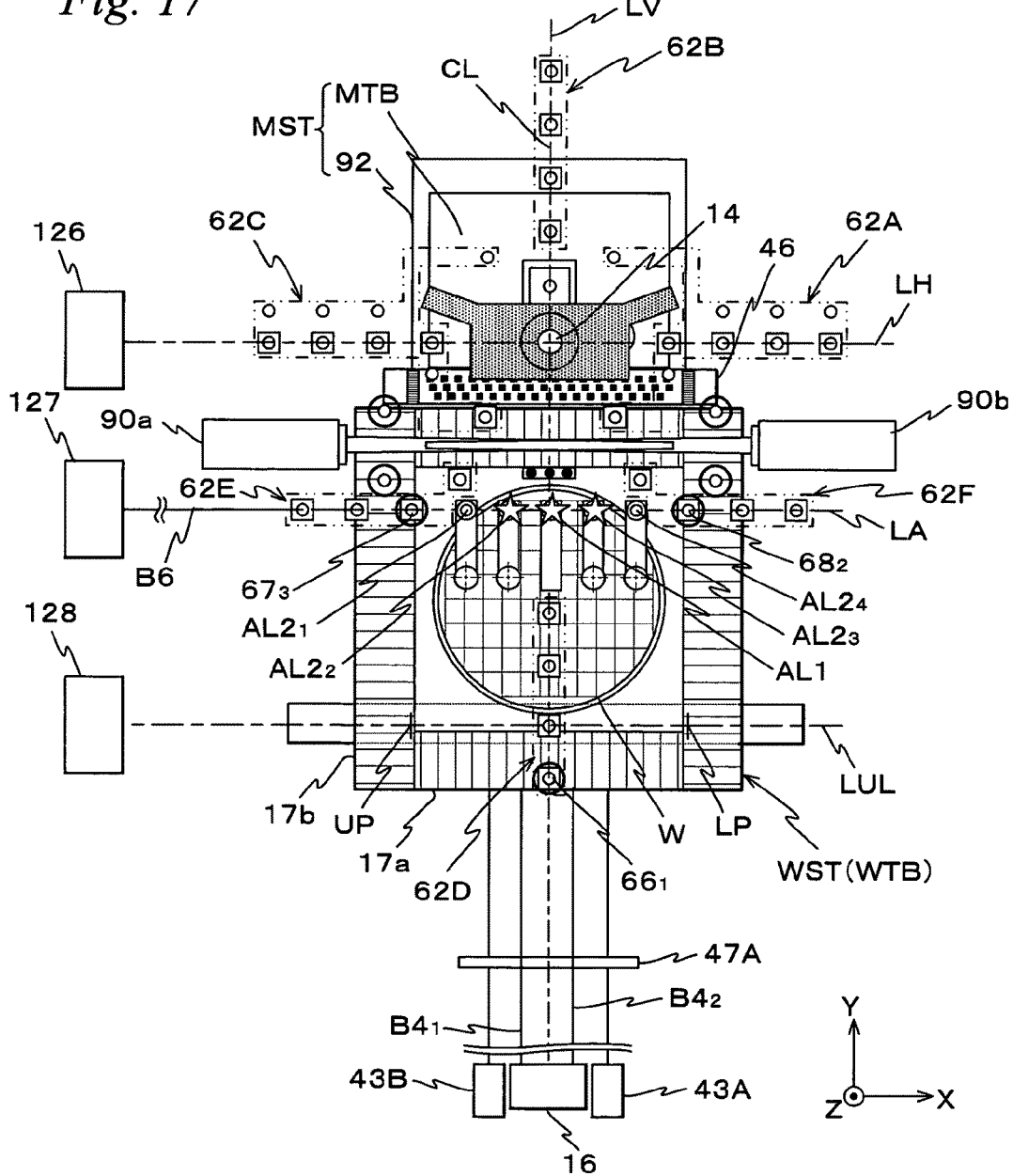
FIG. 17 is a view showing a state of the wafer stage and the measurement stage when alignment marks arranged in three first alignment shot areas are being simultaneously detected using alignment systems AL1, $AL2_2$ and $AL2_3$.

Further, as shown in FIGS. 14 and 15, a measurement beam B7 from X interferometer 128 is irradiated on reflection surface 17b of wafer table WTB along a straight line LUL, which is a line connecting an unloading position UP where unloading of the wafer on wafer table WTB is performed and a loading position LP where loading of the wafer onto wafer table WTB is performed and is parallel to the X-axis. Further, as shown in FIGS. 16 and 17, a measurement beam B6 from X interferometer 127 is irradiated on reflection surface 17b of wafer table WTB along a straight line LA, which passes through the detection center of primary alignment system AL1 and is parallel to the X-axis.

Figure 19:
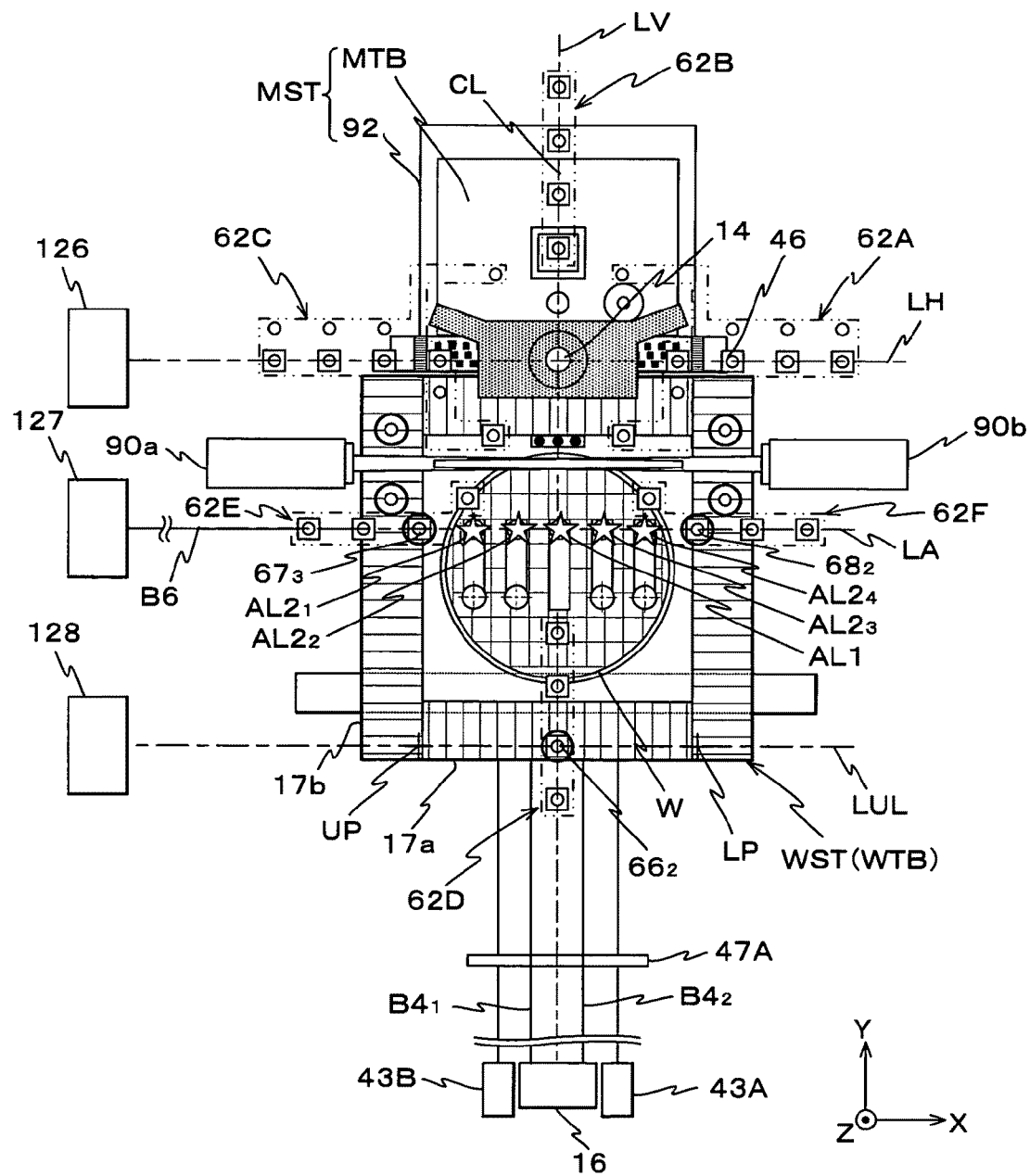
FIG. 19 is a view showing a state of the wafer stage and the measurement stage when alignment marks arranged in five second alignment shot areas are being simultaneously detected using alignment systems AL1 and $AL2_1$ to $AL2_4$.

Main controller 20 can obtain displacement ΔX of wafer stage WST in the X-axis direction from the measurement values of measurement beam B6 of X interferometer 127 and the measurement values of measurement beam B7 of X interferometer 128. However, the placement of the three X interferometers 126, 127, and 128 is different in the Y-axis direction. Therefore, X interferometer 126 is used at the time of exposure as shown in FIG. 13, X interferometer 127 is used at the time of wafer alignment as shown in FIG. 19, and X interferometer 128 is used at the time of wafer loading shown in FIG. 15 and wafer unloading shown in FIG. 14.

From Z interferometers 43A and 43B previously described, measurement beams B1 and B2 that proceed along the Y-axis are irradiated toward movable mirror 41, respectively, as shown in FIG. 1. These measurement beams B1 and B2 are incident on reflection surfaces 41b and 41c of movable mirror 41, respectively, at a predetermined angle of incidence (the angle is to be θ/2). Then, measurement beam B1 is sequentially reflected by reflection surfaces 41b and 41c, and then is incident perpendicularly on the reflection surface of fixed mirror 47B, whereas measurement beam B2 is sequentially reflected by reflection surfaces 41c and 41b and is incident perpendicularly on the reflection surface of fixed mirror 47A. Then, measurement beams B2 and B1 reflected off the reflection surface of fixed mirrors 47A and 47B are sequentially reflected by reflection surfaces 41b and 41c again, or are sequentially reflected by reflection surfaces 41c and 41b again (returning the optical path at the time of incidence oppositely), and then are received by Z interferometers 43A and 43B.

In this case, when displacement of movable mirror 41 (more specifically, wafer stage WST) in the Z-axis direction is ΔZo and displacement in the Y-axis direction is ΔYo, an optical path length change ΔL1 of measurement beam B1 and an optical path length change ΔL2 of measurement beam B2 can respectively be expressed as in formulas (1) and (2) below.

$$\Delta L1 = \Delta Yo \times (1+\cos\theta) + \Delta Zo \times \sin\theta \quad (1)$$

$$\Delta L2 = \Delta Yo \times (1+\cos\theta) - \Delta Zo \times \sin\theta \quad (2)$$

Accordingly, from formulas (1) and (2), ΔZo and ΔYo can be obtained using the following formulas (3) and (4).

$$\Delta Zo = (\Delta L1 - \Delta L2)/2\sin\theta \quad (3)$$

$$\Delta Yo = (\Delta L1 + \Delta L2)/\{2(1+\cos\theta)\} \quad (4)$$

Displacements ΔZo and ΔYo above can be obtained with Z interferometers 43A and 43B. Therefore, displacement which is obtained using Z interferometer 43A is to be ΔZoR and ΔYoR, and displacement which is obtained using Z interferometer 43B is to be ΔZoL and ΔYoL. And the distance between measurement beams B1 and B2 irradiated by Z interferometers 43A and 43B, respectively, in the X-axis direction is to be a distance D (refer to FIG. 2). Under such premises, displacement (yawing amount) Δθz of movable mirror 41 (more specifically, wafer stage WST) in the θz direction and displacement (rolling amount) Δθy in the θy direction can be obtained by the following formulas (5) and (6).

$$\Delta\theta z = \tan^{-1}\{(\Delta YoR - \Delta YoL)/D\} \quad (5)$$

$$\Delta\theta y = \tan^{-1}\{(\Delta ZoL - \Delta ZoR)/D\} \quad (6)$$

Accordingly, by using the formulas (3) to (6) above, main controller 20 can compute displacement of wafer stage WST in four degrees of freedom, ΔZo, ΔYo, Δθz, and Δθy, based on the measurement results of Z interferometers 43A and 43B.

In the manner described above, from the measurement results of interferometer system 118, main controller 20 can obtain displacement of wafer stage WST in directions of six degrees of freedom (Z, X, Y, θz, θx, and θy directions).

Incidentally, in the embodiment, a single stage which can be driven in six degrees of freedom was employed as wafer stage WST, however, instead of this, wafer stage WST can be configured including a stage main section 91, which is freely movable within the XY plane, and a wafer table WTB, which is mounted on stage main section 91 and is finely drivable relatively with respect to stage main section 91 in at least the Z-axis direction, the θx direction, and the θy direction, or a wafer stage WST can be employed that has a so-called coarse and fine movement structure where wafer table WTB can be configured finely movable in the X-axis direction, the Y-axis direction, and the θz direction with respect to stage main section 91. However, in this case, a configuration in which positional information of wafer table WTB in directions of six degrees of freedom can be measured by interferometer system 118 will have to be employed. Also for measurement stage MST, the stage can be configured similarly, by a stage main section 92, and a measurement table MTB, which is mounted on stage main section 92 and has three degrees of freedom or six degrees of freedom. Further, instead of reflection surface 17a and reflection surface 17b, a movable mirror consisting of a plane mirror can be arranged in wafer table WTB.

In the embodiment, however, position information within the XY plane (including the rotation information in the θz direction) of wafer stage WST (wafer table WTB) is mainly measured by an encoder system (to be described later), and the measurement values of interferometers 16, 126, and 127 are secondarily used in cases such as when long-term fluctuation (for example, by temporal deformation or the like of the scales) of the measurement values of the encoder system is corrected (calibrated).

Incidentally, at least part of interferometer system 118 (such as an optical system) may be arranged at the main frame that holds projection unit PU, or may also be arranged integrally with projection unit PU that is supported in a suspended state as is described above, however, in the embodiment, interferometer system 118 is to be arranged at the measurement frame described above.

Incidentally, in the embodiment, positional information of wafer stage WST was to be measured with a reflection surface of a fixed mirror arranged in projection unit PU serving as a reference surface, however, the position to place the reference surface at is not limited to projection unit PU, and the fixed mirror does not always have to be used to measure the positional information of wafer stage WST.

Further, in the embodiment, positional information of wafer stage WST measured by interferometer system 118 is not used in the exposure operation and the alignment operation which will be described later on, and was mainly to be used in calibration operations (more specifically, calibration of measurement values) of the encoder system, however, the measurement information (more specifically, at least one of the positional information in directions of five degrees of freedom) of interferometer system 118 can be used in, for example, operations such as the exposure operation and/or the alignment operation. Further, using interferometer system 118 as a backup of an encoder system can also be considered, which will be explained in detail later on. In the embodiment, the encoder system measures positional information of wafer stage WST in directions of three degrees of freedom, or more specifically, the X-axis, the Y-axis, and the θz directions. Therefore, in the exposure operation and the like, of the measurement information of interferometer system 118, positional information related to a direction that is different from the measurement direction (the X-axis, the Y-axis, and the θz direction) of wafer stage WST by the encoder system, such as, for example, positional information related only to the θx direction and/or the θy direction can be used, or in addition to the positional information in the different direction, positional information related to the same direction (more specifically, at least one of the X-axis, the Y-axis, and the θz directions) as the measurement direction of the encoder system can also be used. Further, in the exposure operation and the like, the positional information of wafer stage WST in the Z-axis direction measured using interferometer system 118 can be used.

In addition, interferometer system 118 (refer to FIG. 6) includes a Y interferometer 18 and an X interferometer 130 for measuring the two-dimensional position coordinates of measurement table MTB. Y interferometer 18 and X interferometer 130 (X interferometer 130 is not shown in FIG. 1, refer to FIG. 2) irradiate measurement beams on reflection surfaces 19a and 19b of measurement table MTB as shown in FIG. 2, and measure the displacement from a reference position of each reflection surface by receiving the respective reflected lights. Main controller 20 receives the measurement values of Y interferometer 18 and X interferometer 130, and computes the positional information (for example, including at least the positional information in the X-axis and the Y-axis directions and rotation information in the θz direction) of measurement stage MST.

Incidentally, as the Y interferometer used for measuring measurement table MTB, a multiaxial interferometer which is similar to Y interferometer 16 used for measuring wafer stage WST can be used. Further, as the X interferometer used for measuring measurement table MTB, a two-axis interferometer which is similar to X interferometer 126 used for measuring wafer stage WST can be used. Further, in order to measure Z displacement, Y displacement, yawing amount, and rolling amount of measurement stage MST, interferometers similar to Z interferometers 43A and 43B used for measuring wafer stage WST can be introduced.

Next, the structure and the like of encoder system 150 (refer to FIG. 6) which measures positional information (including rotation information in the θz direction) of wafer stage WST in the XY plane will be described.

In exposure apparatus 100 of the embodiment, as shown in FIG. 3, four head units 62A to 62D of encoder system 150 are placed in a state of surrounding nozzle unit 32 on all four sides. In actual, head units 62A to 62D are fixed to the foregoing main frame that holds projection unit PU in a suspended state via a support member, although omitted in the drawings such as FIG. 3 from the viewpoint of avoiding intricacy of the drawings.

As shown in FIG. 3, head units 62A and 62C are placed on the +X side and the −X side of projection unit PU, with the X-axis direction serving as a longitudinal direction. Head units 62A and 62C are each equipped with a plurality of (five, in this case) Y heads $65_i$ and $64_j$ (i, j=1-5) that are placed at a distance WD in the X-axis direction. More particularly, head units 62A and 62C are each equipped with a plurality of (four, in this case) Y heads ($64_1$ to $64_4$ or $65_2$ to $65_5$) that are placed on straight line (reference axis) LH which passes through optical axis AX of projection optical system PL and is also parallel to the X-axis at distance WD except for the periphery of projection unit PU, and a Y head ($64_5$ or $65_1$) which is placed at a position a predetermined distance away in the −Y-direction from reference axis LH in the periphery of projection unit PU, or more specifically, on the −Y side of nozzle unit 32. Head units 62A and 62C are each also equipped with five Z heads which will be described later on. Hereinafter, Y heads $65_j$ and $64_i$ will also be described as Y heads 65 and 64, respectively, as necessary.

Head unit 62A constitutes a multiple-lens (five-lens, in this case) Y linear encoder (hereinafter appropriately shortened to "Y encoder" or "encoder") 70A (refer to FIG. 6) that measures the position of wafer stage WST (wafer table WTB) in the Y-axis direction (the Y-position) using Y scale $39Y_1$ previously described. Similarly, head unit 62C constitutes a multiple-lens (five-lens, in this case) Y linear encoder 70C (refer to FIG. 6) that measures the Y-position of wafer stage WST (wafer table WTB) using Y scale $39Y_2$ described above. In this case, distance WD in the X-axis direction of the five Y heads ($64_i$ or $65_j$) (more specifically, measurement beams) that head units 62A and 62C are each equipped with, is set slightly narrower than the width (to be more precise, the length of grid line 38) of Y scales $39Y_1$ and $39Y_2$ in the X-axis direction.

As shown in FIG. 3, head unit 62B is placed on the +Y side of nozzle unit 32 (projection unit PU), and is equipped with a plurality of, in this case, four X heads $66_5$ to $66_8$ that are placed on reference axis LV previously described along Y-axis direction at distance WD. Further, head unit 62D is placed on the −Y side of primary alignment system AL1, on the opposite side of head unit 62B via nozzle unit 32 (projection unit PU), and is equipped with a plurality of, in this case, four X heads $66_1$ to $66_4$ that are placed on reference axis LV at distance WD. Hereinafter, X heads $66_1$ to $66_8$ will also be described as X head 66, as necessary.

Head unit 62B constitutes a multiple-lens (four-lens, in this case) X linear encoder (hereinafter, shortly referred to as an "X encoder" or an "encoder" as needed) 70B (refer to FIG. 6) that measures the position in the X-axis direction (the X-position) of wafer stage WST using X scale $39X_1$ described above. Further, head unit 62D constitutes a multiple-lens (four-lens, in this case) X encoder 70D (refer to FIG. 6) that measures the X-position of wafer stage WST using X scale $39X_2$ described above.

Here, the distance between adjacent X heads 66 (measurement beams) that are equipped in each of head units 62B and 62D is set shorter than a width in the Y-axis direction of X scales $39X_1$ and $39X_2$ (to be more accurate, the length of grid line 37). Further, the distance between X head 66 of head unit 62B farthest to the −Y side and X head 66 of head unit 62D farthest to the +Y side is set slightly narrower than the width of wafer stage WST in the Y-axis direction so that switching (linkage described below) becomes possible between the two X heads by the movement of wafer stage WST in the Y-axis direction.

In the embodiment, furthermore, head units 62F and 62E are respectively arranged a predetermined distance away on the −Y side of head units 62A and 62C. Although illustration of head units 62E and 62F is omitted in FIG. 3 and the like from the viewpoint of avoiding intricacy of the drawings, in actual practice, head units 62E and 62F are fixed to the foregoing main frame that holds projection unit PU in a suspended state via a support member. Incidentally, for example, in the case projection unit PU is supported in a suspended state, head units 62E and 62F, and head units 62A to 62D which are previously described can be supported in a suspended state integrally with projection unit PU, or can be arranged at the measurement frame described above.

Head unit 62E is equipped with four Y heads $67_1$ to $67_4$ whose positions in the X-axis direction are different. More particularly, head unit 62E is equipped with three Y heads $67_1$ to $67_3$ placed on the −X side of the secondary alignment system $AL2_1$ on reference axis LA previously described at substantially the same distance as distance WD previously described, and one Y head $67_4$ which is placed at a position a predetermined distance (a distance slightly shorter than WD) away on the +X side from the innermost (the +X side) Y head $67_3$ and is also on the +Y side of the secondary alignment system $AL2_1$ a predetermined distance away to the +Y side of reference axis LA.

Head unit 62F is symmetrical to head unit 62E with respect to reference axis LV, and is equipped with four Y heads $68_1$ to $68_4$ which are placed in symmetry to four Y heads $67_1$ to $67_4$ with respect to reference axis LV. Hereinafter, Y heads $67_1$ to $67_4$ and $68_1$ to $68_4$ will also be described as Y heads 67 and 68, respectively, as necessary. In the case of an alignment operation and the like which will be described later on, at least one each of Y heads 67 and 68 faces Y scale $39Y_2$ and $39Y_1$, respectively, and by such Y heads 67 and 68 (more specifically, Y encoders 70C and 70A which are configured by these Y heads 67 and 68), the Y position (and the θz rotation) of wafer stage WST is measured.

Further, in the embodiment, at the time of baseline measurement (Sec–BCHK (interval)) and the like of the secondary alignment system which will be described later on, Y head $67_3$ and $68_2$ which are adjacent to the secondary alignment systems $AL2_1$ and $AL2_4$ in the X-axis direction face the pair of reference gratings 52 of FD bar 46, respectively, and by Y heads $67_3$ and $68_2$ that face the pair of reference gratings 52, the Y position of FD bar 46 is measured at the position of each reference grating 52. In the description below, the encoders configured by Y heads $67_3$ and $68_2$ which face a pair of reference gratings 52, respectively, are referred to as Y linear encoders (also shortly referred to as a "Y encoder" or an "encoder" as needed) $70E_2$ and $70F_2$. Further, for identification, Y encoders 70E and 70F configured by Y heads 67 and 68 that face Y scales $39Y_2$ and $39Y_1$ described above, respectively, will be referred to as Y encoders $70E_1$ and $70F_1$.

The linear encoders 70A to 70F described above measure the position coordinates of wafer stage WST at a resolution of, for example, around 0.1 nm, and the measurement values are supplied to main controller 20. Main controller 20 controls the position within the XY plane of wafer stage WST based on three measurement values of linear encoders 70A to 70D or on three measurement values of encoders 70B, 70D, $70E_1$, and $70F_1$, and also controls the rotation in the θz direction of FD bar 46 based on the measurement values of linear encoders $70E_2$ and $70F_2$.

In exposure apparatus 100 of the embodiment, as shown in FIG. 3, a multipoint focal position detecting system (hereinafter, shortly referred to as a "multipoint AF system") by an oblique incident method is arranged, which is composed of an irradiation system 90a and a photodetection system 90b, having a configuration similar to the one disclosed in, for example, Kokai (Japanese Unexamined Patent Application Publication) No. 06-283403 (the corresponding U.S. Pat. No. 5,448,332) and the like. In the embodiment, as an example, irradiation system 90a is placed on the +Y side of the –X end portion of head unit 62E previously described, and photodetection system 90b is placed on the +Y side of the +X end portion of head unit 62F previously described in a state of opposing irradiation system 90a.

A plurality of detection points of the multipoint AF system (90a, 90b) are placed at a predetermined distance along the X-axis direction on the surface to be detected. In the embodiment, the plurality of detection points are placed, for example, in the arrangement of a matrix having one row and M columns (M is a total number of detection points) or having two rows and N columns (N is a half of a total number of detection points). In FIG. 3, the plurality of detection points to which a detection beam is severally irradiated are not individually shown, but are shown as an elongate detection area (beam area) AF that extends in the X-axis direction between irradiation system 90a and photodetection system 90b. Because the length of detection area AF in the X-axis direction is set to around the same as the diameter of wafer W, by only scanning wafer W in the Y-axis direction once, position information (surface position information) in the Z-axis direction across the entire surface of wafer W can be measured. Further, since detection area AF is placed between liquid immersion area 14 (exposure area IA) and the detection areas of the alignment systems (AL1, $AL2_1$, and $AL2_2$ to $AL2_4$) in the Y-axis direction, the detection operations of the multipoint AF system and the alignment systems can be performed in parallel. The multipoint AF system may also be arranged on the main frame that holds projection unit PU or the like, however, in the embodiment, the system will be arranged on the measurement frame previously described.

Incidentally, the plurality of detection points are to be placed in one row and M columns, or two rows and N columns, but the number(s) of rows and/or columns is/are not limited to these numbers. However, in the case the number of rows is two or more, the positions in the X-axis direction of detection points are preferably made to be different even between the different rows. Moreover, the plurality of detection points is to be placed along the X-axis direction. However, the present invention is not limited to this, and all of or some of the plurality of detection points may also be placed at different positions in the Y-axis direction. For example, the plurality of detection points may also be placed along a direction that intersects both of the X-axis and the Y-axis. That is, the positions of the plurality of detection points only have to be different at least in the X-axis direction. Further, a detection beam is to be irradiated to the plurality of detection points in the embodiment, but a detection beam may also be irradiated to, for example, the entire area of detection area AF. Furthermore, the length of detection area AF in the X-axis direction does not have to be nearly the same as the diameter of wafer W.

In the vicinity of detection points located at both ends out of a plurality of detection points of the multipoint AF system (90a, 90b), that is, in the vicinity of both end portions of detection area AF, heads 72a and 72b, and 72c and 72d of surface position sensors for Z position measurement (hereinafter, shortly referred to as "Z heads") are arranged each in a pair, in symmetrical placement with respect to reference axis LV. Z heads 72a to 72d are fixed to the lower surface of a main frame (not shown). Incidentally, Z heads 72a to 72d may also be arranged on the measurement frame described above or the like.

As Z heads 72a to 72d, a sensor head that irradiates a light to wafer table WTB from above, receives the reflected light and measures position information of the wafer table WTB surface in the Z-axis direction orthogonal to the XY plane at the irradiation point of the light, as an example, a head of an optical displacement sensor (a sensor head by an optical pickup method), which has a configuration like an optical pickup used in a CD drive device, is used.

Furthermore, head units 62A and 62C previously described are respectively equipped with Z heads $76_j$ and $74_i$ (i, j=1-5), which are five heads each, at the same X position as Y heads $65_j$ and $64_i$ (i, j=1-5) that head units 62A and 62C are respectively equipped with, with the Y position shifted. In this case, Z heads $76_3$ to $76_5$ and $74_1$ to $74_3$, which are three heads each on the outer side belonging to head units 62A and 62C, respectively, are placed parallel to reference axis LH a predetermined distance away in the +Y direction from reference axis LH. Further, Z heads $76_1$ and $74_5$, which are heads on the innermost side belonging to head units 62A and 62C, respectively, are placed on the +Y side of projection unit PU, and Z heads $76_2$ and $74_4$, which are the second innermost heads are placed on the –Y side of Y heads $65_2$ and $64_4$, respectively. And Z heads $76_j$, $74_i$ (i, j=1-5), which are five heads each belonging to head unit 62A and 62C, respectively, are placed symmetric to each other with respect to reference axis LV. Incidentally, as each of the Z heads 76 and 74, an optical displacement sensor head similar to Z heads 72a to 72d described above is employed. Incidentally, the configuration and the like of the Z heads will be described later on.

In this case, Z head $74_3$ is on a straight line parallel to the Y-axis, the same as is with Z heads 72a and 72b previously described. Similarly, Z head $76_3$ is on a straight line parallel to the Y-axis, the same as is with Z heads 72c and 72d previously described.

Z heads 72a to 72d, Z heads $74_1$ to $74_5$, and Z heads $76_1$ to $76_5$ connect to main controller 20 via a signal processing/selection device 170 as shown in FIG. 6, and main controller 20 selects an arbitrary Z head from Z heads 72a to 72d, Z heads $74_1$ to $74_5$, and Z heads $76_1$ to $76_5$ via signal processing/selection device 170 and makes the head move into an operating state, and then receives the surface position information detected by the Z head which is in an operating state via signal processing/selection device 170. In the embodiment, a surface position measurement system 180 (a part of measurement system 200) that measures positional information of wafer stage WST in the Z-axis direction and the direction of inclination with respect to the XY plane is configured, including Z heads 72a to 72d, Z heads $74_1$ to $74_5$, and Z heads $76_1$ to $76_5$, and signal processing/selection device 170.

Incidentally, in FIG. 3, measurement stage MST is omitted and a liquid immersion area that is formed by water Lq held in the space between measurement stage MST and tip lens 191 is shown by a reference code 14. Further, in FIG. 3, a reference code UP indicates an unloading position where a wafer on wafer table WTB is unloaded, and a reference code LP indicates a loading position where a wafer is loaded on wafer table WTB. In the embodiment, unloading position UP and loading position LP are set symmetrically with respect to reference axis LV. Incidentally, unloading position UP and loading position LP may be the same position.

FIG. 6 shows the main configuration of the control system of exposure apparatus 100. The control system is mainly configured of main controller 20 composed of a microcomputer (or workstation) that performs overall control of the entire apparatus. In memory 34 which is an external memory connected to main controller 20, correction information is stored of measurement instrument systems such as interferometer system 118, encoder system 150 (encoders 70A to 70F), Z heads 72a to 72d, $74_1$ to $74_5$, $76_1$ to $76_5$ and the like. Incidentally, in FIG. 6, various sensors such as uneven illuminance measuring sensor 94, aerial image measuring instrument 96 and wavefront aberration measuring instrument 98 that are arranged at measurement stage MST are collectively shown as a sensor group 99.

Next, the configuration and the like of Z heads 72a to 72d, $74_1$ to $74_5$, and $76_1$ to $76_5$ will be described, focusing on Z head 72a shown in FIG. 7 as a representative.

Figure 7:
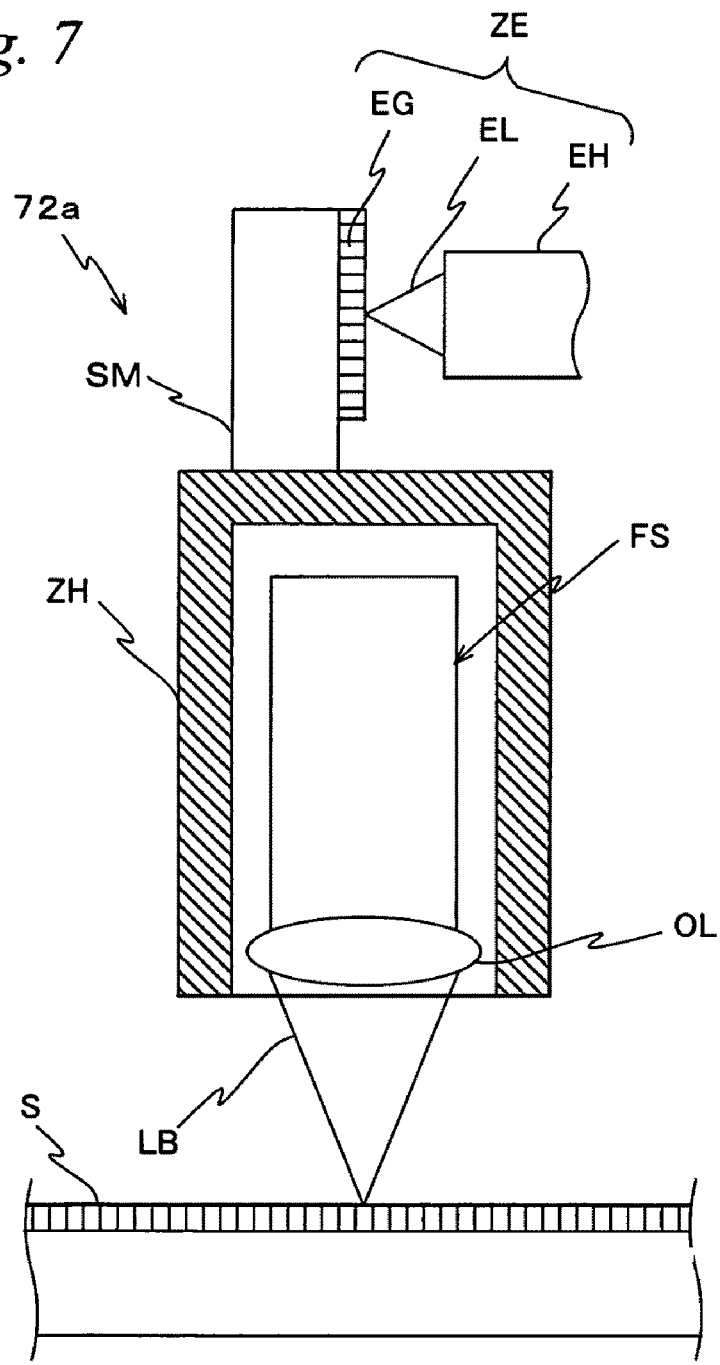
FIG. 7 is a view schematically showing an example of a configuration of a Z head.

As shown in FIG. 7, Z head 72a is equipped with a focus sensor FS, a sensor main section ZH which houses focus sensor FS, a drive section (not shown) which drives sensor main section ZH in the Z-axis direction, a measurement section ZE which measures displacement of sensor main section ZH in the Z-axis direction and the like.

As focus sensor FS, an optical displacement sensor similar to an optical pickup used in a CD drive device and the like that irradiates a probe beam LB on a measurement target surface S and optically reads the displacement of measurement surface S by receiving the reflected light is used. The configuration and the like of the focus sensor will be described later in the description. The output signal of focus sensor FS is sent to the drive section (not shown).

The drive section (not shown) includes an actuator such as, for example, a voice coil motor, and one of a mover and a stator of the voice coil motor is fixed to sensor main section ZH, and the other is fixed to a part of a housing (not shown) which houses the sensor main section ZH, measurement section ZE and the like, respectively. The drive section drives sensor main section ZH in the Z-axis direction according to the output signals from focus sensor FS so that the distance between sensor main section ZH and measurement target surface S is constantly maintained (or to be more precise, so that measurement target surface S is maintained at the best focus position of the optical system of focus sensor FS). By this drive, sensor main section ZH follows the displacement of measurement target surface S in the Z-axis direction, and a focus lock state is maintained.

As measurement section ZE, in the embodiment, an encoder by the diffraction interference method is used as an example. Measurement section ZE includes a reflective diffraction grating EG whose periodic direction is the Z-axis direction arranged on a side surface of a support member SM fixed on the upper surface of sensor main section ZH extending in the Z-axis direction, and an encoder head EH which is attached to the housing (not shown) facing diffraction grating EG. Encoder head EH reads the displacement of sensor main section ZH in the Z-axis direction by irradiating probe beam EL on diffraction grating EG, receiving the reflection/diffraction light from diffraction grating EG with a light-receiving element, and reading the deviation of an irradiation point of probe beam EL from a reference point (for example, the origin).

In the embodiment, in the focus lock state, sensor main section ZH is displaced in the Z-axis direction so as to constantly maintain the distance with measurement target surface S as described above. Accordingly, by encoder head EH of measurement section ZE measuring the displacement of sensor main section ZH in the Z-axis direction, surface position (Z position) of measurement target surface S is measured. Measurement values of encoder head EH is supplied to main controller 20 via signal processing/selection device 170 previously described as measurement values of Z head 72a.

As shown in FIG. 8A, as an example, focus sensor FS includes three sections, an irradiation system $FS_1$, an optical system $FS_2$, and a photodetection system $FS_3$.

Irradiation system $FS_1$ includes, for example, a light source LD made up of laser diodes, and a diffraction grating plate (a diffractive optical element) ZG placed on the optical path of a laser beam outgoing from light source LD.

Optical system $FS_2$ includes, for instance, a diffraction light of the laser beam generated in diffraction grating plate ZG, or more specifically, a polarization beam splitter PBS, a collimator lens CL, a quarter-wave plate (a λ/4 plate) WP, and object lens OL and the like placed sequentially on the optical path of probe beam $LB_1$.

Photodetection system $FS_3$, for instance, includes a cylindrical lens CYL and a tetrameric light receiving element ZD placed sequentially on a return optical path of reflected beam $LB_2$ of probe beam $LB_1$ on measurement target surface S.

According to focus sensor FS, the linearly polarized laser beam generated in light source LD of irradiation system $FS_1$ is irradiated on diffraction grating plate ZG, and diffraction light (probe beam) $LB_1$ is generated in diffraction grating plate ZG. The central axis (principal ray) of probe beam $LB_1$ is parallel to the Z-axis and is also orthogonal to measurement target surface S.

Then, probe beam $LB_1$, or more specifically, light having a polarization component that is a P-polarized light with respect to a separation plane of polarization beam splitter PBS, is incident on optical system $FS_2$. In optical system $FS_2$, probe beam $LB_1$ passes through polarization beam splitter PBS and is converted into a parallel beam at collimator lens CL, and then passes through λ/4 plate WP and becomes a circular polarized light, which is condensed at object lens OL and is irradiated on measurement target surface S. Accordingly, at measurement target surface S, reflected light (reflected beam) $LB_2$ occurs, which is a circular polarized light that proceeds inversely to the incoming light of probe beam $LB_1$. Then, reflected beam $LB_2$ traces the optical path of the incoming light (probe beam $LB_1$) the other way around, and passes through object lens OL, λ/4 plate WP, collimator lens CL, and then proceeds toward polarization beam splitter PBS. In this case, because the beam passes through λ/4 plate WP twice, reflected beam $LB_2$ is converted into an S-polarized light. Therefore, the proceeding direction of reflected beam $LB_2$ is bent at the separation plane of polarization beam splitter PBS, so that it moves toward photodetection system $FS_3$.

In photodetection system $FS_3$, reflected beam $LB_2$ passes through cylindrical lenses CYL and is irradiated on a detection surface of tetrameric light receiving element ZD. In this case, cylindrical lenses CYL is a "cambered type" lens, and as shown in FIG. 8B, the YZ section has a convexed shape with the convexed section pointing the Y-axis direction, and as shown also in FIG. 8C, the XY section has a rectangular shape. Therefore, the sectional shape of reflected beam $LB_2$ which passes through cylindrical lenses CYL is narrowed asymmetrically in the Z-axis direction and the X-axis direction, which causes astigmatism.

Figure 9A:
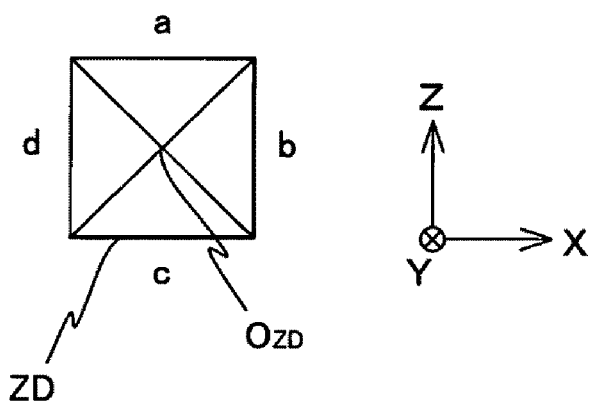
FIG. 9A is a view showing a divided state of a detection area of a tetrameric light receiving element.

Tetrameric light receiving element ZD receives reflected beam $LB_2$ on its detection surface. The detection surface of tetrameric light receiving element ZD has a square shape as a whole, as shown in FIG. 9A, and it is divided equally into four detection areas a, b, c, and d with the two diagonal lines serving as a separation line. The center of the detection surface will be referred to as $O_{ZD}$.

Figure 9B:
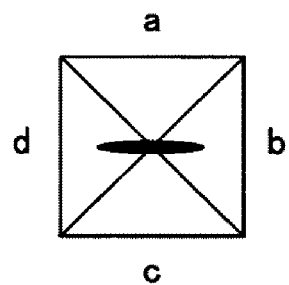
FIGS. 9B, 9C, and 9D are views respectively showing a cross-sectional shape of reflected beam LB2 on a detection surface in a front-focused, an ideal focus, and a back-focused state.
Figure 9C:
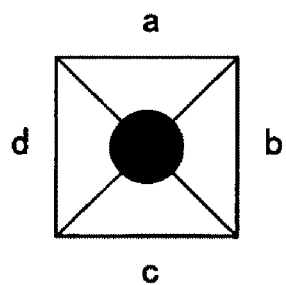

In this case, in an ideal focus state (a state in focus) shown in FIG. 8A, or more specifically, in a state where probe beam $LB_1$ is focused on measurement target surface $S_0$, the cross-sectional shape of reflected beam $LB_2$ on the detection surface becomes a circle with center $O_{ZD}$ serving as a center, as shown in FIG. 9C.

Further, in the so-called front-focused state (more specifically, a state equivalent to a state where measurement target surface S is at ideal position $S_0$ and tetrameric light receiving element ZD is at a position shown by reference code 1 in FIGS. 8B and 8C) where probe beam $LB_1$ focuses on measurement target surface $S_1$ in FIG. 8A, the cross-sectional shape of reflected beam $LB_2$ on the detection surface becomes a horizontally elongated circle with center $O_{ZD}$ serving as a center as shown in FIG. 9B.

Figure 9D:
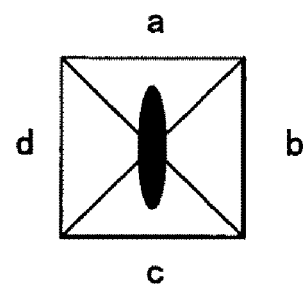

Further, in the so-called back-focused state (more specifically, a state equivalent to a state where measurement target surface S is at ideal position $S_0$ and tetrameric light receiving element ZD is at a position shown by reference code −1 in FIGS. 8B and 8C) where probe beam $LB_1$ focuses on measurement target surface $S_{-1}$ in FIG. 8A, the cross-sectional shape of reflected beam $LB_2$ on the detection surface becomes a longitudinally elongated circle with center $O_{ZD}$ serving as a center as shown in FIG. 9D.

In an operational circuit (not shown) connected to tetrameric light receiving element ZD, a focus error I expressed as in the following formula (7) is computed and output to the drive section (not shown), with the intensity of light received in the four detection areas a, b, c, and d expressed as Ia, Ib, Ic, and Id, respectively.

$$I=(Ia+Ic)-(Ib+Id) \qquad (7)$$

Incidentally, in the ideal focus state described above, because the area of the beam cross-section in each of the four detection areas is equal to each other, focus error I=0 can be obtained. Further, in the front focused state described above, according to formula (7), focus error becomes I<0, and in the back focused state, according to formula (7), focus error becomes I>0.

The drive section (not shown) receives focus error I from a detection section $FS_3$ within focus sensor FS, and drives sensor main section ZH which stored focus sensor FS in the Z-axis direction so as to reproduce I=0. By this operation of the drive section, because sensor main section ZH is also displaced following Z displacement of measurement target surface S, the probe beam focuses on measurement target surface S without fail, or more specifically, the distance between sensor main section ZH and measurement target surface S is always constantly maintained (focus lock state is maintained).

Meanwhile, the drive section (not shown) can also drive and position sensor main section ZH in the Z-axis direction so that a measurement result of measurement section ZE coincides with an input signal from the outside of Z head 72a. Accordingly, the focus of probe beam LB can also be positioned at a position different from the actual surface position of measurement target surface S. By this operation (scale servo control) of the drive section, processes such as return process in the switching of the Z heads, avoidance process at the time of abnormality generation in the output signals and the like, which will be described later, can be performed.

In the embodiment, as is previously described, an encoder is adopted as measurement section ZE, and encoder head EH is used to read the Z displacement of diffraction grating EG set in sensor main section ZH. Because encoder head EH is a relative position sensor which measures the displacement of the measurement object (diffraction grating EG) from a reference point, it is necessary to determine the reference point. In the embodiment, the reference position (for example, the origin) of the Z displacement can be determined by detecting an edge section of diffraction grating EG, or in the case a lay out pattern is arranged in diffraction grating EG, by detecting the pattern for positioning. In any case, reference surface position of measurement target surface S can be determined in correspondence with the reference position of diffraction grating EG, and the Z displacement of measurement target surface S from the reference surface position, or more specifically, the position in the Z-axis direction can be measured. Incidentally, at the start up and the like of the Z head, such as the start up and the like of exposure apparatus 100, setting of the reference position (for example, the origin, or more specifically, the reference surface position of measurement target surface S) of diffraction grating EG is executed without fail. In this case, because it is desirable for the reference position to be set close to the center of the movement range of sensor main section ZH, a drive coil for adjusting the focal position of the optical system can be arranged to adjust the Z position of object lens OL so that the reference surface position corresponding to the reference position around the center coincides with the focal position of the optical system in the focus sensor FS.

In Z head 72a, because sensor main section ZH and measurement section ZE are housed together inside the housing (not shown) and the part of the optical path length of probe beam $LB_1$ which is exposed outside the housing is extremely short, the influence of air fluctuation is extremely small. Accordingly, even when compared, for example, with a laser interferometer, the sensor including the Z head is much more superior in measurement stability (short-term stability) during a period as short as while the air fluctuates.

The other Z heads are also configured and function in a similar manner as Z head 72a described above. As is described, in the embodiment, as each Z head, a configuration is employed where the diffraction grating surfaces of Y scales 39Y$_1$, 39Y$_2$ and the like are observed from above (the +Z direction) as in the encoder. Accordingly, by measuring the surface position information of the upper surface of wafer table WTB at different positions with the plurality of Z heads, the position of wafer stage WST in the Z-axis direction, the θy rotation (rolling), and the θx rotation (pitching) can be measured. However, in the embodiment, because the accuracy of pitching control of wafer stage WST is not especially important on exposure, the surface position measurement system including the Z head does not measure pitching, and a configuration was employed where one Z head each faces Y scales 39Y$_1$ and 39Y$_2$ on wafer table WTB.

Next, detection of position information (surface position information) of the wafer W surface in the Z-axis direction (hereinafter, referred to as focus mapping) that is performed in exposure apparatus 100 of the embodiment will be described.

Figure 10A:
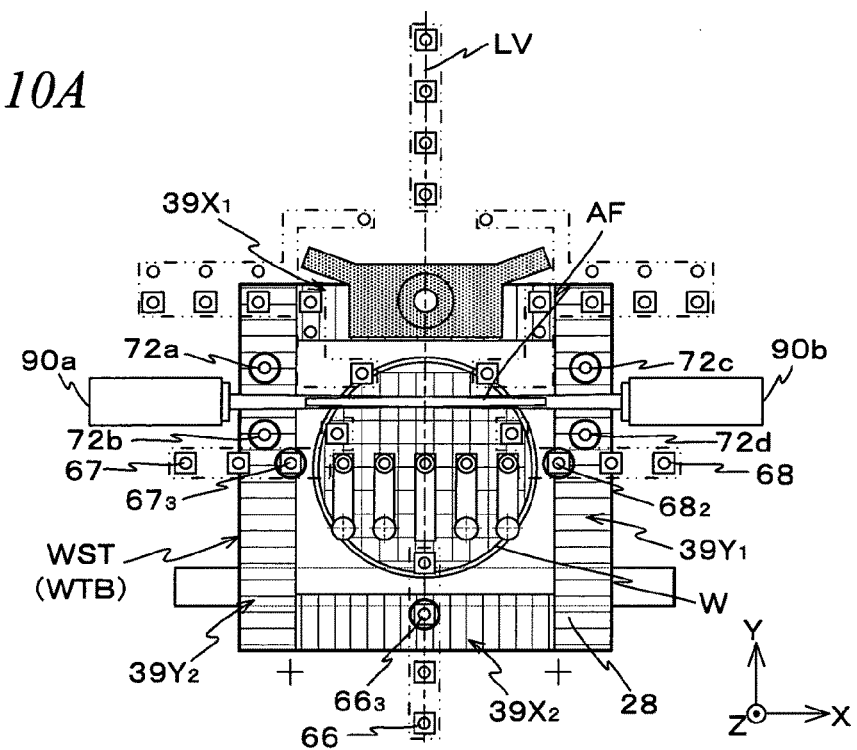
FIGS. 10A to 10C are views used to explain focus mapping performed in the exposure apparatus related to an embodiment.

On the focus mapping, as is shown in FIG. 10A, main controller 20 controls the position within the XY plane of wafer stage WST based on X head 66$_3$ facing X scale 39X$_2$ (X linear encoder 70D) and two Y heads 68$_2$ and 67$_3$ facing Y scales 39Y$_1$ and 39Y$_2$ respectively (Y linear encoders 70A and 70C). In the state of FIG. 10A, a straight line (centerline) parallel to the Y-axis that passes through the center of wafer table WTB (which substantially coincides with the center of wafer W) coincides with reference line LV previously described. Further, although it is omitted in the drawing here, measurement stage MST is located on the +Y side of wafer stage WST, and water is retained in the space between FD bar 46, wafer table WTB and tip lens 191 of projection optical system PL previously described (refer to FIG. 18).

Then, in this state, main controller 20 starts scanning of wafer stage WST in the +Y direction, and after having started the scanning, activates (turns ON) both Z heads 72a to 72d and the multipoint AF system (90a, 90b) by the time when wafer stage WST moves in the +Y direction and detection beams (detection area AF) of the multipoint AF system (90a, 90b) begin to be irradiated on wafer W.

Figure 10B:
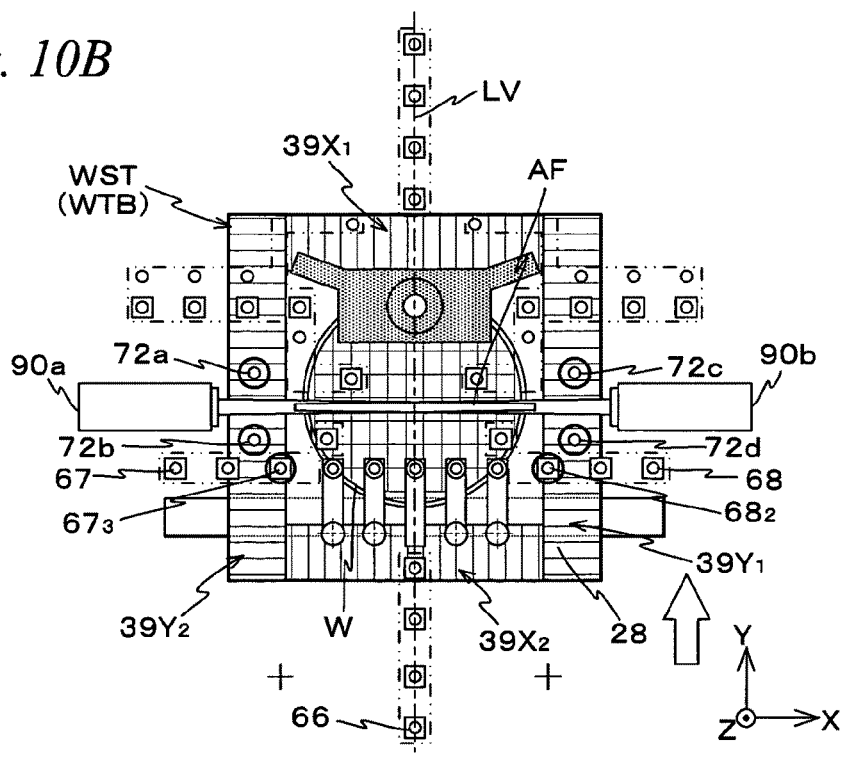

Then, in a state where Z heads 72a to 72d and the multipoint AF system (90a, 90b) simultaneously operate, as is shown in FIG. 10B, position information (surface position information) of the wafer table WTB surface (surface of plate 28) in the Z-axis direction that is measured by Z heads 72a to 72d and position information (surface position information) of the wafer W surface in the Z-axis direction at a plurality of detection points that is detected by the multipoint AF system (90a, 90b) are loaded at a predetermined sampling interval while wafer stage WST is proceeding in the +Y direction, and three kinds of information, which are each surface position information that has been loaded and the measurement values of Y linear encoders 70A and 70C at the time of each sampling, are made to correspond to one another and are sequentially stored in a memory (not shown).

Then, when the detection beams of the multipoint AF system (90a, 90b) begin to miss wafer W, main controller 20 ends the sampling described above and converts the surface position information at each detection point of the multipoint AF system (90a, 90b) into data which uses the surface position information by Z heads 72a to 72d that has been loaded simultaneously as a reference.

Figure 10C:
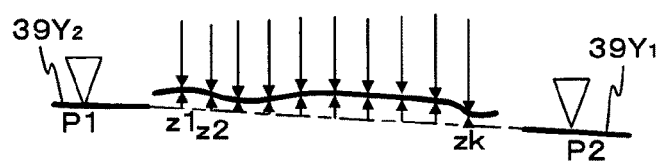

More specifically, based on an average value of the measurement values of Z heads 72a and 72b, surface position information at a predetermined point (for example, corresponding to a midpoint of the respective measurement points of Z heads 72a and 72b, that is, a point on substantially the same X-axis as the array of a plurality of detection points of the multipoint AF system (90a, 90b): hereinafter, this point is referred to as a left measurement point P1) on an area (an area where Y scale 39Y$_2$ is formed) near the edge section on the −X side of plate 28 is obtained. Further, based on an average value of the measurement values of Z heads 72c and 72d, surface position information at a predetermined point (for example, corresponding to a midpoint of the respective measurement points of Z heads 72c and 72d, that is, a point on substantially the same X-axis as the array of a plurality of detection points of the multipoint AF system (90a, 90b) hereinafter, this point is referred to as a right measurement point P2) on an area (an area where Y scale 39Y$_1$ is formed) near the edge section on the +X side of plate 28 is obtained. Then, as shown in FIG. 10C, main controller 20 converts the surface position information at each detection point of the multipoint AF system (90a, 90b) into surface position data z1-zk, which uses a straight line that connects the surface position of left measurement point P1 and the surface position of right measurement point P2 as a reference. Main controller 20 performs such a conversion on all information taken in during the sampling.

By obtaining such converted data in advance in the manner described above, for example, in the case of exposure, main controller 20 measures the wafer table WTB surface (a point on the area where Y scale 39Y$_2$ is formed (a point near left measurement point P1 described above) and a point on the area where Y scale 39Y$_1$ is formed (a point near right measurement point P1 described above)) with Z heads 74$_i$ and 76$_j$ previously described, and computes the Z position and θy rotation (rolling) amount θy of wafer stage WST. Then, by performing a predetermined operation using the Z position, the rolling amount θy, and the θx rotation (pitching) amount θx of wafer stage WST measured with Y interferometer 16, and computing the Z position (Z$_0$), rolling amount θy, and pitching amount θx of the wafer table WTB surface in the center (the exposure center) of exposure area IA previously described, and then obtaining the straight line passing through the exposure center that connects the surface position of left measurement point P1 and the surface position of right measurement point P2 described above based on the computation results, it becomes possible to perform the surface position control (focus leveling control) of the upper surface of wafer W without actually acquiring the surface position information of the wafer W surface by using such straight line and surface position data z1-zk. Accordingly, because there is no problem even if the multipoint AF system is placed at a position away from projection optical system PL, the focus mapping of the embodiment can suitably be applied also to an exposure apparatus and the like that has a short working distance.

Incidentally, in the description above, while the surface position of left measurement point P1 and the surface position of right measurement point P2 were computed based on the average value of the measurement values of Z heads 72a and 72b, and the average value of Z heads 72c and 72d, respectively, the surface position information at each detection point of the multipoint AF system (90a, 90b) can also be converted, for example, into surface position data which uses the straight line connecting the surface positions measured by Z heads 72a and 72c as a reference. In this case, the difference between the measurement value of Z head 72a and the measurement value of Z head 72b obtained at each sampling timing, and the difference between the measurement value of Z head 72c and the measurement value of Z head 72d obtained at each sampling timing are to be obtained severally in advance. Then, when performing surface position control at the time of exposure or the like, by measuring the wafer table WTB surface with Z heads $74_i$ and $76_j$ and computing the Z-position and the θy rotation of wafer stage WST, and performing a predetermined operation using these computed values, pitching amount θx of wafer stage WST measured by Y interferometer 16, surface position data z1 to zk previously described, and the differences described above, it becomes possible to perform surface position control of wafer W, without actually obtaining the surface position information of the wafer surface.

However, the description so far is made assuming that unevenness does not exist on the wafer table WTB surface in the X-axis direction. Accordingly, hereinafter, to simplify the description, unevenness is not to exist on the wafer table WTB surface in the X-axis direction and the Y-axis direction.

Next, focus calibration will be described. Focus calibration refers to a process where a processing of obtaining a relation between surface position information of wafer table WTB at end portions on one side and the other side in the X-axis direction in a reference state and detection results (surface position information) at representative detection points on the measurement plate 30 surface of multipoint AF system (90a, 90b) (former processing of focus calibration), and a processing of obtaining surface position information of wafer table WTB at end portions on one side and the other side in the X-axis direction that correspond to the best focus position of projection optical system PL detected using aerial image measurement device 45 in a state similar to the reference state above (latter processing of focus calibration) are performed, and based on these processing results, an offset of multipoint AF system (90a, 90b) at representative detection points, or in other words, a deviation between the best focus position of projection optical system PL and the detection origin of the multipoint AF system, is obtained.

Figure 11A:
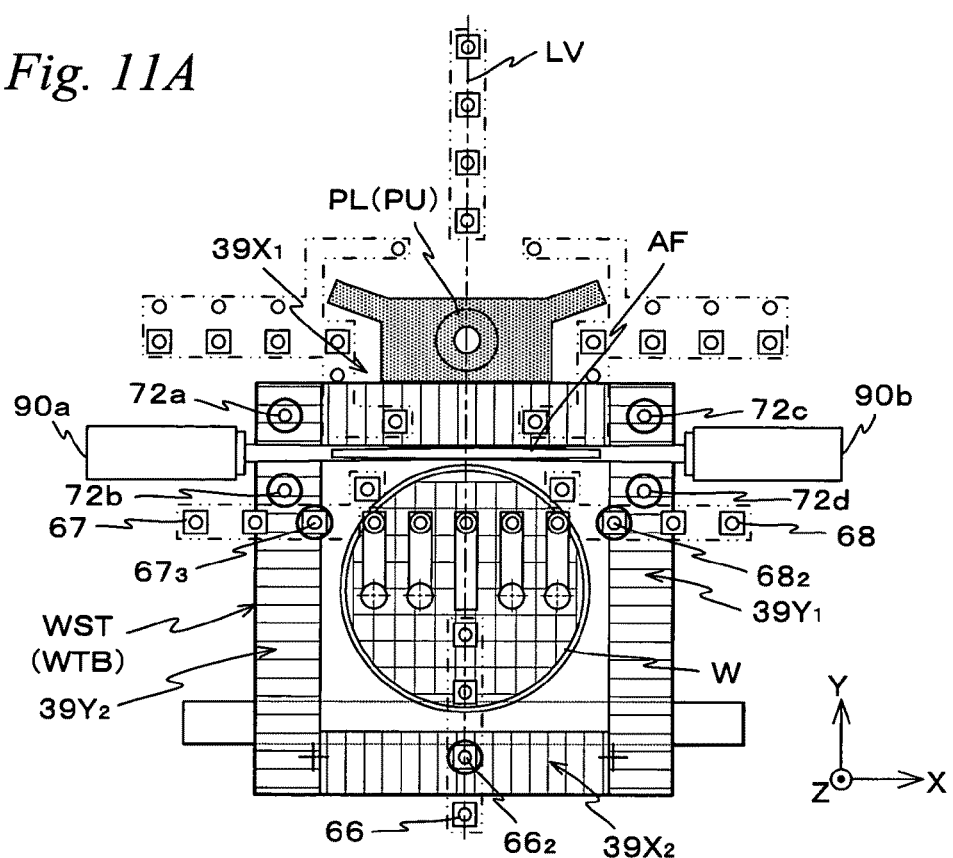
FIGS. 11A and 11B are views used to explain focus calibration performed in the exposure apparatus related to an embodiment.

On the focus calibration, as is shown in FIG. 11A, main controller 20 controls the position within the XY plane of wafer stage WST based on X head 66₂ facing X scale $39X_2$ (X linear encoder 70D) and two Y heads $68_2$ and $67_3$ facing Y scales $39Y_1$ and $39Y_2$ respectively (Y linear encoders 70A and 70C). The state of FIG. 11A is substantially the same as the state in FIG. 10A previously described. However, in the state of FIG. 11A, wafer table WTB is at a position where a detection beam from multipoint AF system (90a, 90b) is irradiated on measurement plate 30 previously described in the Y-axis direction.

(a) In this state, main controller 20 performs the former processing of focus calibration as in the following description. More specifically, while detecting surface position information of the end portions on one side and the other side of wafer table WTB in the X-axis direction that is detected by Z heads 72a, 72b, 72c and 72d previously described which are in the vicinity of the respective detection points located at both end sections of the detection area of the multipoint AF system (90a, 90b), main controller 20 uses the surface position information as a reference, and detects surface position information of the measurement plate 30 (refer to FIG. 3) surface previously described using the multipoint AF system (90a, 90b). Thus, a relation between the measurement values of Z heads 72a, 72b, 72c and 72d (surface position information at end portions on one side and the other side of wafer table WTB in the X-axis direction) and the detection results (surface position information) at a detection point (the detection point located in the center or the vicinity thereof out of a plurality of detection points) on the measurement plate 30 surface of the multipoint AF system (90a, 90b), in a state where the centerline of wafer table WTB coincides with reference line LV, is obtained.

Figure 11B:
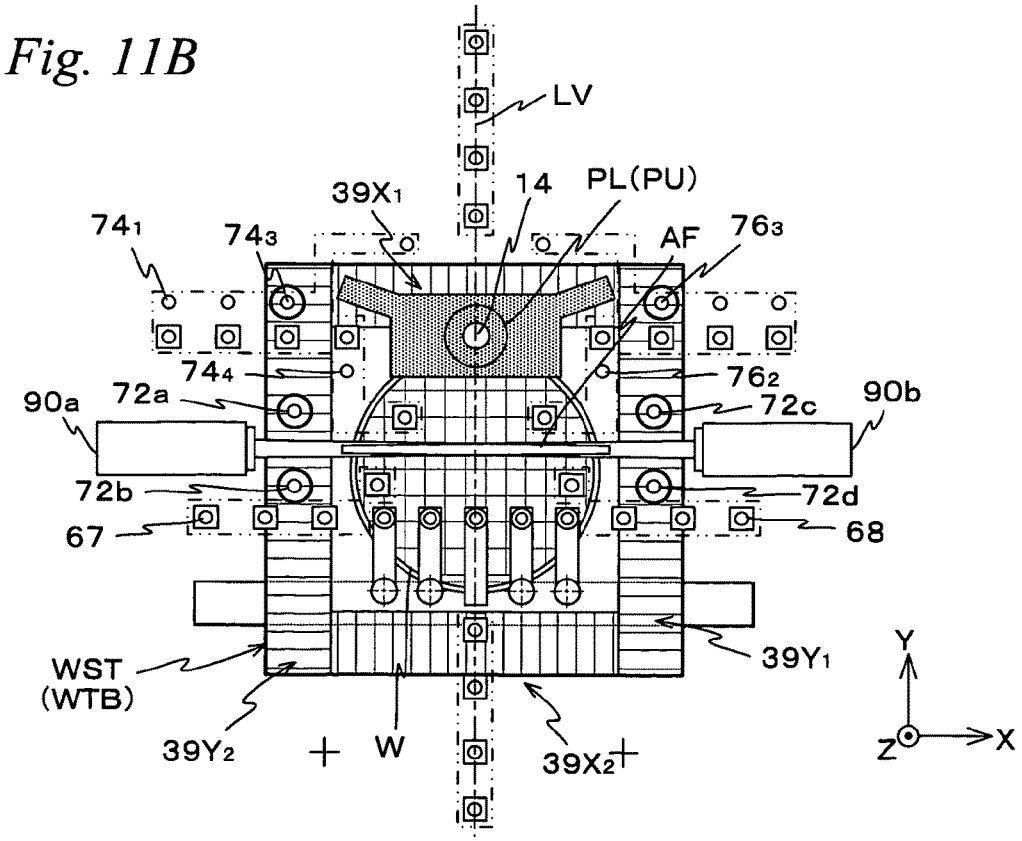

(b) Next, main controller 20 moves wafer stage WST in the +Y direction by a predetermined distance, and stops wafer stage WST at a position where measurement plate 30 is located directly below projection optical system PL. Then, main controller 20 performs the latter processing of focus calibration as follows. More specifically, as is shown in FIG. 11B, while controlling the position of measurement plate 30 (wafer stage WST) in the optical axis direction of projection optical system PL (the Z position), using surface position information measured by Z heads 72a to 72d as a reference as in the former processing of focus calibration, main controller 20 measures an aerial image of a measurement mark formed on reticle R or on a mark plate (not shown) on reticle stage RST by a Z direction scanning measurement whose details are disclosed in, for example, the pamphlet of International Publication No. 2005/124834 and the like, using aerial image measurement device 45, and based on the measurement results, measures the best focus position of projection optical system PL. During the Z direction scanning measurement described above, main controller 20 takes in measurement values of a pair of Z heads $74_3$ and $76_3$ which measure the surface position information at end portions on one side and the other side of wafer table WTB in the X-axis direction, in synchronization with taking in output signals from aerial image measurement device 45. Then, main controller 20 stores the values of Z heads $74_3$ and $76_3$ corresponding to the best focus position of projection optical system PL in memory (not shown). Incidentally, the reason why the position (Z position) related to the optical axis direction of projection optical system PL of measurement plate 30 (wafer stage WST) is controlled using the surface position information measured in the latter processing of the focus calibration by Z heads 72a to 72d as a reference is because the latter processing of the focus calibration is performed during the focus mapping previously described.

In this case, because liquid immersion area 14 is formed between projection optical system PL and measurement plate 30 (wafer table WTB) as shown in FIG. 11B, the measurement of the aerial image is performed via projection optical system PL and the water. Further, although it is omitted in FIG. 11B, because measurement plate 30 and the like of aerial image measurement device 45 are installed in wafer stage WST (wafer table WTB), and the light receiving elements are installed in measurement stage MST, the measurement of the aerial image described above is performed while wafer stage WST and measurement stage MST maintain a contact state (or a proximity state) (refer to FIG. 20).

(c) Accordingly, main controller 20 can obtain the offset at the representative detection point of the multipoint AF system (90a, 90b), or more specifically, the deviation between the best focus position of projection optical system PL and the detection origin of the multipoint AF system, based on the relation between the measurement values of Z heads 72a to 72d (surface position information at the end portions on one side and the other side in the X-axis direction of wafer table WTB) and the detection results (surface position information) of the measurement plate 30 surface by the multipoint AF system (90a, 90b) obtained in (a) described above, in the former processing of focus calibration, and also on the measurement values of Z heads $74_3$ and $76_3$ (that is, surface position information at the end portions on one side and the other side in the X-axis direction of wafer table WTB) corresponding to the best focus position of projection optical system PL obtained in (b) described above, in the latter processing of focus calibration. In the embodiment, the representative detection point is, for example, the detection point in the center of the plurality of detection points or in the vicinity thereof, but the number and/or the position may be arbitrary. In this case, main controller 20 adjusts the detection origin of the multipoint AF system so that the offset at the representative detection point becomes zero. The adjustment may be performed, for example, optically, by performing angle adjustment of a plane parallel plate (not shown) inside photodetection system 90*b*, or the detection offset may be electrically adjusted. Alternatively, the offset may be stored, without performing adjustment of the detection origin. In this case, adjustment of the detection origin is to be performed by the optical method referred to above. This completes the focus calibration of the multipoint AF system (90*a*, 90*b*). Incidentally, because it is difficult to make the offset become zero at all the remaining detection points other than the representative detection point by adjusting the detection origin optically, it is desirable to store the offset after the optical adjustment at the remaining detection points.

Next, offset correction of detection values among a plurality of light-receiving elements (sensors) that individually correspond to a plurality of detection points of the multiple AF system (90*a*, 90*b*) (hereinafter, referred to as offset correction among AF sensors) will be described.

Figure 12A:
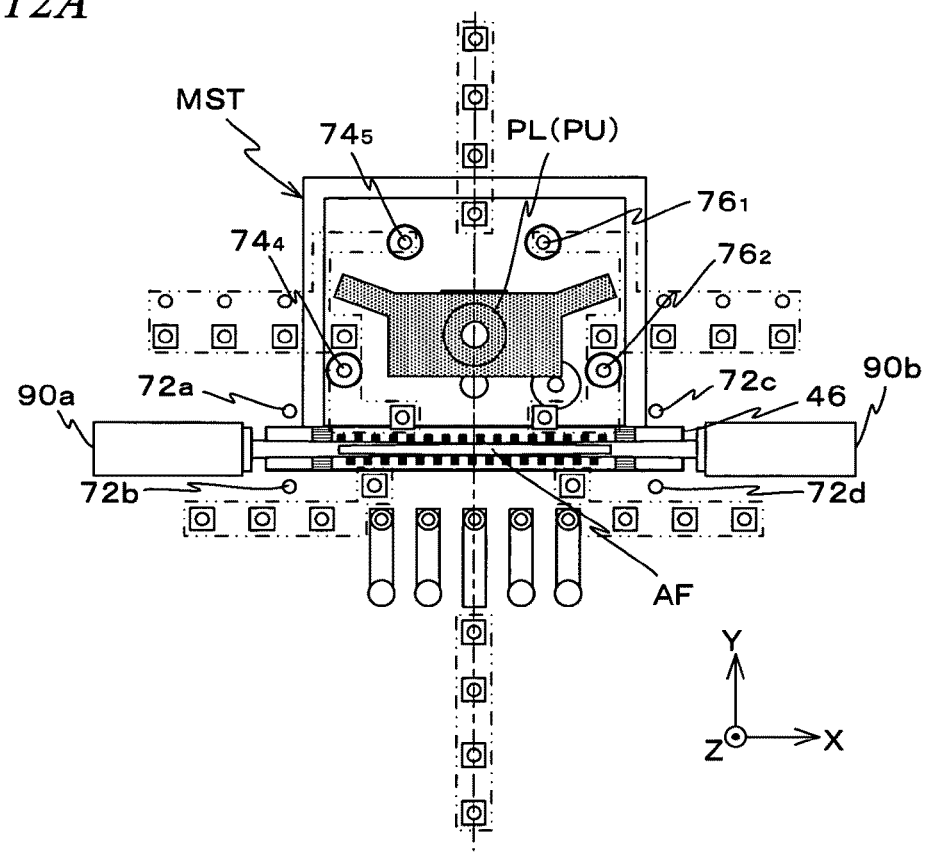
FIGS. 12A and 12B are views used to explain offset correction among AF sensors performed in the exposure apparatus related to an embodiment.
Figure 12B:
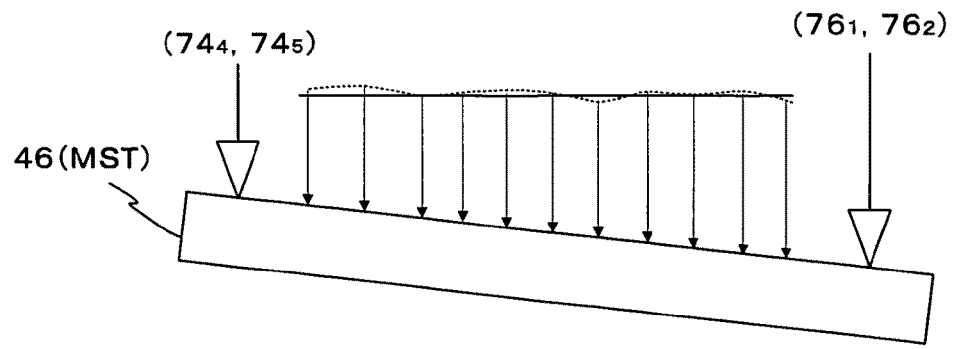

On the offset correction among AF sensors, as is shown in FIG. 12A, main controller 20 makes irradiation system 90*a* of the multipoint AF system (90*a*, 90*b*) irradiate detection beams to FD bar 46 equipped with a predetermined reference plane, and takes in output signals from photodetection system 90*b* of the multipoint AF system (90*a*, 90*b*) that receives the reflected lights from the FD bar 46 surface (reference plane).

In this case, if the FD bar 46 surface is set parallel to the XY plane, main controller 20 can perform the offset correction among AF sensors by obtaining a relation among the detection values (measurement values) of a plurality of sensors that individually correspond to a plurality of detection points based on the output signals loaded in the manner described above and storing the relation in a memory, or by electrically adjusting the detection offset of each sensor so that the detection values of all the sensors become, for example, the same value as the detection value of a sensor that corresponds to the representative detection point on the focus calibration described above.

In the embodiment, however, as is shown in FIG. 12A, because main controller 20 detects the inclination of the surface of FD bar 46 using Z heads 74$_4$, 74$_5$, 76$_1$ and 76$_2$ when taking in the output signals from photodetection system 90*b* of the multipoint AF system (90*a*, 90*b*), the FD bar 46 surface does not necessarily have to be set parallel to the XY plane. In other words, as is modeled in FIG. 12B, when it is assumed that the detection value at each detection point is the value as severally indicated by arrows in the drawing, and the line that connects the upper end of the detection values has an unevenness as shown in the dotted line in the drawing, each detection value only has to be adjusted so that the line that connects the upper end of the detection values becomes the solid line shown in the drawing.

Next, a parallel processing operation that uses wafer stage WST and measurement stage MST in exposure apparatus 100 of the embodiment will be described, based on FIGS. 13 to 23. Incidentally, during the operation below, main controller 20 performs the open/close control of each valve of liquid supply device 5 and liquid recovery device 6 of local liquid immersion device 8 in the manner previously described, and water is constantly filled on the outgoing surface side of tip lens 191 of projection optical system PL. However, in the description below, for the sake of simplicity, the explanation related to the control of liquid supply device 5 and liquid recovery device 6 will be omitted. Further, many drawings are used in the operation description hereinafter, however, reference codes may or may not be given to the same member for each drawing. More specifically, the reference codes written are different for each drawing, however, such members have the same configuration, regardless of the indication of the reference codes. The same can be said for each drawing used in the description so far.

FIG. 13 shows a state in which an exposure by the step-and-scan method of wafer W mounted on wafer stage WST is performed. This exposure is performed by alternately repeating a movement between shots in which wafer stage WST is moved to a scanning starting position (acceleration staring position) to expose each shot area on wafer W and scanning exposure in which the pattern formed on reticle R is transferred onto each shot area by the scanning exposure method, based on results of wafer alignment (EGA: Enhanced Global Alignment) and the like which has been performed prior to the beginning of exposure. Further, exposure is performed in the following order, from the shot area located on the −Y side on wafer W to the shot area located on the +Y side. Incidentally, exposure is performed in a state where liquid immersion area 14 is formed in between projection unit PU and wafer W.

During the exposure described above, the position (including rotation in the θz direction) of wafer stage WST (wafer table WTB) in the XY plane is controlled by main controller 20, based on measurement results of a total of three encoders which are the two Y encoders 70A and 70C, and one of the two X encoders 70B and 70D. In this case, the two X encoders 70B and 70D are made up of two X heads 66 that face X scale 39X$_1$ and 39X$_2$, respectively, and the two Y encoders 70A and 70C are made up of Y heads 65 and 64 that face Y scales 39Y$_1$ and 39Y$_2$, respectively. Further, the Z position and rotation (rolling) in the θy direction of wafer stage WST are controlled, based on measurement results of Z heads 74$_i$ and 76$_j$, which respectively belong to head units 62C and 62A facing the end section on one side and the other side of the surface of wafer table WTB in the X-axis direction, respectively. The θx rotation (pitching) of wafer stage WST is controlled based on measurement values of Y interferometer 16. Incidentally, in the case three or more Z heads including Z head 74$_i$ and 76$_j$ face the surface of the second water repellent plate 28*b* of wafer table WTB, it is also possible to control the position of wafer stage WST in the Z-axis direction, the θy rotation (rolling), and the θx rotation (pitching), based on the measurement values of Z heads 74$_i$, 76$_j$ and the other one head. In any case, the control (more specifically, the focus leveling control of wafer W) of the position of wafer stage WST in the Z-axis direction, the rotation in the θy direction, and the rotation in the θx direction is performed, based on results of a focus mapping performed beforehand.

At the position of wafer stage WST shown in FIG. 13, while X head 66$_5$ (shown circled in FIG. 13) faces X scale 39X$_1$, there are no X heads 66 that face X scale 39X$_2$. Therefore, main controller 20 uses one X encoder 70B and two Y encoders 70A and 70C so as to perform position (X, Y, θz) control of wafer stage WST. In this case, when wafer stage WST moves from the position shown in FIG. 13 to the −Y direction, X head 66$_5$ moves off of (no longer faces) X scale 39X$_1$, and X head 66$_4$ (shown circled in a broken line in FIG. 13) faces X scale 39X$_2$ instead. Therefore, main controller 20 switches the control to a position (X, Y, θz) control of wafer stage WST that uses one X encoder 70D and two Y encoders 70A and 70C.

Further, when wafer stage WST is located at the position shown in FIG. 13, Z heads $74_3$ and $76_3$ (shown circled in FIG. 13) face Y scales $39Y_2$ and $39Y_1$, respectively. Therefore, main controller 20 performs position (Z, θy) control of wafer stage WST using Z heads $74_3$ and $76_3$. In this case, when wafer stage WST moves from the position shown in FIG. 13 to the +X direction, Z heads $74_3$ and $76_3$ move off of (no longer faces) the corresponding Y scales, and Z heads $74_4$ and $76_4$ (shown circled in a broken line in FIG. 13) respectively face Y scales $39Y_2$ and $39Y_1$ instead. Therefore, main controller 20 switches to position (Z, θy) control of wafer stage WST using Z heads $74_4$ and $76_4$.

In this manner, main controller 20 performs position control of wafer stage WST by consistently switching the encoder and Z heads to use depending on the position coordinate of wafer stage WST.

Incidentally, independent from the position measurement of wafer stage WST described above using the measuring instrument system described above, position (X, Y, Z, θx, θy, θz) measurement of wafer stage WST using interferometer system 118 is constantly performed. In this case, the X position and θz rotation (yawing) of wafer stage WST or the X position are measured using X interferometers 126, 127, or 128, the Y position, the θx rotation, and the θz rotation are measured using Y interferometer 16, and the Y position, the Z position, the θy rotation, and the θz rotation are measured using Z interferometers 43A and 43B (not shown in FIG. 13, refer to FIG. 1 or 2) that constitute interferometer system 118. Of X interferometers 126, 127, and 128, one interferometer is used according to the Y position of wafer stage WST. As indicated in FIG. 13, X interferometer 126 is used during exposure. The measurement results of interferometer system 118 except for pitching (θx rotation) are used for position control of wafer stage WST secondarily, or in the case of backup which will be described later on, or when measurement using encoder system 150 cannot be performed.

When exposure of wafer W has been completed, main controller 20 drives wafer stage WST toward unloading position UP. On this drive, wafer stage WST and measurement stage MST which were apart during exposure come into contact or move close to each other with a clearance of around 300 μm in between, and shift to a scrum state. In this case, the −Y side surface of FD bar 46 on measurement table MTB and the +Y side surface of wafer table WTB come into contact or move close together. And by moving both stages WST and MST in the −Y direction while maintaining the scrum condition, liquid immersion area 14 formed under projection unit PU moves to an area above measurement stage MST. For example, FIGS. 14 and 15 show the state after the movement.

When wafer stage WST moves further to the −Y direction and moves off from the effective stroke area (the area in which wafer stage WST moves at the time of exposure and wafer alignment) after the drive of wafer stage WST toward unloading position UP has been started, all the X heads and Y heads, and all the Z heads that constitute encoder 70A to 70D move off from the corresponding scale on wafer table WTB. Therefore, position control of wafer stage WST based on the measurement results of encoders 70A to 70D and the Z heads is no longer possible. Just before this, main controller 20 switches the control to a position control of wafer stage WST based on the measurement results of interferometer system 118. In this case, of the three X interferometers 126, 127, and 128, X interferometer 128 is used.

Then, wafer stage WST releases the scrum state with measurement stage MST, and then moves to unloading position UP as shown in FIG. 14. After the movement, main controller 20 unloads wafer W on wafer table WTB. And then, main controller 20 drives wafer stage WST in the +X direction to loading position LP, and the next wafer W is loaded on wafer table WTB as shown in FIG. 15.

In parallel with these operations, main controller 20 performs Sec-BCHK (a secondary base line check) in which position adjustment of FD bar 46 supported by measurement stage MST in the XY plane and baseline measurement of the four secondary alignment system $AL2_1$ to $AL2_4$ are performed. Sec-BCHK is performed on an interval basis for every wafer exchange. In this case, in order to measure the position (the θz rotation) in the XY plane, Y encoders $70E_2$ and $70F_2$ previously described are used.

Next, as shown in FIG. 16, main controller 20 drives wafer stage WST and positions reference mark FM on measurement plate 30 within a detection field of primary alignment system AL1, and performs the former process of Pri-BCHK (a primary baseline check) in which the reference position is decided for baseline measurement of alignment system AL1, and $AL2_1$ to $AL2_4$.

On this process, as shown in FIG. 16, two Y heads $68_2$ and $67_3$ and one X head $66_1$ (shown circled in the drawing) come to face Y scales $39Y_1$ and $39Y_2$, and X scale $39X_2$, respectively. Then, main controller 20 switches the stage control from a control using interferometer system 118, to a control using encoder system 150 (encoders 70A, 70C, and 70D). Interferometer system 118 is used secondarily again, except in measurement of the θx rotation. Incidentally, of the three X interferometers 126, 127, and 128, X interferometer 127 is used.

Next, while controlling the position of wafer stage WST based on the measurement values of the three encoders described above, main controller 20 begins the movement of wafer stage WST in the +Y direction toward a position where an alignment mark arranged in three first alignment shot areas is detected.

Then, when wafer stage WST reaches the position shown in FIG. 17, main controller 20 stops wafer stage WST. Prior to this operation, main controller 20 activates (turns ON) Z heads 72a to 72d and starts measurement of the Z-position and the tilt (the θy rotation) of wafer stage WST at the point in time when all of or part of Z heads 72a to 72d face(s) wafer table WTB, or before that point in time.

After wafer stage WST is stopped, main controller 20 detects the three alignment marks arranged in the first alignment shot area substantially at the same time and also individually (refer to the star-shaped marks in FIG. 17), using primary alignment system AL1, and secondary alignment systems $AL2_2$ and $AL2_3$, and makes a link between the detection results of the three alignment systems AL1, $AL2_2$, and $AL2_3$ and the measurement values of the three encoders above at the time of the detection, and stores them in memory (not shown).

As in the description above, in the embodiment, the shift to the contact state (or proximity state) between measurement stage MST and wafer stage WST is completed at the position where detection of the alignment marks of the first alignment shot area is performed. And from this position, main controller 20 begins to move both stages WST and MST in the +Y direction (step movement toward the position for detecting the five alignment marks arranged in the second alignment shot area) in the contact state (or proximity state). Prior to starting the movement of both stages WST and MST in the +Y direction, as shown in FIG. 17, main controller 20 begins irradiation of a detection beam from the multipoint AF system (90a, 90b) to wafer table WTB. Accordingly, a detection area of the multipoint AF system is formed on wafer table WTB.

Figure 18:
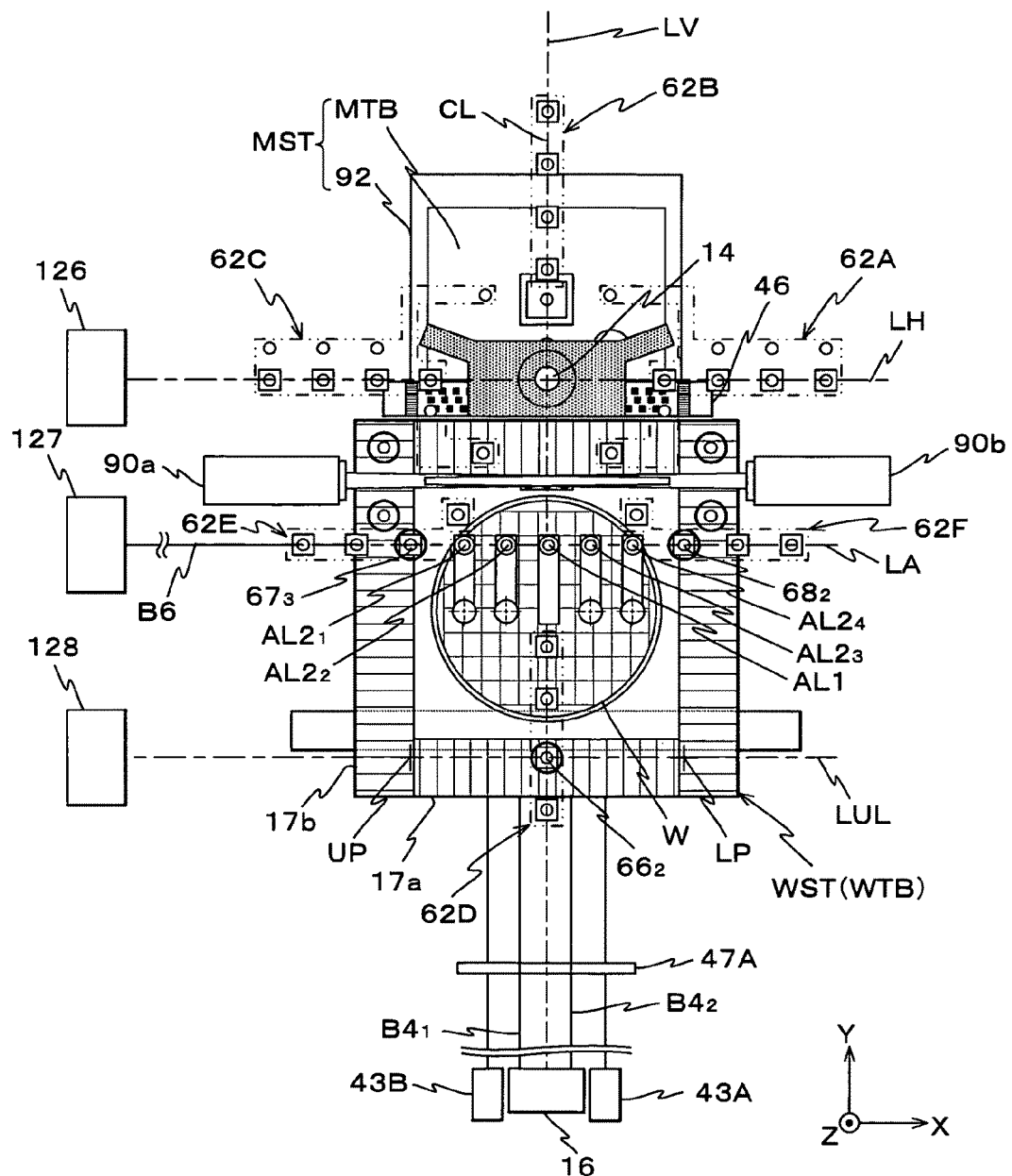
FIG. 18 is a view showing a state of the wafer stage and the measurement stage when the former processing of focus calibration is performed.

Then, when both stages WST and MST reach the position shown in FIG. 18 during the movement of both stages WST and MST in the +Y direction, main controller 20 performs the former process of the focus calibration, and obtains the relation between the measurement values (surface position information on one side and the other side of wafer table WTB in the X-axis direction) of Z heads 72a, 72b, 72c, and 72d, in a state where the center line of wafer table WTB coincides with reference axis LV, and the detection results (surface position information) of the surface of measurement plate 30 by the multipoint AF system (90a, 90b). At this point, liquid immersion area 14 is formed on the upper surface of FD bar 46.

Then, both stages WST and MST move further in the +Y direction while maintaining the contact state (or proximity state), and reach the position shown in FIG. 19. Then, main controller 20 detects the alignment mark arranged in the five second alignment shot areas substantially at the same time as well as individually (refer to the star-shaped marks in FIG. 19), using the five alignment systems AL1, and $AL2_1$ to $AL2_4$, and makes a link between the detection results of the five alignment systems AL1, and $AL2_1$ to $AL2_4$ and the measurement values of the three encoders measuring the position of wafer stage WST in the XY plane at the time of the detection, and then stores them in memory (not shown) (or in memory 34). At this point, main controller 20 controls the position within the XY plane of wafer stage WST based on the measurement values of X head 662 (X linear encoder 70D) that faces X scale $39X_2$ and Y linear encoders $70F_1$ and $70E_1$.

Further, after the simultaneous detection of the alignment marks arranged in the five second alignment shot areas ends, main controller 20 starts again movement in the +Y direction of both stages WST and MST in the contact state (or proximity state), and at the same time, starts the focus mapping previously described using Z heads 72a to 72d and the multipoint AF system (90a, 90b), as is shown in FIG. 19.

Then, when both stages WST and MST reach the position shown in FIG. 20 where measurement plate 30 is located directly below projection optical system PL, main controller 20 performs the latter processing of focus calibration in a state continuing the control of Z position of wafer stage WST (measurement plate 30) that uses the surface position information measured by Z heads 72a to 72d as a reference, without switching the Z head used for position (Z position) control of wafer stage WST in the optical axis direction of projection optical system PL to Z heads $74_i$ and $76_j$.

Then, main controller 20 obtains the offset at the representative detection point of the multipoint AF system (90a, 90b) in the procedure described above, based on the results of the former processing and latter processing of focus calibration described above, and stores the offset in the memory (not shown). And, on reading mapping information obtained from the results of focus mapping at the time of exposure, main controller 20 is to add the offset to the mapping information.

Figure 20:
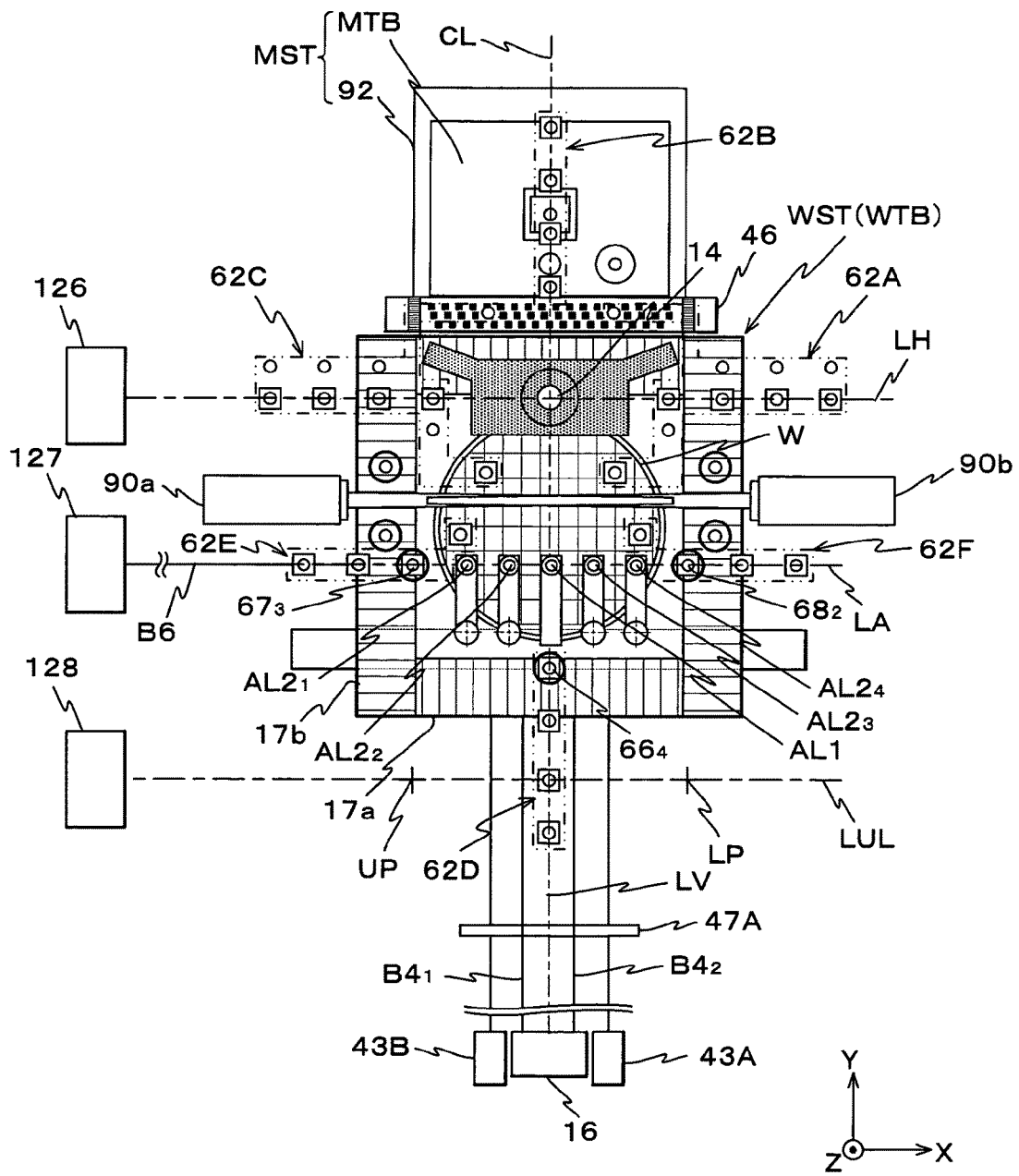
FIG. 20 is a view showing a state of the wafer stage and the measurement stage when at least one of the latter processing of Pri-BCHK and the latter processing of focus calibration is being performed.

Incidentally, in the state of FIG. 20, the focus mapping is being continued.

Figure 21:
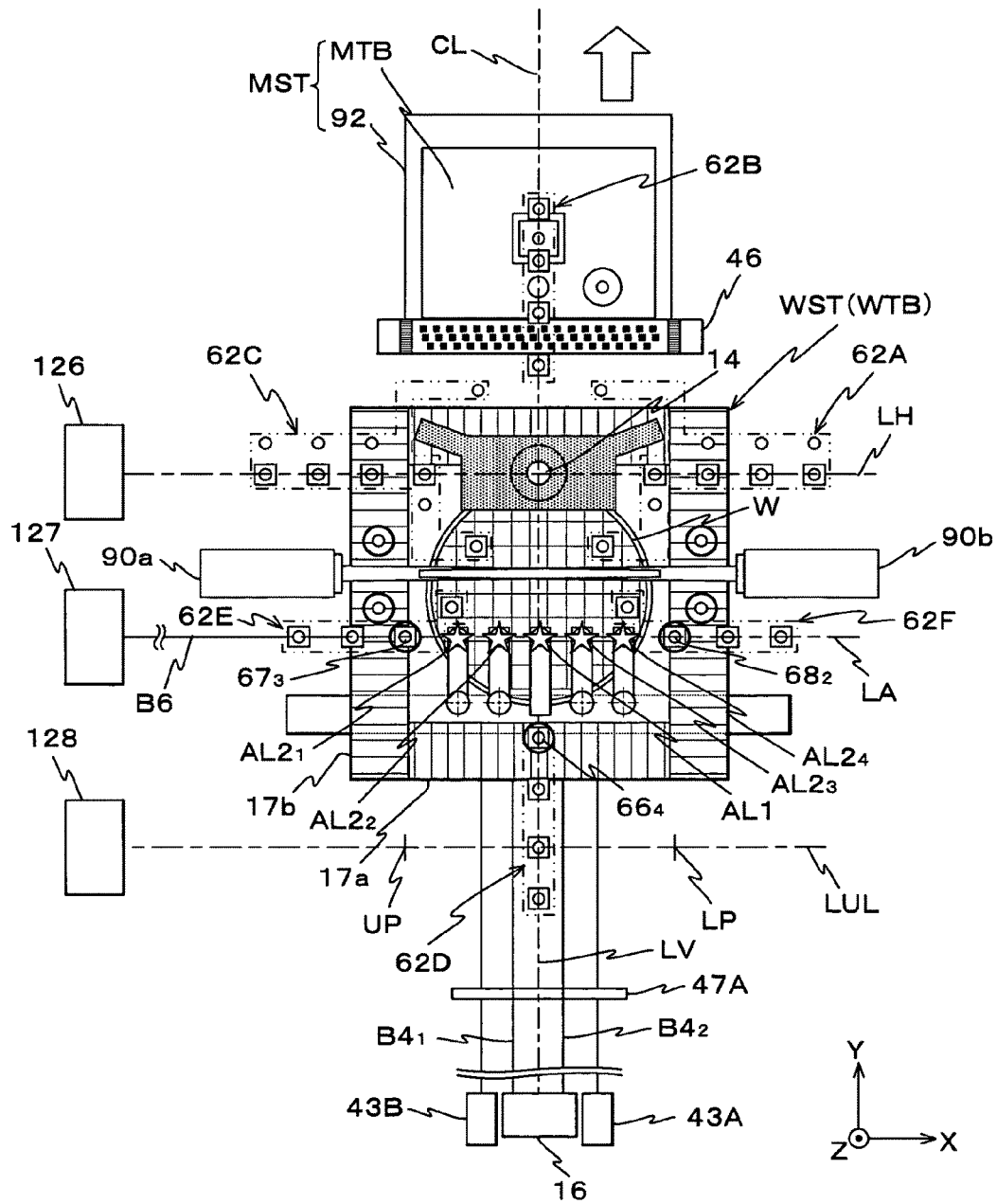
FIG. 21 is a view showing a state of the wafer stage and the measurement stage when alignment marks arranged in five third alignment shot areas are being simultaneously detected using alignment systems AL1 and $AL2_1$ to $AL2_4$.

When wafer stage WST reaches the position shown in FIG. 21 by the movement of both stages WST and MST in the contact state (or, proximity state), to the +Y direction, main controller 20 stops wafer stage WST at the position, and it makes just continue the movement to the +Y direction about measurement stage MST. Then, main controller 20 detects the alignment mark arranged in the five third alignment shot areas substantially at the same time as well as individually (refer to the star-shaped marks in FIG. 21), using the five alignment systems AL1, and $AL2_1$ to $AL2_4$, and makes a link between the detection results of the five alignment systems AL1, and $AL2_1$ to $AL2_4$ and the measurement values of the three encoders at the time of the detection, and then stores them in the memory (not shown). Also at this point in time, the focus mapping is being continued.

Meanwhile, after a predetermined period of time from the suspension of wafer stage WST described above, measurement stage MST and wafer stage WST move from the contact state (or proximity state) into a separation state. After moving into the separation state, main controller 20 stops the movement of measurement stage MST when measurement stage MST reaches an exposure start waiting position where measurement stage MST waits until exposure is started.

Next, main controller 20 starts the movement of wafer stage WST in the +Y direction toward a position where the alignment mark arranged in the three fourth alignment shots are detected. At this point in time, the focus mapping is being continued. Meanwhile, measurement stage MST is waiting at the exposure start waiting position described above.

Figure 22:
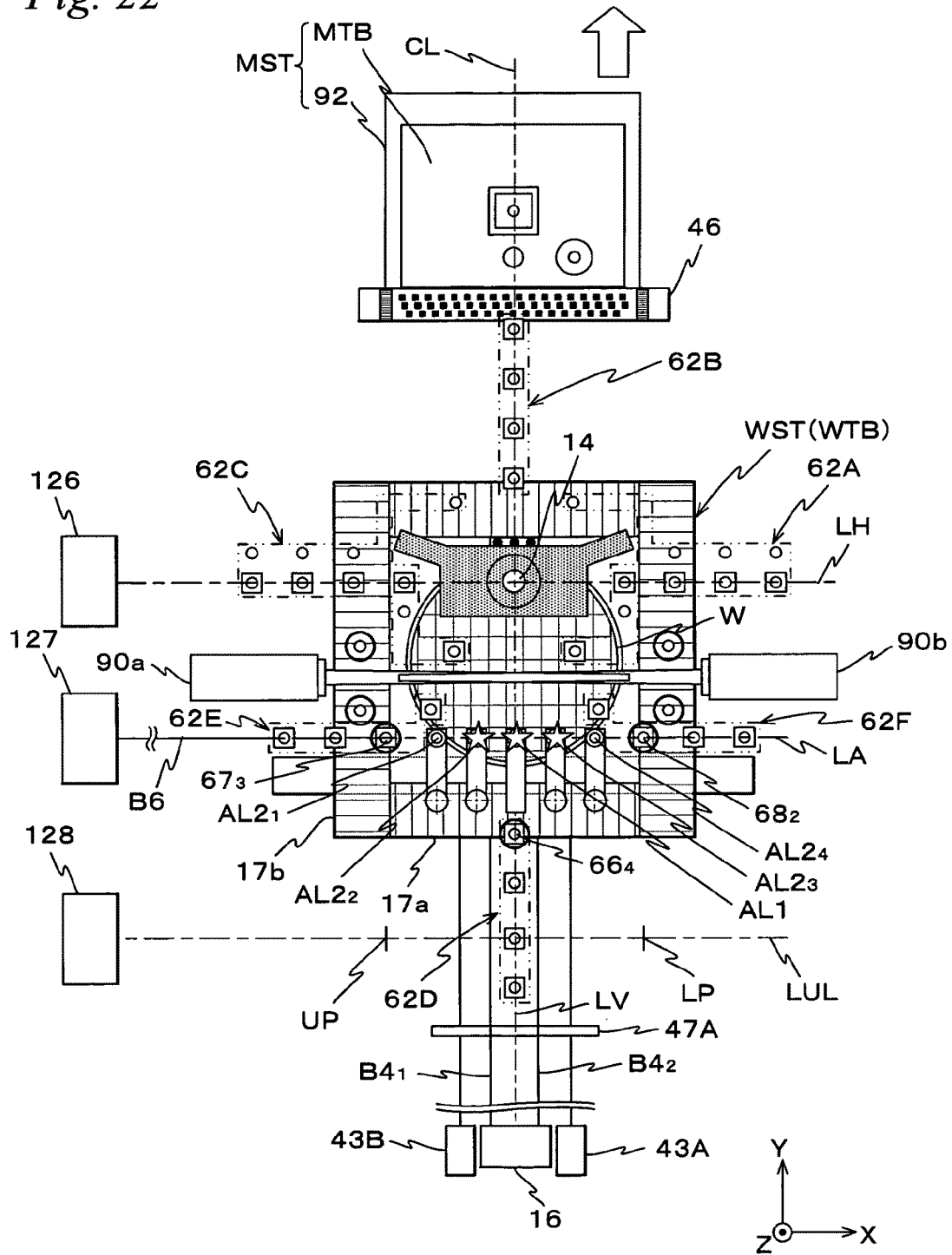
FIG. 22 is a view showing a state of the wafer stage and the measurement stage when alignment marks arranged in three fourth alignment shot areas are being simultaneously detected using alignment systems AL1, $AL2_2$ and $AL2_3$.

Then, when wafer stage WST reaches the position shown in FIG. 22, main controller 20 immediately stops wafer stage WST, and almost simultaneously and individually detects the alignment marks arranged in the three fourth alignment shot areas on wafer W (refer to star-shaped marks in FIG. 22) using primary alignment system AL1 and secondary alignment systems $AL2_2$ and $AL2_3$, links the detection results of three alignment systems AL1, $AL2_2$ and $AL2_3$ and the measurement values of the three encoders out of the four encoders above at the time of the detection, and stores them in memory (not shown). Also at this point in time, the focus mapping is being continued, and measurement stage MST is still waiting at the exposure start waiting position. Then, using the detection results of a total of 16 alignment marks and the measurement values of the corresponding encoders obtained in the manner described above, main controller 20 computes array information (coordinate values) of all the shot areas on wafer W on an alignment coordinate system (an XY coordinate system whose origin is placed at the detection center of primary alignment system AL1) that is set by the measurement axes of encoders 70B, 70D, $70E_1$, and $70F_1$ of encoder system 150, by performing a statistical computation disclosed in, for example, Kokai (Japanese Patent Unexamined Application Publication) No. 61-44429 (and the corresponding U.S. Pat. No. 4,780,617) and the like.

Figure 23:
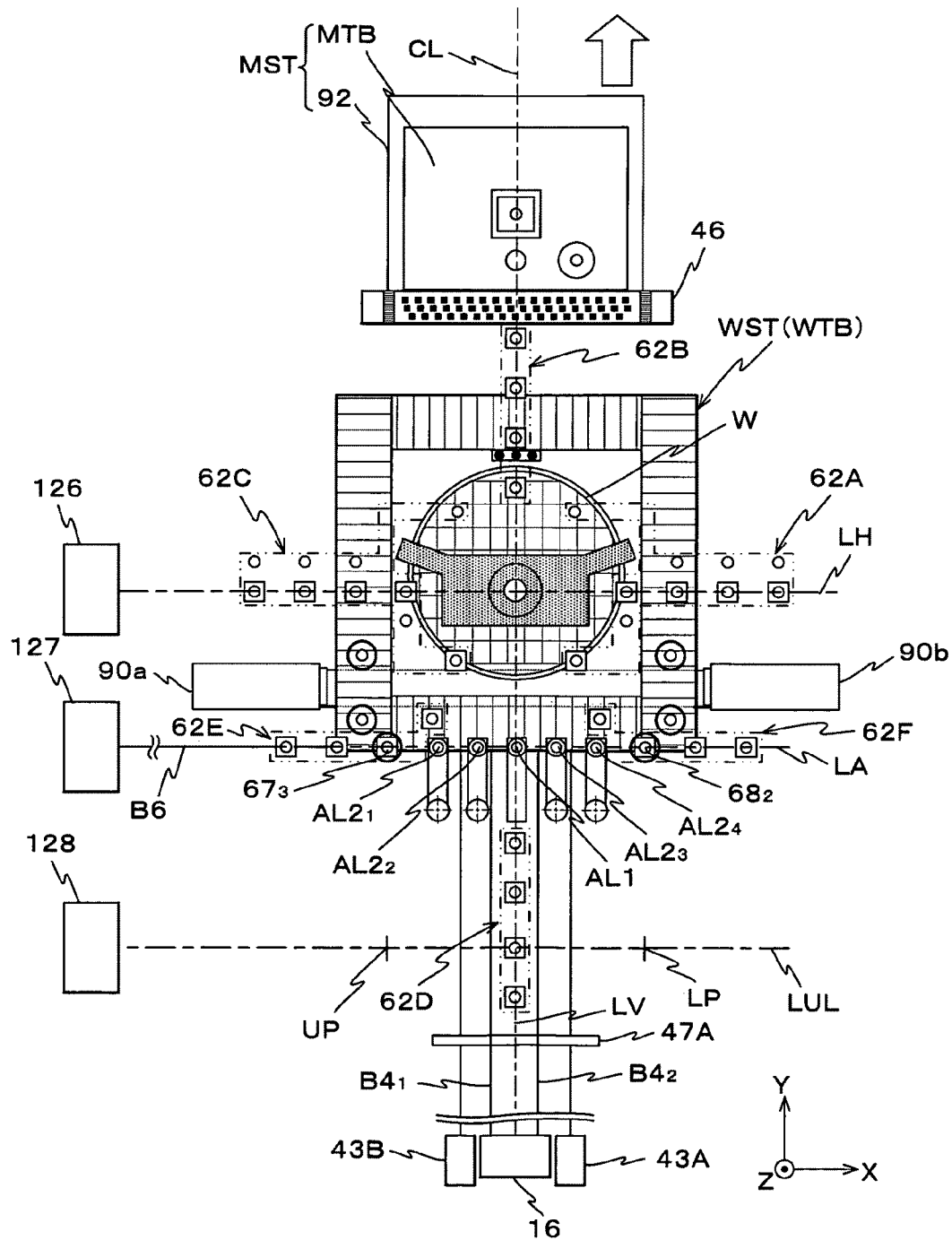
FIG. 23 is a view showing a state of the wafer stage and the measurement stage when the focus mapping has ended.

Next, main controller 20 continues the focus mapping while moving wafer stage WST in the +Y direction again. Then, when the detection beam from the multipoint AF system (90a, 90b) begins to miss the wafer W surface, as is shown in FIG. 23, main controller 20 ends the focus mapping.

After the focus mapping has been completed, main controller 20 moves wafer table WTB (wafer stage WST) to a scanning starting position (acceleration starting position) for exposure of the first shot on wafer W, and during the movement, main controller 20 switches the Z heads used for control of the Z position and the θy rotation of wafer stage WST from Z heads 72a to 72d to Z heads $74_i$ and $74_j$ while maintaining the Z position, the θy rotation, and the θx rotation of wafer stage WST. After this switching, based on the results of the wafer alignment (EGA) previously described and the latest baselines and the like of the five alignment systems AL1 and $AL2_1$ to $AL2_4$, main controller 20 performs exposure by a step-and-scan method in a liquid immersion exposure, and sequentially transfers a reticle pattern to a plurality of shot areas on wafer W. Hereinafter, a similar operation is executed repeatedly.

Next, a computation method of the Z position and the amount of tilt of wafer stage WST using the measurement results of the Z heads will be described. Main controller 20 uses the four Z heads 70a to 70d that constitute surface position measurement system 180 (refer to FIG. 6) at the time of focus calibration and focus mapping, and measures height Z and tilt (rolling) θy of wafer table WTB. Further, main controller 20 uses two Z heads 74$_i$ and 76$_j$ (i and j are one of 1 to 5) at the time of exposure, and measures height Z and tilt (rolling) θy of wafer table WTB. Incidentally, each Z head irradiates a probe beam on the upper surface (a surface of a reflection grating formed on the upper surface) of the corresponding Y scales 39Y$_1$ or 39Y$_2$, and measures the surface position of each scale (reflection grating) by receiving the reflected light.

Figure 24A:
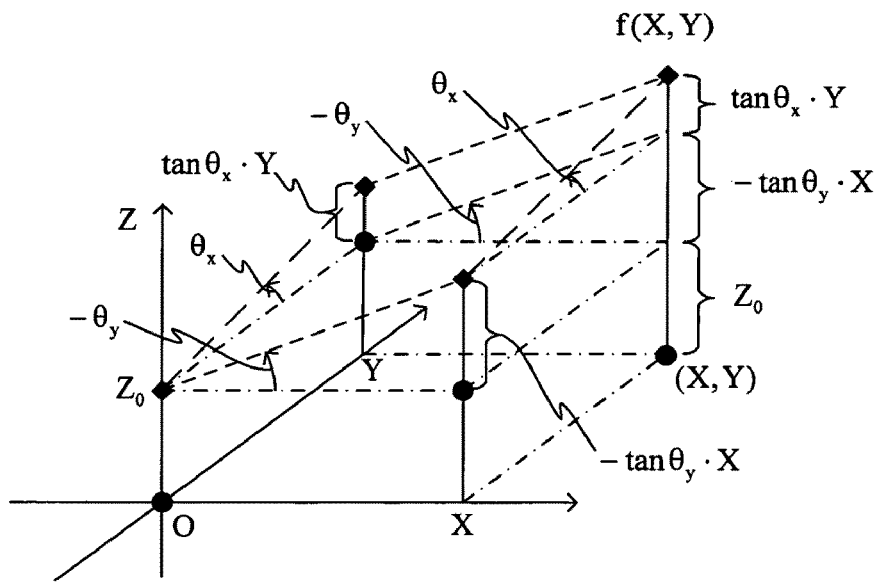
FIGS. 24A and 24B are views for explaining a computation method of the Z position and the amount of tilt of the wafer stage using the measurement results of the Z heads.

FIG. 24A shows a two-dimensional plane having height $Z_0$, rotation angle (an angle of inclination) around the X-axis θx, and rotation angle (an angle of inclination) around the Y-axis θy at a reference point O. Height Z at position (X, Y) of this plane is given by a function according to the next formula (8).

$$f(X,Y) = -\tan\theta y \cdot X + \tan\theta x \cdot Y + Z_0 \quad (8)$$

Figure 24B:
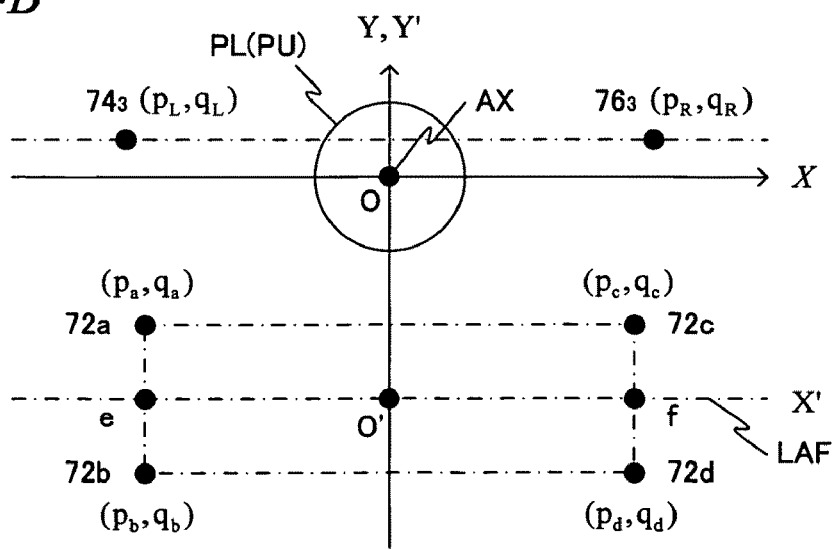

As shown in FIG. 24B, at the time of the exposure, height Z from a movement reference surface (a surface that is substantially parallel to the XY plane) of wafer table WTB and rolling θy are measured at an intersection point (reference point) O of a movement reference surface of wafer table WTB and optical axis AX of projection optical system PL, using two Z heads 74$_i$ and 76$_j$ (i and j are one of 1 to 5). In this case, Z heads 74$_3$ and 76$_3$ are used as an example. Similar to the example shown in FIG. 24A, the height of wafer table WTB at reference point O will be expressed as $Z_0$, the tilt (pitching) around the X-axis will be expressed as θx, and the tilt (rolling) around the Y-axis will be expressed as θy. In this case, measurement values $Z_L$ and $Z_R$ of the surface position of (reflection gratings formed on) Y scales 39Y$_1$ and 39Y$_2$ indicated by Z head 74$_3$, which is located at coordinate ($p_L$, $q_L$), and Z head 76$_3$, which is located at coordinate ($p_R$, $q_R$), in the XY plane, respectively, follow theoretical formulas (9) and (10), similar to formula (8).

$$Z_L = -\tan\theta y \cdot p_L + \tan\theta x \cdot q_L + Z_0 \quad (9)$$

$$Z_R = -\tan\theta y \cdot p_R + \tan\theta x \cdot q_R + Z_0 \quad (10)$$

Accordingly, from theoretical formulas (9) and (10), height $Z_0$ and rolling θy of wafer table WTB at reference point O can be expressed as in the following formulas (II) and (12), using measurement values $Z_L$ and $Z_R$ of Z heads 74$_3$ and 76$_3$.

$$Z_0 = \{Z_L + Z_R - \tan\theta x \cdot (q_L + q_R)\}/2 \quad (11)$$

$$\tan\theta y = \{Z_L - Z_R - \tan\theta x \cdot (q_L - q_R)\}/(p_R - p_L) \quad (12)$$

Incidentally, in the case of using other combinations of Z heads as well, by using theoretical formulas (II) and (12), height ZO and rolling θy of wafer table WTB at reference point O can be computed. However, pitching θx uses the measurement results of another sensor system (in the embodiment, interferometer system 118).

As shown in FIG. 24B, at the time of focus calibration and focus mapping, height Z and rolling θy of wafer table WTB at a center point O' of a plurality of detection points of the multipoint AF system (90a, 90b) are measured, using four Z heads 72a to 72d. Z heads 72a to 72d, in this case, are respectively placed at position (X, Y)=($p_a$, $q_a$), ($p_b$, $q_b$), ($p_c$, $q_c$), ($p_d$, $q_d$). As shown in FIG. 24B, these positions are set symmetric to center point O'=(Ox', Oy'), or more specifically, $p_a = p_b$, $p_c = p_d$, $q_a = q_c$, $q_b = q_d$, and also $(p_a + p_c)/2 = (p_b + p_d)/2 = Ox'$, $(q_a + q_b)/2 = (q_c + q_d)/2 = Oy'$.

From average $(Za + Zb)/2$ of measurement values Za and Zb of Z head 72a and 72b, height Ze of wafer table WTB at a point e of position ($p_a = p_b$, Oy') can be obtained, and from average $(Zc + Zd)/2$ of the measurement values Zc and Zd of Z heads 70c and 70d, height Zf of wafer table WTB at a point f of position ($p_c = p_d$, Oy') can be obtained. In this case, when the height of wafer table WTB at center point O' is expressed as $Z_0$, and the tilt (rolling) around the Y-axis is expressed as θy, then, Ze and Zf follow theoretical formulas (13) and (14), respectively.

$$Ze\{=(Za+Zb)/2\} = -\tan\theta y \cdot (p_a + p_b - 2Ox')/2 + Z_0 \quad (13)$$

$$Zf\{=(Zc+Zd)/2\} = -\tan\theta y \cdot (p_c + p_d - 2Ox')/2 + Z_0 \quad (14)$$

Accordingly, from theoretical formulas (13) and (14), height $Z_0$ of wafer table WTB and rolling θy at center point O' can be expressed as in the following formulas (15) and (16), using measurement values Za to Zd of Z heads 70a to 70d.

$$Z_0 = (Ze + Zf)/2 \quad (15)$$
$$= (Za + Zb + Zc + Zd)/4$$

$$\tan\theta y = -2(Ze - Zf)/(p_a + p_b - p_c - p_d) \quad (16)$$
$$= -(Za + Zb - Zc - Zd)/(p_a + p_b - p_c - p_d)$$

However, pitching θx uses the measurement results of another sensor system (in the embodiment, interferometer system 118).

As shown in FIG. 16, immediately after switching from servo control of wafer stage WST by interferometer system 118 to servo control by encoder system 150 (encoders 70A to 70F) and surface position measurement system 180 (Z head systems 72a to 72d, 74$_1$ to 74$_5$, and 76$_1$ to 76$_5$), because only two heads, Z heads 72b and 72d, face the corresponding Y scales 39Y$_1$ and 39Y$_2$, the Z and θy positions of wafer table WTB at center point O' cannot be computed using formulas (15) and (16). In such a case, the following formulas (17) and (18) are applied.

$$Z_0 = \{Z_b + Z_d - \tan\theta x \cdot (q_b + q_d - 2Oy')\}/2 \quad (17)$$

$$\tan\theta y = \{Z_b - Z_d - \tan\theta x \cdot (q_b - q_d)\}/(p_d - p_b) \quad (18)$$

Then, when wafer stage WST has moved in the +Z direction, and accompanying this move, after Z heads 72a and 72c have faced the corresponding Y scales 39Y$_1$ and 39Y$_2$, formulas (15) and (16) above are applied.

As previously described, scanning exposure to wafer W is performed, after finely driving wafer stage WST in the Z-axis direction and tilt direction according to the unevenness of the surface of wafer W, and having adjusted the surface position of wafer W and the tilt (focus leveling) so that the exposure area IA portion on the surface of wafer W matches within the range of the depth of focus of the image plane of projection optical system PL. Therefore, prior to the scanning exposure, focus mapping to measure the unevenness (a focus map) of the surface of wafer W is performed. In this case, as shown in FIG. 10, the unevenness of the surface of wafer W is measured at a predetermined sampling interval (in other words, a Y interval) while moving wafer stage WST in the +Y direction, using the multipoint AF system (90a, 90b) with the surface position of wafer table WTB (or to be more precise, the corresponding Y scales 39Y$_1$ and 39Y$_2$) measured using Z heads 72a to 72d serving as a reference.

To be specific, as shown in FIG. 24B, surface position Ze of wafer table WTB at point e can be obtained from the average of surface positions Za and Zb of Y scale $39Y_2$, which is measured using Z heads $72a$ and $72b$, and surface position Zf of wafer table WTB at point f can be obtained from the average of surface positions Zc and Zd of Y scale $39Y_1$, which is measured using Z heads $72c$ and $72d$. In this case, the plurality of detection points of the multipoint AF system and center O' of these points are located on a straight line ef parallel to the X-axis and connecting point e and point f. Therefore, as shown in FIG. 10C, by using a straight line expressed in the following formula (19) connecting surface position Ze at point e (P1 in FIG. 10C) of wafer table WTB and surface position Zf at point f (P2 in FIG. 10C) as a reference, surface position $Z_{0k}$ of the surface of wafer W at detection point $X_k$ is measured, using the multipoint AF system ($90a$, $90b$).

$$Z(X) = -\tan\theta y \cdot X + Z_0 \quad (19)$$

However, $Z_0$ and $\tan\theta y$ can be obtained from formulas (17) and (18) above, using measurement results Za to Zd of Z heads $72a$ to $72d$. From the results of surface position $Z_{0k}$ that has been obtained, unevenness data (focus map) $Z_k$ of the surface of wafer W can be obtained as in the following formula (20).

$$Zk = Z_{0k} - Z(X_k) \quad (20)$$

At the time of exposure, by finely driving wafer stage WST in the Z-axis direction and the tilt direction according to focus map $Z_k$ obtained in the manner described above, focus is adjusted for each shot area, as is previously described. At the time of the exposure here, the surface position of wafer table WTB (or to be more precise, the corresponding Y scales $39Y_2$ and $39Y_1$) is measured, using Z heads $74_i$ and $76_j$ (i, j=1-5). Therefore, reference line Z(X) of focus map $Z_k$ is set again. However, $Z_0$ and $\tan\theta y$ can be obtained from formulas (II) and (12) above, using the measurement results $Z_L$ and $Z_R$ of Z heads $74_i$ and $76_j$ (i, j=1-5). From the procedure described so far, the surface position of the surface of wafer W is converted to $Z_k + Z(X_k)$.

The position coordinate of wafer table WTB (wafer stage WST) is controlled, for example, at a time interval of 96 μsec. At each control sampling interval, main controller 20 updates the current position of wafer stage WST, computes thrust command values and the like to position the stage to a target position, and outputs the values. As previously described, the current position of wafer stage WST is computed from the measurement results of interferometer system 118, encoder system 150 (encoders 70A to 70F), and surface position measurement system 180 (Z heads $72a$ to $72d$, $74_1$ to $74_5$, and $76_1$ to $76_5$). Accordingly, main controller 20 monitors the measurement results of the interferometer, the encoder, and the Z heads at a time interval (measurement sampling interval) much shorter than the control sampling interval.

Therefore, in the embodiment, main controller 20 constantly continues to receive the measurement values from all the Z heads (not always two) that face the scanning area of the scales (the area where probe beams from the Z heads are scanned), while wafer stage WST is within the effective stroke range. And, main controller 20 performs the switching operation (a linkage operation between a plurality of Z head) of the Z heads described above in synchronization with position control of wafer stage WST which is performed at each control sampling interval. In such an arrangement, an electrically high-speed switching operation of the Z heads will not be required, which also means that costly hardware to realize such a high-speed switching operation does not necessarily have to be arranged.

FIG. 25 conceptually shows the timing of position control of wafer stage WST, the uptake of the measurement values of the Z head, and the switching of the Z head in the embodiment. Reference code CSCK in FIG. 25 indicates the generation timing of a sampling clock (a control clock) of the position control of wafer stage WST, and reference code MSCK indicates a generation timing of a sampling clock (a measurement clock) of the measurement of the Z head (and interferometer and encoder). Further, reference code CH typically shows the linkage process in the switching of the Z head.

Main controller 20 executes the switching procedure of the Z heads by dividing the operation into two stages; the restoration and the switching process (and the linkage process) of the Z heads. When describing the switching according to an example shown in FIG. 25, first of all, the Z heads which are operating at the time of the first control clock are to be of a first combination, ZsL and ZsR. Main controller 20 monitors the measurement value of these Z heads, and computes the position coordinate (Z, θy) of wafer stage WST. Next, main controller 20 obtains all of the Z heads on the scanning area of the Y scale and in its vicinity from the position coordinate of wafer stage WST, specifies Z head ZsR' which needs restoration from the Z heads, and restores the encoder at the time of the second control clock. In this case, Z head ZsR' which has been restored is in the waiting state (scale servo state) previously described, and is switched to the operating state (focus servo state) by main controller 20, after it has been confirmed that Z head ZsR' has faced the scanning area of the Y scale. At this point of time, the operating Z heads become three, which are, ZsL, ZsR and ZsR'. And, from the operating Z heads, main controller 20 specifies the Z head whose measurement values are to be monitored to compute the position coordinate of wafer stage WST at the time of the next control clock, according to the position coordinate of wafer stage WST. Assume that a second combination ZsL and ZsR' are specified here. Main controller 20 confirms whether this specified combination matches the combination that was used to compute the position coordinate of wafer stage WST at the time of the previous control clock. In this example, Z head ZsR in the first combination and Z head ZsR' in the second combination are different. Therefore, main controller 20 executes a linkage process CH to the second combination at the time of the third control clock. Hereinafter, main controller 20 monitors the measurement values of the second combination ZsL and ZsR', and computes the position coordinate (Z, θy) of wafer stage WST. As a matter of course, the switching process and linkage process CH are not performed if there is no change in the combination. Z head ZsR which is removed from the monitoring subject, is switched to a waiting state at the time of the fourth control clock when Z head ZsR moves off from the scanning area on the Y scale.

Incidentally, so far, in order to describe the principle of the switching method of the Z heads to be used in position control of wafer stage WST in the embodiment, four Z heads ZsL, ZsL', ZsR, and ZsR' were taken up, however, ZsL and ZsL' representatively show any of Z heads $74_i$ (i=1 to 5), $72a$, and $72b$, and ZsR and ZsR' representatively show any of Z heads $76_j$ (j=1 to 5), $72c$, and $72d$. Accordingly, similar to the switching between Z heads $74_i$ (i=1 to 5) and $76_j$ (j=1 to 5), the switching and linkage process described above can be applied to the switching between Z heads $72a$ to $72d$, and the switching between Z heads $72a$ to $72d$ and Z heads $74_i$ (i=1 to 5) and $76_j$ (j=1 to 5).

By at least a part of the measurement beam being intercepted (this makes detection of a foreign material possible, therefore, in the description below, it will also be expressed as detecting a foreign material) by a foreign material adhered on the scale surface and the like, abnormality may occur in the measurement results of the encoder (X heads and Y heads) and the Z heads. In this case, the measurement beam of the encoder has an expanse of, for example, 2 mm in the measurement direction and 50 μm in the grid line direction on the scale surface. The probe beam of the Z head is condensed to several μm on the diffraction grating surface serving as a reflection surface, however, on the scale surface, the probe beam widens to an extent of sub millimeters according to the numerical aperture at the scale surface (the cover glass surface). Accordingly, even a small foreign material can be detected. Furthermore, in a practical point of view, it is extremely difficult to completely prevent foreign materials from entering the device and from adhering on the scale surface for over a long period. Further, a situation can be considered where the encoder or the Z head fails to work properly, and the encoder output is cut off. Therefore, when abnormality occurs in the measurement results of the encoder and/or the Z head, a backup operation such as to switch the measurement from the measurement by the encoder and/or the Z head in which abnormality has occurred to a measurement by interferometer system 118, or to correct the measurement results of the encoder and/or the Z head in which abnormality has occurred using the measurement results of interferometer system 118 becomes necessary.

In the case of exposure apparatus 100 in the embodiment, water droplets may remain on the scale surface. For example, the liquid immersion area frequently passes over scale $39X_1$ of wafer stage WST which is adjacent to measurement stage MST when wafer stage WST and measurement stage MST form a scrum. Further, as for the other scales as well, at the time of edge shot exposure, the liquid immersion area enters a part of an area on the scale. Accordingly, the water droplets that cannot be recovered and are left on the scale may be a source which generates abnormality in the measurement results of the encoder and/or the Z head. In this case, when the encoder and/or the Z head detect water droplets, the beam is blocked by the water droplets which reduces the beam intensity, and furthermore, the output signals are cut off (however, the output of the measurement section of the Z head is different from the output of focus sensor FS, and is not cut off due to the presence of water droplets). Further, because materials of a different refractive index are detected, linearity of the measurement results with respect to the displacement of wafer stage WST (wafer table WTB) deteriorates. The reliability of the measurement results should be inspected, on the basis of such various influences.

The abnormality of the measurement results of the encoder or the Z head can be determined from sudden temporal change of the measurement results, or from deviation or the like of the measurement results from the measurement results of a different sensor system. First of all, in the former case, when the position coordinates of wafer stage WST obtained at every measurement sampling interval using the encoders or the Z heads change so much from the position coordinates obtained at the time of the previous sampling that it cannot be possible when taking into consideration the actual drive speed of the stage, main controller 20 decides that abnormality has occurred. In the latter case, the individual measurement values of the encoders or the Z heads are predicted from the current position of wafer stage WST, and when the deviation of the predicted measurement values from the actual measurement values exceeds a permissible level which is decided in advance, main controller 20 decides that abnormality has occurred. Further, in the embodiment, position measurement using interferometer system 118 is performed in the whole stroke area, independently from the position measurement of wafer stage WST using the encoder or the Z head. Therefore, main controller 20 decides that abnormality has occurred in the case the deviation of the position coordinates of wafer stage WST obtained using the measurement results of the encoder or the Z head from the position coordinates of wafer stage WST obtained using the measurement results of interferometer system 118 exceeds a permissible level which is decided in advance.

By the Z head detecting, for example, a foreign material adhered on the scale surface, abnormal measurement results can be output. However, in such a case, by the movement of wafer stage WST, the output of the Z head promptly returns to the normal output. Next, a response to such a temporary abnormality output will be described.

First of all, main controller 20 predicts the measurement value of the Z head, that is, the surface position of the corresponding Y scale (measurement surface), from theoretical formulas (9) and (10) using the current position $(Z, \theta x, \theta y)$ of wafer stage WST. By obtaining the difference between the predicted measurement value and the actual measurement value of the Z head, and furthermore, taking the average (or to be more precise, a movement average covering a predetermined number of control clocks) regarding a predetermined time, main controller 20 obtains offset $\theta z$. This offset $\theta z$ is set to all the Z heads, and is used as an index to inspect the measurement results of the individual Z heads.

Now, a case will be considered where a Z head ZS detects a foreign material DW, which is adhered on a moving measurement target surface $S_0$, as shown in FIGS. 26A to 26H. First of all, as shown in FIG. 26A, Z head ZS is to be in an operating state, or more specifically, in a focus servo state where the surface position of measurement target surface $S_0$ is followed. As previously described, the reflected light of probe beam LB is received by tetrameric light receiving element ZD which constitutes focus sensor FS. In the operating state, as shown in FIG. 26B, sensor main section ZH including focus sensor FS follows the surface position of measurement target surface $S_0$ so that the sectional shape of the reflected light of probe beam LB is in the form of a circle on the detection surface of tetrameric light receiving element ZD, or more specifically, so that focus error I of focus sensor FS expressed in formula (7) becomes zero (I=0). At this point in time, measurement section ZE outputs reading value $E_0$ corresponding to the surface position of measurement target surface $S_0$ as a measured value of Z head ZS.

Next, measurement target surface $S_0$ moves in the –Y direction from the position shown in FIG. 26A, and assume that Z head ZS detects foreign material DW adhering on the surface, as shown in FIG. 26C. In this case, for the sake of simply, assume that probe beam LB is completely reflected on the surface of foreign material DW, and the principal ray of the reflected light matches the principal ray of probe beam LB. At this point, sensor main section ZH follows the actual reflection surface, or more specifically, follows surface S of foreign material DW so as to reproduce output I=0 of focus sensor FS, or more specifically, so that the sectional shape of the reflected light on detection surface ZD is in the form of a circle, as shown in FIG. 26D. Accordingly, measurement section ZE of Z head ZS outputs reading value E corresponding to the surface position of surface S of foreign material DW as the measured value of Z head ZS.

Measured value E of Z head ZS at this point diverges greatly from the predicted measurement value of Z head ZS corresponding to the predicted surface position of measurement target surface $S_O$, or more specifically, from $E_0$. Therefore, offset Oz also becomes a large value. So, main controller 20 sets a threshold value for offset Oz, and when offset Oz exceeds the threshold value, main controller 20 decides that abnormality has occurred in the measurement results of Z head ZS and switches Z head ZS from the operating state (focus servo state) to the waiting state (scale servo state). Main controller 20 then stops updating offset Oz, after switching to the waiting state.

In the waiting state, sensor main section ZH is driven by the drive section (not shown) so that the focal point of probe beam LB follows the predicted surface position of measurement target surface $S_0$, or more specifically, so that measurement section ZE outputs reading value $E_0$ corresponding to the predicted surface position of measurement target surface $S_O$. At this point, the focal point of probe beam LB matches the predicted surface position of measurement target surface $S_0$, and not surface S of foreign material DW which is the actual reflection surface. Therefore, the cross section of the reflected light on detection surface ZD becomes a non-circular shape, as shown in FIG. 26F. At this point, focus error I as expressed in formula (7) of the focus sensor FS is no longer zero, ($I \neq 0$).

After switching to the waiting state, output I (formula (7)) of focus sensor FS is monitored. In the waiting state, because the focal point of probe beam LB deviates from the actual reflection surface (surface S of foreign material DW) as described above, the output becomes $I \neq 0$. In this case, if the focal point of probe beam LB returns to the actual reflection surface, or if the actual reflection surface is displaced and the surface position matches with the focal point of probe beam LB, output I also returns to zero. Accordingly, if output I returns to zero in the waiting state where the focal point of probe beam LB follows the predicted surface position of measurement target surface S0, this indicates that the surface position of the actual reflection surface has matched with the predicted surface position of measurement target surface $S_0$. Accordingly, it can be decided that the influence due to detecting foreign material DW has been resolved.

Therefore, when it has been confirmed that the cross section of the reflected light on detection surface ZD has returned to a circular shape as shown in FIG. 26H and output I of focus sensor FS has returned to zero or to approximately zero, main controller 20 switches Z head ZS from the waiting state (scale servo state) to the operating state (focus servo state) as shown in FIG. 26G. Main controller 20 then begins to update offset Oz again, after performing the switching to the operating state.

Incidentally, surface position information of measurement target surface $S_0$ cannot be taken out from Z head ZS in the waiting state. Therefore, main controller 20 predicts the measurement value of Z head ZS in the waiting state from the measurement results of interferometer system 118, and by substituting the predicted value, computes the position (Z, θy) of wafer stage WST.

By the handling so that the individual Z heads in which the abnormality described above is generated are made to wait, it becomes possible to perform drive control of wafer stage WST without switching all the Z heads (surface position measurement system 180) to a different sensor system. Incidentally, the threshold value with respect to offset θz described above should be appropriately changed depending on the state of exposure apparatus 100, such as, for example, at the time of start up, reset, and exposure. Further, as in the method which will be described below, the entire Z heads (surface position measurement system 180) can be switched to another sensor system.

When abnormality is detected in the measuring instrument system, such as the output signal of Z heads 72a to 72d, $74_1$ to $74_5$, and $76_1$ to $76_5$ (refer to FIG. 6) of surface position measurement system 180 being cut off, main controller 20 immediately performs a backup operation so as to switch to a position (Z, θy) servo control of wafer stage WST by interferometer system 118 (refer to FIG. 6) in order to prevent the servo control of the position (Z, θy) of wafer stage WST (wafer table WTB) from stopping. More specifically, main controller 20 switches the measuring instrument system used to compute the position coordinates of wafer stage WST (wafer table WTB) from surface position measurement system 180 (Z heads 72a to 72d, $74_1$ to $74_5$, and $76_1$ to $76_5$) to interferometer system 118. On this operation, a linkage process is performed so that the position coordinates of wafer stage WST that have been computed are successive.

Figure 27:
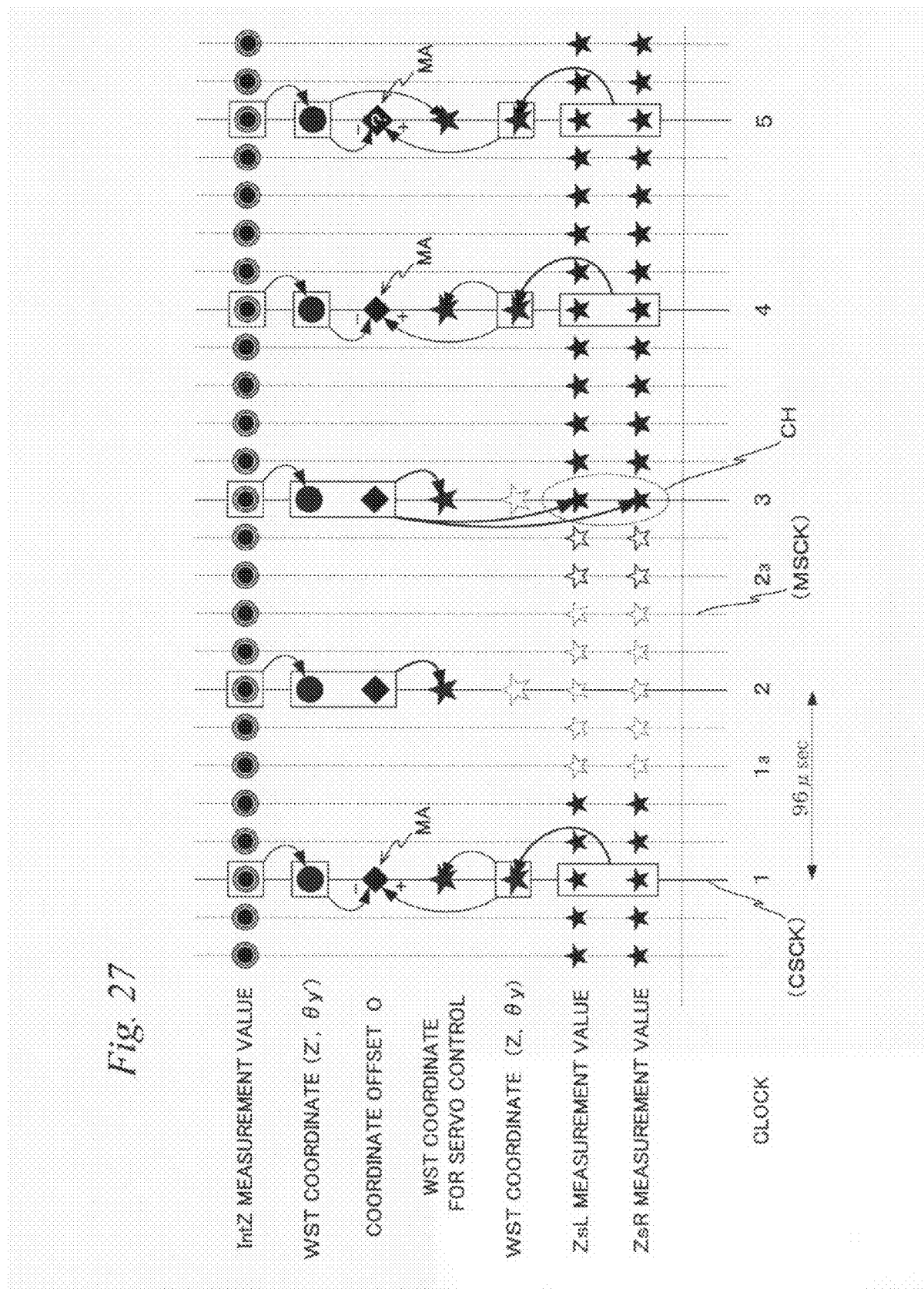
FIG. 27 is a view showing an outline of a linkage process in a switching to servo drive control of the wafer stage from the surface position measurement system to the interferometer system, and the interferometer system to the surface position measurement system.

FIG. 27 is a view showing an outline of a linkage process in a switching (and a reversed switching) from servo control of the position (Z, θy) of wafer stage WST by surface position measurement system 180 to servo control of the position (Z, θy) of wafer stage WST by interferometer system 118.

First of all, main controller 20 performs pre-processing for linkage process with respect to each control clock (CSCK). In this case, at the time of the first measurement clock (MSCK) and the like shown in FIG. 27 indicated by a solid black figure, the output signals of both the surface position measurement system 180 and interferometer system 118 are constantly monitored. However, in actual practice, the measurement clock of interferometer system 118 occurs more frequently than the measurement clock of surface position measurement system 180, however, in this case, in order to avoid complication, only the measurement clock which occurs simultaneously is shown. At the time of control clock generation, main controller 20 computes the position coordinate (Z, θy) of wafer stage WST from the measurement result of Z heads (ZsL, ZsR) (hereinafter described as surface position measurement system (ZsL, ZsR)) of surface position measurement system 180 as in FIG. 27 at the time of the first control clock generation, and also computes the position coordinate (Z', θy') of wafer stage WST from the measurement results of the interferometer system (IntZ) corresponding to the Z interferometer of interferometer system 118. Then, main controller 20 obtains the difference of the two position coordinates (Z, θy) and (Z', θy'), and takes a moving average $MA_K$ (Z, θY)−(Z', θY') for a predetermined clock number K, and keeps it as a coordinate offset O. However, in FIG. 27, the calculation of the differential moving average is indicated by reference code MA.

As previously described, this coordinate offset O can be used also as an index to determine the abnormality generation in the measurement results of the surface position measurement system (ZsL, ZsR). If an absolute value of coordinate offset O is equal to or under a permissible value decided beforehand, main controller 20 will decide that no abnormality has occurred, and if the absolute value exceeds the permissible value, then main controller 20 will decide that abnormality has occurred. At the time of the first control clock in FIG. 27, main controller 20 decides that no abnormality has occurred, therefore, uses the position coordinate (Z, θy) of wafer stage WST computed from the measurement results of the surface position measurement system (ZsL, ZsR) as the position coordinate used for the servo control of wafer stage WST.

On detecting the abnormality of the output signals of the surface position measurement system (ZsL, ZsR), main controller 20 promptly performs the linkage process to the interferometer system. In this case, assume that at the time of the 13 clock in FIG. 27, abnormality occurs in the output signals of the Z head system (ZsL, ZsR), such as for example, the output signals being cut off. In FIG. 27, the state where the output signals are cut off is shown by an outlined figure. Incidentally, because scale servo previously described is possible with the Z heads of the embodiment, the output signals actually are rarely cut off, however, in this case, to simplify the description, a case is illustrated where the output signals are cut off.

Then, main controller 20 adds the coordinate offset O kept in the first control clock just before to the position coordinate (Z', θy') of wafer stage WST computed from the measurement results of the interferometer system at the time of the second control clock, so that the position coordinate coincides with the position coordinate (Z, θy) of wafer stage WST computed from the measurement results of the surface position measurement system (ZsL, ZsR) at the time of control clock (in this case, at the time of the first control clock) just before. Then, until the recovery of the output signals is detected, main controller 20 performs the servo control of the position (Z, θy) of wafer stage WST, using the position coordinate {(Z', θy')+O} to which this offset cancellation has been performed.

Incidentally, in FIG. 27, the output signals of two Z heads ZsL and ZsR were cut off at the time of the 13 clock. As well as the two output signals, even in the case when one of the output signals is cut off, when the output signals supplied becomes one or less, the position coordinate of wafer stage WST cannot be computed using the theoretical formulas (11) and (12), therefore, main controller 20 performs a similar switching of the servo control of the position (Z, θy) of stage WST.

And, on detecting the recovery of the output signals of the surface position measurement system (ZsL, ZsR), main controller 20 promptly performs a reverse linkage process from interferometer system 118 to the surface position measurement system (ZsL, ZsR). In this case, assume that the output signals of Z heads ZsL and ZsR are restored at the time of the 23 clock in FIG. 27. At the time of the third control clock after having detected the recovery, main controller 20 substitutes the position coordinate {(Z', θy')+O} supplied from the interferometer system to which offset cancellation has been applied into theoretical formulas (9) and (10) and computes the measurement values that each of the Z heads ZsL and ZsR are to show, and performs initialization. However, in FIG. 27, this process is shown by reference code CH. From the next fourth control clock onward, similar to the time of the first clock, main controller 20 performs the usual servo control by the surface position measurement system (ZsL, ZsR). At the same time, main controller 20 begins to update coordinate offset O again.

As a matter of course, not only in the case when the output signals from the Z heads are cut off as described above, main controller 20 performs a similar switching of the servo control of the position (Z, θy) of wafer stage WST also in the case when the reliability of the output signals is low. In this case, main controller 20 secures the reliability of the output signals by using coordinate offset O previously described as an index. At the time of the fifth control clock in FIG. 27, main controller 20 judges that the reliability has become less than a permissible level, and the position coordinate (Z', θy') of wafer stage WST computed from the measurement results of the interferometer system is used as the position coordinate used for servo control. Incidentally, because coordinate offset O at this point of time is also unreliable, correction is to be performed using the latest coordinate offset O out of the coordinate offsets O which have been verified in the past. And, in the case when the reliability is sufficiently restored, the position coordinate (Z, θy) of wafer stage WST computed from the measurement results of the surface position measurement system (ZsL, ZsR) is used as the position coordinate used in servo control, similar to the time of the first and fourth clocks.

When abnormality occurs in surface position measurement system 180, main controller 20 selects a suitable processing method according to the generation timing. As a processing method that can be performed frequently, the following three methods are prepared. First of all, (a) an alert of abnormality generation is issued to a user, however, the control is switched to a servo control of the position of wafer stage WST by interferometer system 118 by automatic operation without interrupting the processing. (b) An alert is issued to a user, and the user is requested to make a judgment such as, whether to continue the process believing that the backup operation has functioned normally, to switch from the servo control of the position of wafer stage WST by interferometer system 118 to the servo control according to surface position measurement system 180 (Z heads $72a$ to $72d$, $74_1$ to $74_5$, and $76_1$ to $76_5$), to perform the focus calibration and the focus mapping all over again, or to cancel the process. (c) Perform automatic switching of the servo control of the position of wafer stage WST, without issuing an alert. Method (a) should be applied at the time of exposure, whereas method (b) should be applied at the time of focus calibration and focus mapping. Incidentally, method (c) is to be applied at the time of switching of the servo control of the position of wafer stage WST from the control by surface position measurement system 180 (Z heads $72a$ to $72d$, $74_1$ to $74_5$, and $76_1$ to $76_5$) described later on to the control by interferometer system 118.

Because the influence of the air fluctuation on the Z heads is extremely small when compared with the interferometer, by using surface position measurement system 180 (Z heads $72a$ to $72d$, $74_1$ to $74_5$, and $76_1$ to $76_5$) (refer to FIG. 6), drive control of wafer stage WST can be performed with high precision. However, the Z head measures the surface position by scanning a probe beam on a surface (reflection surface) of the scale. Therefore, when water droplets, dust, flaws and the like adhere on the scale surface as previously described and the foreign materials are scanned, an inconvenience occurs such as an abnormal signal being output by a Z head or the output signals from the Z head being cut off. Accordingly, when abnormality occurs in the output signals from surface position measurement system 180, a means to prevent abnormal operation in the servo control of the position (Z, θy) of wafer stage WST becomes necessary.

As one of the means, there is a method of switching to a wafer table control using another sensor system, as in the backup control by interferometer system 118 (refer to FIG. 6) previously described. However, in order to inspect the reliability of the output signals of surface position measurement system 180 (Z heads $72a$ to $72d$, $74_1$ to $74_5$, and $76_1$ to $76_5$), the output signals must be monitored to some extent. By reason of the position control of wafer stage WST, output signals are to be monitored when the control sampling clock (control clock) is generated a predetermined number of times. Therefore, a delay time occurs from the time when abnormality actually occurs in Z heads $72a$ to $72d$, $74_1$ to $74_5$, and $76_1$ to $76_5$ until main controller 20 (refer to FIG. 6) detects the abnormality.

As an example of abnormality generation, a time interval will be considered herein in which a probe beam of a Z head scans a foreign material adhering on the surface of a scale, and the Z head outputs an abnormal measurement result. Assume that a probe beam of a Z head scans a foreign material while wafer stage WST is moving at a speed of 1 m/sec. In this case, the foreign material is to be a water droplet sufficiently larger than the expanse of the probe beam of the Z head. Further, for the sake of simply, the probe beam (scanning beam) of the Z head is to be completely blocked by the water droplet. However, at this point, the scale servo of the Z head is not to be performed. When the expanse of the probe beam is 1 mm, the time required for the probe beam to be completely cut off by the foreign material is 1 msec. More specifically, the output signal of focus sensor FS of the Z head takes 1 msec to be completely cut off, and moves into an unmeasurable state. Accordingly, the Z head (measuring section ZE) also takes 1 msec to output abnormal measurement results.

Meanwhile, in the case when, for example, the control clock number monitoring the output signal is 5, since the generation interval of the control clock is about 100 μsec in the embodiment, the time required for main controller 20 to actually detects abnormality from the abnormality generation in the output signal of the Z head (delay time) turns out to be 0.5 msec. This delay time 0.5 msec is not so negligibly short when compared with disappearance time 1 msec of the output signal at the time of abnormality generation obtained above. Accordingly, on detecting the abnormality of the output signals of Z heads $72a$ to $72d$, $74_1$ to $74_5$, and $76_1$ to $76_5$, it is difficult to switch to a servo control of the position (Z, θy) of wafer stage WST using another sensor system without the precision declining, especially in the case when wafer stage WST is driven at a high speed.

From the consideration described above, as an alternate means, it is desirable to use a stable sensor system whose temporal change of the output signals is moderate at the time of abnormality generation, or whose temporal change of the output signals does not cause a notable abnormal operation. In this regard, it is favorable to use interferometer system 118, however, as previously described, the interferometer is greatly influenced by air fluctuation and is inferior to surface position measurement system 180 in the viewpoint of precision in servo control of the position of wafer stage WST. Therefore, a servo control of the position (Z, θy) of wafer stage WST by a hybrid system is favorable that uses both interferometer system 118 serving as a main sensor system for a stable servo control of the position (Z, θy) of wafer stage WST, and surface position measurement system 180 (Z heads $72a$ to $72d$, $74_1$ to $74_5$, and $76_3$ to $76_5$) serving as a sub-sensor system to cover the precision of the servo control of the position (Z, θy) of wafer stage WST. For such a reason, in the embodiment, the following two alternative methods are employed.

A First Alternative Method

In a first alternative method, main controller 20 computes a position coordinate of wafer stage WST to be used for servo control of position (Z, θy) of wafer stage WST from the sum of position coordinate (Z', θy') of wafer stage WST computed from output signals of interferometer system 118 and coordinate offset $O = MA_K\{(Z, θy) - (Z', θy')\}$. However, (Z, θy) denotes the position coordinate of wafer stage WST computed from the output signals of surface position measurement system 180, and $MA_K$ denotes a moving average of a predetermined clock number K.

In the first alternative method, main controller 20 uses coordinate offset O as in the backup operation previously described by interferometer system 118, and inspects the reliability of the output signals of surface position measurement system 180 (Z heads $72a$ to $72d$, $74_1$ to $74_5$, and $76_1$ to $76_5$). When main controller 20 confirms that the output signals are normal, main controller 20 takes the sum of coordinate offset O which has been inspected and the position coordinate (Z', θy') of wafer stage WST computed from the output signals of interferometer system 118, and performs servo control of wafer stage WST using the position coordinates which can be obtained from the sum. Incidentally, in the case when moving average is not applied to coordinate offset O, when (Z', θy') obtained at the same time t and O are used, this would simply mean that the position coordinate (Z, θy) of wafer stage WST computed from the output signals of surface position measurement system 180 at time t is used.

Meanwhile, in the case main controller 20 detects abnormality in the output signals, main controller 20 does not use coordinate offset O in which abnormality has been detected, and performs servo control of the position of wafer stage WST using the position coordinate obtained from the sum of coordinate offset O which has been confirmed to be normal in the preceding inspection and position coordinate (Z', θy') of wafer stage WST computed from the output signals of interferometer system 118, or using position coordinate (Z', θy') of wafer stage WST computed from the output signals of interferometer system 118.

Figure 28:
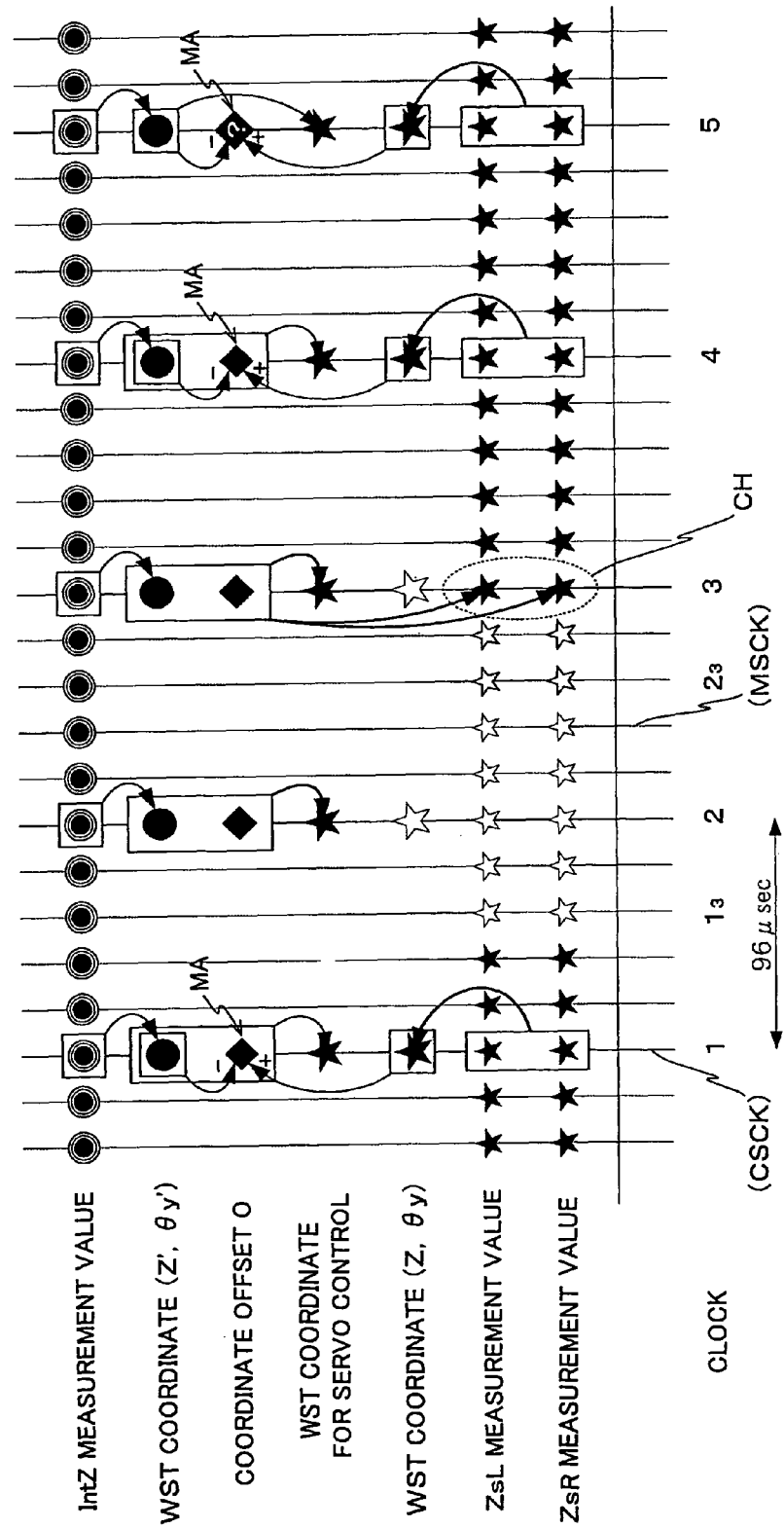
FIG. 28 is a view showing an outline of a linkage process in a servo drive control of the wafer stage in a hybrid method in which the interferometer system is used as the main system and the surface position measurement system is used as a sub sensor system.

FIG. 28 shows an outline of a servo control of the position of wafer stage WST by the hybrid system using interferometer system 118 and surface position measurement system 180 (Z heads $72a$ to $72d$, $74_1$ to $74_5$, and $76_1$ to $76_5$) in the first alternative method. Incidentally, the notation in the drawing is similar to FIG. 27 previously described. As it can be seen when comparing FIG. 27 and FIG. 28, the procedure such as the linkage process at the time of abnormality generation is completely the same as the backup operation by the interferometer system previously described except for the point that the position coordinate used for servo control of the position of wafer stage WST normally is replaced from position coordinate (Z, θy) obtained from measurement results of the surface position measurement system (ZsL, ZsR) to the sum of position coordinate (Z', θy') obtained from measurement results of interferometer system (IntZ) and coordinate offset O. Accordingly, a detailed description of FIG. 28 will be omitted.

In the first alternative method, at the time of stable operation when there is no sudden change in the output signals, the sum of position coordinate (Z', θy') of wafer stage WST computed from the output signals of interferometer system 118 and coordinate offset O becomes approximately equal to position coordinate (Z, θy) of wafer stage WST computed from the output signals of surface position measurement system 180. Accordingly, at the time of stable operation, a highly precise servo control of the position of wafer stage WST which is almost the same level as the servo control of the position of wafer stage WST based on the output signals of surface position measurement system 180 becomes possible.

If this first alternative method is employed, for example, in the servo control of the position of wafer stage WST during scanning exposure, error components by air fluctuation and the like included in the measurement values can be corrected using the measurement values of Z heads $74_i$ and $76_j$ of the highly precise surface position measurement system 180 at least in the Z-axis direction and the θy direction, while performing position control of wafer stage WST in the Z, θy, and θx directions based on the measurement values of interferometer system 118. This makes focus leveling control with high precision at the time of scanning exposure possible.

Incidentally, in the first alternative method, the update of coordinate offset O may be late, in order to inspect the output signals of surface position measurement system 180 (Z heads $72a$ to $72d$, $74_1$ to $74_5$, and $76_1$ to $76_5$). Further, because moving average is applied to coordinate offset O, the influence of the air fluctuation component of interferometer system 118 generated in a shorter time scale than the average time (the product of average number of times and control clock time interval) cannot be sufficiently corrected, which may be a generation factor of a control error. Incidentally, it is desirable to set the time (control clock number) required for inspection of the output signals long enough to perform a safe inspection, as well as short enough to be able to sufficiently correct the influence of the air fluctuation component of a short time scale.

A Second Alternative Method

In a second alternative method, main controller 20 uses position coordinate (Z', θy') of wafer stage WST computed from output signals interferometer system 118 as the position coordinate of wafer stage WST used for servo control of the position (Z, θy) of wafer stage WST. In this case, the influence of the air fluctuation of interferometer system 118 gives a limit to the position control precision of wafer stage WST. Therefore, by using surface position measurement system 180 together, the following process is executed for higher precision in the position control of wafer stage WST.

(a) Process at the time of focus mapping: A case will be considered when position control of wafer stage WST in the Z, θy, and θx directions at the time of focus mapping previously described is performed, based on measurement values of interferometer system 118. In this case, main controller 20 detects position information of wafer stage WST independent from the position control of wafer stage WST in the Z and θy directions using Z heads $72a$ to $72d$ of surface position measurement system 180 during the focus mapping, at a predetermined sampling timing in synchronization with interferometer system 118. In this case, the information obtained at the time of focus mapping is not used until exposure has been started. Therefore, until the beginning of exposure, main controller 20 corrects position coordinate (Z', θy') of wafer stage WST obtained from the detection information of interferometer system 180 taken in at each sampling timing, using position coordinate (Z, θy) of wafer stage WST obtained from the detection information of Z heads $72a$ to $72d$ which was taken in simultaneously. Further, at this point, main controller 20 inspects the reliability previously described of detection information of Z heads $72a$ to $72d$, and does not use the detected position coordinate data in which abnormality has been detected for the correction described above. By performing drive control of wafer stage WST in the Z and θy directions based on the position coordinate of wafer stage WST which has been corrected and the corresponding surface position detection data of wafer W obtained in the manner described above, as a consequence, a highly precise focus leveling control of wafer W becomes possible on exposure.

(b) Process in the latter half of focus calibration: A case will be considered when position control of wafer stage WST in the Z-axis direction is performed based on measurement values of interferometer system 118 (Z interferometers 43A and 43B), at the time of a Z scan measurement using aerial image measurement device 45 in the process in the latter half of the focus calibration previously described. In the aerial image measurement where the image of the object is picked up during a constant speed scan (during the Z scan), the position coordinate of wafer stage WST at the time when the control sampling clock is generated a predetermined number of times is used to correct a speed shift from a predetermined speed of wafer stage WST during the measurement. The correction of the speed shift herein means that a calculation that takes into consideration the speed shift (more specifically, the shift of the sampling position) is performed, at a stage to obtain the best focus position from the imaging data. Accordingly, in this case, the correction should be performed, by obtaining the speed shift using the positional information of wafer stage WST obtained from the output signals of Z heads $74_i$ and $76_j$ (i and j are one of 1 to 5) of surface position measurement system 180.

(c) Process at the Time of the Exposure

In exposure apparatus 100 of the embodiment, sufficient precision in the overlay and the image formation of the transfer pattern is secured by a synchronized drive control in which reticle stage RST is driven and controlled following up the movement of wafer stage WST. In this synchronized drive system, even if a control error of wafer stage WST occurs, if the follow-up performance of reticle stage RST is sufficiently good, the error will not affect the precision in the overlay and the image formation of the transfer pattern. Therefore, reticle stage RST is to be configured drivable in the Z-axis direction and the θy direction, and a position coordinate of wafer stage WST obtained from output signals of surface position measurement system 180 (Z heads $72a$ to $72d$, $74_1$ to $74_5$, and $76_1$ to $76_5$) is to be used as a position target value for follow-up control of reticle stage RST in the Z-axis direction and the θy direction.

Figure 29:
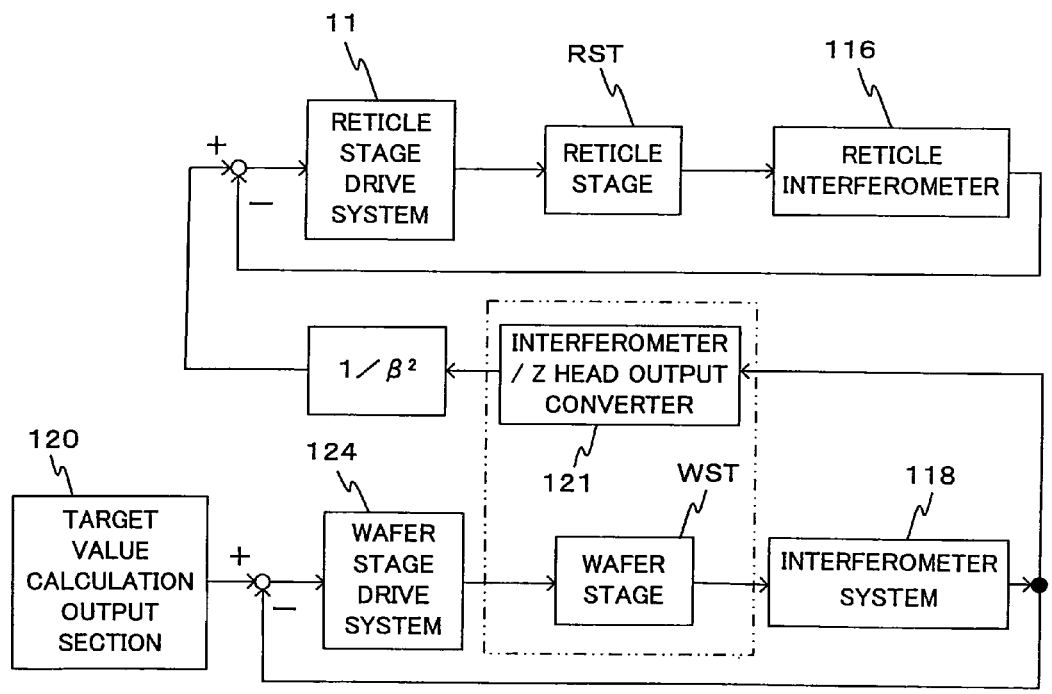
FIG. 29 is a block diagram showing an outline of a synchronized drive control of the reticle stage and the wafer stage of the hybrid method in which the surface position measurement system is used together with the interferometer system.

FIG. 29 is a block diagram typically showing a configuration of the synchronized drive control system of reticle stage RST and wafer stage WST which uses both the interferometer system and the surface position measurement system. In FIG. 29, a target value calculation output section 120 outputs a position target value of wafer stage WST to wafer stage drive system 124. Wafer stage drive system 124 drives wafer stage WST according to a difference between the position target value and the measured value from interferometer system 118. The measured value from interferometer system 118 is converted into a measured value of surface position measurement system 180 (Z heads $72a$ to $72d$, $74_1$ to $74_5$, and $76_1$ to $76_5$) by an interferometer/Z head output converter 121, and is furthermore magnified by a projection magnification of $1/\beta^2$ times, and then is output to reticle stage drive system 11 as a position target value of reticle stage RST. Reticle stage drive system 11 drives reticle stage RST according to a difference between the position target value and the measured value from reticle interferometer 116. Incidentally, in the control system of the stage (table), the stage itself does not configure a component of the control system, and further a signal of some sort is not supplied to the interferometer system from the stage, however, in FIG. 29, the configuration shown in the drawing is employed for the sake of simplicity. In FIG. 29, in the section surrounded by a phantom line (two-dot chain line), when wafer stage WST moves, interferometer system 118 measures the positional information of wafer stage WST, and at the same time, surface position measurement system 180 also measures the positional information of wafer stage WST, and the position (displacement) of wafer stage WST obtained based on the output of surface position measurement system 180 is multiplied by $1/\beta^2$ times, and is input to the reticle stage control system as a target value. This physical phenomenon is rearranged and shown in FIG. 29, to interferometer/Z head output converter 121 converting the output of interferometer system 118 which measures the position of wafer stage WST to the output of the Z heads (surface position measurement system).

In the control system shown in FIG. 29, even if an error occurs in the servo control of wafer stage WST by interferometer system 118, because highly precise measured values from surface position measurement system 180 (Z heads $72a$ to $72d$, $74_1$ to $74_5$, and $76_1$ to $76_5$) are input into reticle stage drive system 11 as position target values, synchronized drive control can be performed with sufficient precision. Incidentally, in this second alternative method, a control error may occur due to the air fluctuation component of interferometer system 118 generated in a short time scale, as in the first alternative method.

In the second alternative method described above, because servo control of the position of wafer stage WST is performed using interferometer system 118, it is favorable in terms of stability. On the other hand, in terms of control accuracy, while it is inferior to the servo control of the position of wafer stage WST using surface position measurement system 180, unless the air fluctuation component generated in a short time scale does not occur, or if it is sufficiently small, it should not be a problem in particular. Incidentally, it is desirable to set the time (control clock number) required for inspection of the output signals long enough to perform a safe inspection, as well as short enough to be able to sufficiently correct the influence of the air fluctuation component of a short time scale.

Incidentally, main controller 20 can perform control of wafer stage WST by a method (referred to as a third alternative method for the sake of convenience) which uses the first alternative method and the second alternative method together. In this third alternative method, because the accuracy of the position control of wafer stage WST of the first alternative method is constantly secured, positional shift at the time of the AF mapping and speed shift at the time of the Z-direction scan measurement in the latter processing of the focus calibration can be suppressed. In addition to this, because the correction process of the control error according to the second alternative method is also added, the control error at the time of AF mapping and the Z-direction scan measurement can be effectively reduced.

Incidentally, so far, in order to simplify the description, while main controller 20 performed the control of each part of the exposure apparatus including the control of the stage system (such as reticle stage RST and wafer stage WST), interferometer system 118, encoder system 150, surface position measurement system 180 and the like, as a matter of course, at least a part of the control of main controller 20 described above can be performed shared by a plurality of controllers. For example, a stage controller which performs operations such as the control of the stage system, switching of the heads of encoder system 150 and surface position measurement system 180 can be arranged to operate under main controller 20. Further, the control that main controller 20 performs does not necessarily have to be realized by hardware, and main controller 20 can realize the control by software according to a computer program that sets each operation of some controllers that perform the control sharing as previously described.

As described in detail above, according to exposure apparatus 100 of the embodiment, main controller 20 drives wafer stage WST in at least one of a direction orthogonal to the XY plane (the Z-axis direction) and a tilt direction (the θy direction) with respect to the XY plane based on positional information detected by interferometer system 118, while adjusting the positional information of wafer stage WST measured by interferometer system 118 (Z interferometers 43A and 43B) using the positional information detected by surface position measurement system 180. By this arrangement, it becomes possible to drive wafer stage WST in at least one of the Z-axis direction and the θy direction with good accuracy (refer to the first alternative method previously described), based on positional information detected by interferometer system 118 (Z interferometers 43A and 43B) whose error components have been corrected, while correcting the error components of the positional information detected by interferometer system 118 (Z interferometers 43A and 43B) caused by air fluctuation of measurement beams using the positional information detected by surface position measurement system 180 whose short-term stability of measurement is superior (highly precise measurement can be performed) when compared with interferometer system 118.

Further, according to exposure apparatus 100 of the embodiment, by transferring and forming the pattern of reticle R in each shot area on wafer W mounted on wafer table WTB which is driven with good precision as described above, it becomes possible to form a pattern with good precision in each shot area on wafer W.

Further, according to exposure apparatus 100 of the embodiment, main controller 20 drives wafer stage WST in the Z-axis direction and the tilt direction with respect to the XY plane based on information detected by interferometer system 118 which is superior in long-term stability of measurement, and by using information detected by surface position measurement system 180 which is superior (a highly precise measurement is possible) in short-term stability of measurement when compared with interferometer system 118, performs various calibration processes previously described (refer to the second alternative method previously described) to improve alignment accuracy of a pattern and wafer W in the Z-axis direction and the tilt direction with respect to the XY plane (at least in the θy direction). As a consequence, it becomes possible to form a pattern on wafer W held by wafer table WTB with high precision for over a long period of time.

Further, according to exposure apparatus 100 of the embodiment, by performing the focus leveling control of the wafer with high accuracy during scanning exposure using the Z heads without measuring the surface position information of the wafer W surface during exposure, based on the results of focus mapping performed beforehand, it becomes possible to form a pattern on wafer W with good precision. Furthermore, in the embodiment, because a high-resolution exposure can be realized by liquid immersion exposure, a fine pattern can be transferred with good precision on wafer W also from this viewpoint.

Incidentally, in the embodiment above, when focus sensor FS of each Z head performs the focus-servo previously described, the focal point may be on the cover glass surface protecting the diffraction grating surface formed on Y scales 39Y$_1$ and 39Y$_2$, however, it is desirable for the focal point to be on a surface further away than the cover glass surface, such as, on the diffraction grating surface. With this arrangement, in the case foreign material (dust) such as particles is on the cover glass surface and the cover glass surface becomes a surface which is defocused by the thickness of the cover glass, the influence of the foreign material is less likely to affect the Z heads.

In the embodiment above, the surface position measurement system which is configured having a plurality of Z heads arranged exterior to wafer table WTB (the upper part) in the operating range (a range where the device moves in the actual sequence in the movement range) of wafer stage WST and detects the Z position of wafer table WTB (Y scales 39Y$_1$ and 39Y$_2$) surface with each Z head was employed, however, the present invention is not limited to this. For example, a plurality of Z heads can be placed on a movable body (for example, wafer stage WST in the case of the embodiment above) upper surface, and a detection device, which faces the heads and has a reflection surface arranged outside the movable body that reflects the probe beam from the Z heads, can be employed, instead of surface position detection system 180. The point is, as long as the detection device is a device that has one or more than one detection positions arranged in at least a part of an operating area of a movable body (for example, wafer stage WST in the embodiment above), and detects positional information of the movable body in the Z-axis direction using detection information detected at each detection position when the movable body is positioned at any of the detection positions, the device can be employed instead of surface position detection system 180.

Further, in the embodiment above, an example has been described where the encoder system is employed that has a configuration where a grid section (an X scale and a Y scale) is arranged on a wafer table (a wafer stage), and X heads and Y heads facing the grid section are placed external to the wafer stage, however, the present invention is not limited to this, and an encoder system which is configured having an encoder head arranged on the movable body and has a two-dimensional grid (or a linear grid section having a two-dimensional placement) facing the encoder heads placed external to the movable body can also be adopted. In this case, when Z heads are also to be placed on the movable body upper surface, the two-dimensional grid (or the linear grid section having a two-dimensional placement) can also be used as a reflection surface that reflects the probe beam from the Z heads.

Further, in the embodiment above, the case has been described where each Z head is equipped with sensor main section ZH (the first sensor) which houses focus sensor FS and is driven in the Z-axis direction by the drive section (not shown), measurement section ZE (the second sensor) which measures the displacement of the first sensor (sensor main section ZH) in the Z-axis direction, and the like as shown in FIG. 7, however, the present invention is not limited to this. More specifically, with the Z head (the sensor head), the first sensor itself does not necessarily have to be movable in the Z-axis direction, as long as a part of the member configuring the first sensor (for example, the focus sensor previously described) is movable, and the part of the member moves according to the movement of the movable body in the Z-axis direction so that the optical positional relation (for example, a conjugate relation of the light receiving elements within the first sensor with the photodetection surface (detection surface)) of the first sensor with the measurement object surface is maintained. In such a case, the second sensor measures the displacement in the movement direction from a reference position of the movable member. As a matter of course, in the case a sensor head is arranged on the movable body, the movable member should be moved so that the optical positional relation of the measurement object of the first sensor, such as, for example, the two-dimensional grid described above (or the linear grid section having a two-dimensional placement) and the like with the first sensor is maintained, according to the position change of the movable body in a direction perpendicular to the two-dimensional plane.

Further, in the embodiment above, while the case has been described where the encoder head and the Z head are separately arranged, besides such a case, for example, a head that has both functions of the encoder head and the Z head can be employed, or an encoder head and a Z head that have a part of the optical system in common can be employed, or a combined head which is integrated by arranging the encoder head and the Z head within the same housing can also be employed.

Further, in the embodiment above, while the case has been described where the surface position of the measurement target surface is measured in a first control state of the Z head, or more specifically, in a focus servo control state, in which sensor main section ZH (the first sensor) which houses focus sensor FS as shown in FIG. 7 is driven in the Z-axis direction by the drive section (not shown) so that an optical positional relation with the measurement target surface is maintained, and displacement in the Z-axis direction of the first sensor in this state is measured, using measurement section ZE (the second sensor), the present invention is not limited to this. More specifically, the surface position of the measurement target surface can be measured in a second control state of the Z head, or more specifically, in the scale servo control state where the position of the first sensor in the Z-axis direction is controlled according to the measurement results of the second sensor, using the drive section (not shown), and the output signals (focus error I) of the first sensor are measured in such a state. In accordance with the same principle, instead of the Z head, a Z head with the first sensor fixed, or a sensor head configured only from the first sensor and does not include the drive section (not shown) and the second sensor can be used. Further, instead of the Z head, as well as the focus sensor by an optical pickup method, a displacement sensor head which can measure the displacement of the subject can be used.

Incidentally, in the embodiment above, while the lower surface of nozzle unit 32 and the lower end surface of the tip optical element of projection optical system PL were substantially flush, as well as this, for example, the lower surface of nozzle unit 32 can be placed nearer to the image plane (more specifically, to the wafer) of projection optical system PL than the outgoing surface of the tip optical element. That is, the configuration of local liquid immersion device 8 is not limited to the configuration described above, and the configurations can be used, which are described in, for example, EP Patent Application Publication No. 1 420 298, the pamphlet of International Publication No. 2004/055803, the pamphlet of International Publication No. 2004/057590, the pamphlet of International Publication No. 2005/029559 (the corresponding U.S. Patent Application Publication No. 2006/0231206), the pamphlet of International Publication No. 2004/086468 (the corresponding U.S. Patent Application Publication No. 2005/0280791), Kokai (Japanese Unexamined Patent Application Publication) No. 2004-289126 (the corresponding U.S. Pat. No. 6,952,253), and the like. Further, as disclosed in the pamphlet of International Publication No. 2004/019128 (the corresponding U.S. Patent Publication No. 2005/0248856), the optical path on the object plane side of the tip optical element may also be filled with liquid, in addition to the optical path on the image plane side of the tip optical element. Furthermore, a thin film that is lyophilic and/or has dissolution preventing function may also be formed on the partial surface (including at least a contact surface with liquid) or the entire surface of the tip optical element. Incidentally, quartz has a high affinity for liquid, and also needs no dissolution preventing film, while in the case of fluorite, at least a dissolution preventing film is preferably formed.

Incidentally, in the embodiment above, pure water (water) was used as the liquid, however, it is a matter of course that the present invention is not limited to this. As the liquid, a chemically stable liquid that has high transmittance to illumination light IL and is safe to use, such as a fluorine-containing inert liquid can be used. As the fluorine-containing inert liquid, for example, Fluorinert (the brand name of 3M United States) can be used. The fluorine-containing inert liquid is also excellent from the point of cooling effect. Further, as the liquid, liquid which has a refractive index higher than pure water (a refractive index is around 1.44), for example, liquid having a refractive index equal to or higher than 1.5 can be used. As this type of liquid, for example, a predetermined liquid having C—H binding or O—H binding such as isopropanol having a refractive index of about 1.50, glycerol (glycerin) having a refractive index of about 1.61, a predetermined liquid (organic solvent) such as hexane, heptane or decane, or decalin (decahydronaphthalene) having a refractive index of about 1.60, or the like can be cited. Alternatively, a liquid obtained by mixing arbitrary two or more of these liquids may be used, or a liquid obtained by adding (mixing) at least one of these liquids to (with) pure water may be used. Alternatively, as the liquid, a liquid obtained by adding (mixing) base or acid such as $H^+$, $Cs^+$, $K^+$, $Cl^-$, $SO_4^{2-}$, or $PO_4^{2-}$ to (with) pure water can be used. Moreover, a liquid obtained by adding (mixing) particles of Al oxide or the like to (with) pure water can be used. These liquids can transmit ArF excimer laser light. Further, as the liquid, liquid, which has a small absorption coefficient of light, is less temperature-dependent, and is stable to a projection optical system (tip optical member) and/or a photosensitive agent (or a protection film (top coat film), an antireflection film, or the like) coated on the surface of a wafer, is preferable. Further, in the case an $F_2$ laser is used as the light source, fomblin oil can be selected. Further, as the liquid, a liquid having a higher refractive index to illumination light IL than that of pure water, for example, a refractive index of around 1.6 to 1.8 may be used. As the liquid, supercritical fluid can also be used. Further, the tip optical element of projection optical system PL may be formed by quartz (silica), or single-crystal materials of fluoride compound such as calcium fluoride (fluorite), barium fluoride, strontium fluoride, lithium fluoride, and sodium fluoride, or may be formed by materials having a higher refractive index than that of quartz or fluorite (e.g. equal to or higher than 1.6). As the materials having a refractive index equal to or higher than 1.6, for example, sapphire, germanium dioxide, or the like disclosed in the pamphlet of International Publication No. 2005/059617, or kalium chloride (having a refractive index of about 1.75) or the like disclosed in the pamphlet of International Publication No. 2005/059618 can be used.

Further, in the embodiment above, the recovered liquid may be reused, and in this case, a filter that removes impurities from the recovered liquid is preferably arranged in a liquid recovery device, a recovery pipe or the like.

Incidentally, in the embodiment above, the case has been described where the exposure apparatus is a liquid immersion type exposure apparatus. However, the present invention is not limited to this, but can also be employed in a dry type exposure apparatus that performs exposure of wafer W without liquid (water).

Further, in the embodiment above, the case has been described where the present invention is applied to a scanning exposure apparatus by a step-and-scan method or the like. However, the present invention is not limited to this, but may also be applied to a static exposure apparatus such as a stepper. Further, the present invention can also be applied to a reduction projection exposure apparatus by a step-and-stitch method that synthesizes a shot area and a shot area, an exposure apparatus by a proximity method, a mirror projection aligner, or the like. Furthermore, the present invention can also be applied to a multi-stage type exposure apparatus equipped with a plurality of wafer stages, as is disclosed in, for example, Kokai (Japanese Unexamined Patent Application Publication) No. 10-163099 and No. 10-214783 (the corresponding U.S. Pat. No. 6,590,634), Kohyo (Published Japanese Translation of International Publication for Patent Application) No. 2000-505958 (the corresponding U.S. Pat. No. 5,969,441), the U.S. Pat. No. 6,208,407, and the like.

Further, the magnification of the projection optical system in the exposure apparatus of the embodiment above is not only a reduction system, but also may be either an equal magnifying system or a magnifying system, and projection optical system PL is not only a dioptric system, but also may be either a catoptric system or a catadioptric system, and in addition, the projected image may be either an inverted image or an upright image. Moreover, exposure area IA to which illumination light IL is irradiated via projection optical system PL is an on-axis area that includes optical axis AX within the field of projection optical system PL. However, for example, as is disclosed in the pamphlet of International Publication No. 2004/107011, the exposure area may also be an off-axis area that does not include optical axis AX, similar to a so-called inline type catadioptric system, in part of which an optical system (catoptric system or catadioptric system) that has plural reflection surfaces and forms an intermediate image at least once is arranged, and which has a single optical axis. Further, the illumination area and exposure area described above are to have a rectangular shape. However, the shape is not limited to rectangular, and can also be circular arc, trapezoidal, parallelogram or the like.

Incidentally, a light source of the exposure apparatus in the embodiment above is not limited to the ArF excimer laser, but a pulse laser light source such as a KrF excimer laser (output wavelength: 248 nm), an $F_2$ laser (output wavelength: 157 nm), an $Ar_2$ laser (output wavelength: 126 nm) or a $Kr_2$ laser (output wavelength: 146 nm), or an extra-high pressure mercury lamp that generates an emission line such as a g-line (wavelength: 436 nm) or an i-line (wavelength: 365 nm) can also be used. Further, a harmonic wave generating device of a YAG laser or the like can also be used. Besides the sources above, as is disclosed in, for example, the pamphlet of International Publication No. 1999/46835 (the corresponding U.S. Pat. No. 7,023,610), a harmonic wave, which is obtained by amplifying a single-wavelength laser beam in the infrared or visible range emitted by a DFB semiconductor laser or fiber laser as vacuum ultraviolet light, with a fiber amplifier doped with, for example, erbium (or both erbium and ytteribium), and by converting the wavelength into ultraviolet light using a nonlinear optical crystal, can also be used.

Further, in the embodiment above, illumination light IL of the exposure apparatus is not limited to the light having a wavelength equal to or more than 100 nm, and it is needless to say that the light having a wavelength less than 100 nm can be used. For example, in recent years, in order to expose a pattern equal to or less than 70 nm, an EUV exposure apparatus that makes an SOR or a plasma laser as a light source generate an EUV (Extreme Ultraviolet) light in a soft X-ray range (e.g. a wavelength range from 5 to 15 nm), and uses a total reflection reduction optical system designed under the exposure wavelength (e.g. 13.5 nm) and the reflective mask has been developed. In the EUV exposure apparatus, the arrangement in which scanning exposure is performed by synchronously scanning a mask and a wafer using a circular arc illumination can be considered, and therefore, the present invention can also be suitably applied to such an exposure apparatus. Besides such an apparatus, the present invention can also be applied to an exposure apparatus that uses charged particle beams such as an electron beam or an ion beam. In the exposure apparatus that uses the charged particle beam, an image-forming optical system including an electromagnetic lens which deflects (condenses light) a charged particle beam by magnetic force is used, however, in this case, by controlling the electromagnetic lens which is at least a part of the image-forming optical system using the positional information related to at least one of the Z-axis direction and the tilt direction with respect to the XY plane of the movable body such as wafer stage WST obtained from the detection information of a detection device such as surface position measurement system 180 in the embodiment above, the image-forming position of the pattern image which is to be formed by the image-forming optical system can be changed.

Further, in the embodiment above, a transmissive type mask (reticle) is used, which is a transmissive substrate on which a predetermined light shielding pattern (or a phase pattern or a light attenuation pattern) is formed. Instead of this reticle, however, as is disclosed in, for example, U.S. Pat. No. 6,778,257, an electron mask (which is also called a variable shaped mask, an active mask or an image generator, and includes, for example, a DMD (Digital Micromirror Device) that is a type of a non-emission type image display device (spatial light modulator) or the like) on which a light-transmitting pattern, a reflection pattern, or an emission pattern is formed according to electronic data of the pattern that is to be exposed can also be used.

Further, as is disclosed in, for example, the pamphlet of International Publication No. 2001/035168, the present invention can also be applied to an exposure apparatus (lithography system) that forms line-and-space patterns on a wafer by forming interference fringes on the wafer.

Moreover, the present invention can also be applied to an exposure apparatus that synthesizes two reticle patterns on the wafer via a projection optical system and almost simultaneously performs double exposure of one shot area on the wafer by one scanning exposure, as is disclosed in, for example, Kohyo (Published Japanese Translation of International Publication for Patent Application) No. 2004-519850 (the corresponding U.S. Pat. No. 6,611,316).

Further, an apparatus that forms a pattern on an object is not limited to the exposure apparatus (lithography system) described above, and for example, the present invention can also be applied to an apparatus that forms a pattern on an object by an ink-jet method.

Incidentally, an object on which a pattern is to be formed (an object subject to exposure to which an energy beam is irradiated) in the embodiment above is not limited to a wafer, but may be other objects such as a glass plate, a ceramic substrate, a film member, or a mask blank.

The use of the exposure apparatus is not limited only to the exposure apparatus for manufacturing semiconductor devices, but the present invention can also be widely applied, for example, to an exposure apparatus for transferring a liquid crystal display device pattern onto a rectangular glass plate, and an exposure apparatus for producing organic ELs, thin-film magnetic heads, imaging devices (such as CCDs), micromachines, DNA chips, and the like. Further, the present invention can be applied not only to an exposure apparatus for producing microdevices such as semiconductor devices, but can also be applied to an exposure apparatus that transfers a circuit pattern onto a glass plate or silicon wafer to produce a mask or reticle used in a light exposure apparatus, an EUV exposure apparatus, an X-ray exposure apparatus, an electron-beam exposure apparatus, and the like.

Incidentally, the movable body drive system and the movable body drive method of the present invention can be applied not only to the exposure apparatus, but can also be applied widely to other substrate processing apparatuses (such as a laser repair apparatus, a substrate inspection apparatus and the like), or to apparatuses equipped with a movable body such as a stage that moves within a two-dimensional plane such as a position setting apparatus for specimen or a wire bonding apparatus in other precision machines.

Incidentally, the disclosures of the various publications (descriptions), the pamphlets of the International Publications, and the U.S. patent application publication descriptions and the U.S. patent descriptions that are cited in the embodiment above and related to exposure apparatuses and the like are each incorporated herein by reference.

Semiconductor devices are manufactured through the following steps: a step where the function/performance design of the device is performed, a step where a wafer is made using silicon materials, a lithography step where the pattern formed on the reticle (mask) by the exposure apparatus (pattern formation apparatus) in the embodiment previously described is transferred on to a wafer, a development step where the wafer that has been exposed is developed, an etching step where an exposed member of an area other than the area where the resist remains is removed by etching, a resist removing step where the resist that is no longer necessary when etching has been completed is removed, a device assembly step (including processes such as a dicing process, a bonding process, and a packaging process), an inspection step and the like.

By using the device manufacturing method of the embodiment described above, because the exposure apparatus (pattern formation apparatus) in the embodiment above and the exposure method (pattern formation method) thereof are used in the exposure step, exposure with high throughput can be performed while maintaining the high overlay accuracy. Accordingly, the productivity of highly integrated microdevices on which fine patterns are formed can be improved.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. A movable body drive method in which a movable body is driven substantially along a two-dimensional plane, the method comprising:

a drive process in which positional information of the movable body related to at least one of a direction orthogonal to the two-dimensional plane and a tilt direction with respect to the two-dimensional plane is detected, using a first detection device which detects positional information of the movable body in the direction orthogonal to the two-dimensional plane from measurement results using measurement light irradiated along the two-dimensional plane between an outside of an operating area of the movable body and the movable body, and a second detection device that has at least one detection position placed in at least a part of the operating area of the movable body, and detects positional information of the movable body in the direction orthogonal to the two-dimensional plane using detection information detected when the movable body is positioned at the detection position, and the movable body is driven based on the positional information detected by the first detection device in at least one of the direction orthogonal to the two-dimensional plane and the tilt direction with respect to the two-dimensional plane, and the movable body is also driven so that the positional information detected by the first detection device when the movable body is positioned at the detection position of the second detection device is adjusted, using the positional information detected by the second detection device.

2. The movable body drive method according to claim 1 wherein the positional information detected by the first detection device when the positional information of the movable body cannot be detected by the second detection device is adjusted, based on a relation between the positional information detected by the second detection device and the positional information detected by the first detection device.

3. The movable body drive method according to claim 1 wherein
in the drive process, the adjustment is performed by computing a position coordinate of the movable body in at least a direction of one degree of freedom in an $n^{th}$ order coordinate system, where n is a natural number of three or less, among the direction orthogonal to the two-dimensional plane and rotational directions around two axes orthogonal to each other within the two-dimensional plane, based on a sum of a first position coordinate of the movable body in the $n^{th}$ order coordinate system computed from the information detected by the first detection device and offset information related to a difference between the first position coordinate and a second position coordinate of the movable body in the $n^{th}$ order coordinate system computed from the information detected by the second detection device.

4. The movable body drive method according to claim 3 wherein
the offset information is a moving average regarding a predetermined number of control clocks of the difference.

5. The movable body drive method according to claim 1, the method further comprising:
an inspection process in which reliability of the detection information of the second detection device is inspected, based on inspection information computed from the information detected by the first detection device and the information detected by the second detection device.

6. The movable body drive method according to claim 5 wherein
the inspection information is an offset information related to a difference between a first position coordinate of the movable body computed from the information detected by the first detection device in at least a direction of one degree of freedom in an $n^{th}$ order coordinate system, where n is a natural number of three or less, among the direction orthogonal to the two-dimensional plane and rotational directions around two axes orthogonal to each other within the two-dimensional plane, and a second position coordinate of the movable body in the $n^{th}$ order coordinate system computed from the positional information detected by the second detection device.

7. The movable body drive method according to claim 6 wherein
in the drive process, in the case the detection information of the second detection device is confirmed to be normal as a result of the inspection, a position coordinate of the movable body in the $n^{th}$ order coordinate system is computed based on a sum of the offset information that has been inspected and the first position coordinate, and in the case abnormality has been detected in the detection information of the second detection device as a result of the inspection, the position coordinate of the movable body is computed based on a sum of the offset information which has been confirmed to be normal in the preceding inspection and the first position coordinate.

8. The movable body drive method according to claim 1 wherein
as the second detection device, a detection device is used that has a plurality of detection positions and that has a plurality of sensor heads arranged at each detection position detecting positional information of a surface of the movable body substantially parallel to the two-dimensional plane in the direction orthogonal to the two-dimensional plane, with a reference plane parallel to the two-dimensional plane serving as a reference, and each sensor head includes a first sensor including a movable member which moves to maintain an optical positional relation with a measurement subject according to a positional change of the movable body in the direction orthogonal to the two-dimensional plane, and a second sensor which detects the displacement from a reference point of the movable member.

9. The movable body drive method according to claim 8 wherein
the second sensor generates a particular signal when the movable member is located at a specific position within a movement range.

10. A pattern formation method to form a pattern on an object wherein
a movable body on which the object is mounted is driven using the movable body drive method according to claim 1 to perform pattern formation to the object.

11. The pattern formation method according to claim 10 wherein
the detection position of the second detection device is placed on at least a part of an area where the movable body on which the object is mounted passes through at the time of the pattern formation.

12. The pattern formation method according to claim 10 wherein
the detection position of the second detection device is placed in an area where the movable body is located before the beginning of the pattern formation, in an area where the movable body passes through at the time of the pattern formation.

13. The pattern formation method according to claim 10, the method further comprising:
a measurement process in which information of position related to the object is measured, wherein
the detection position of the second detection device is placed on at least a part of an area where the movable body on which the object is mounted passes through in the measurement process.

14. The pattern formation method according to claim 13 wherein
the detection position of the second detection device is placed in an area where the movable body is located before the beginning of the measurement process, in the area where the movable body passes through in the measurement process.

15. A device manufacturing method, including,
forming a pattern on an object by the pattern formation method according to claim 10; and
developing the object on which the pattern is formed.

16. A movable body drive system in which a movable body is driven along a substantially two-dimensional plane, the system comprising:
a first detection device that detects positional information of the movable body in a direction orthogonal to the two-dimensional plane from measurement results using a measurement beam irradiated along the two-dimensional plane between an outside of an operating area of the movable body and the movable body;
a second detection device that has at least one detection position placed in at least a part of the operating area of the movable body, and detects positional information of the movable body in the direction orthogonal to the two-dimensional plane using detection information detected when the movable body is positioned at the detection position; and a controller that detects positional information of the movable body in at least one of the direction orthogonal to the two-dimensional plane and a tilt direction with respect to the two-dimensional plane using the first detection device and the second detection device, and drives the movable body in at least one of the direction orthogonal to the two-dimensional plane and the tilt direction with respect to the two-dimensional plane based on the positional information detected by the first detection device, while adjusting the positional information of the movable body detected by the first detection device using the positional information detected by the second detection device.

17. The movable body drive system according to claim 16 wherein the controller adjusts the positional information detected by the first detection device when the positional information of the movable body cannot be detected by the second detection device, based on a relation between the positional information detected by the second detection device and the positional information detected by the first detection device.

18. The movable body drive system according to claim 16 wherein the controller performs the adjustment by computing a position coordinate of the movable body in at least a direction of one degree of freedom in an $n^{th}$ order coordinate system, where n is a natural number of three or less, among the direction orthogonal to the two-dimensional plane and rotational directions around two axes orthogonal to each other within the two-dimensional plane, based on a sum of a first position coordinate of the movable body in the $n^{th}$ order coordinate system computed from the information detected by the first detection device and offset information related to a difference between the first position coordinate and a second position coordinate of the movable body in the $n^{th}$ order coordinate system computed from the information detected by the second detection device.

19. The movable body drive system according to claim 18 wherein the offset information is a moving average regarding a predetermined number of control clocks of the difference.

20. The movable body drive system according to claim 16 wherein the controller inspects reliability of the detection information of the second detection device, based on inspection information computed from the information detected by the first detection device and the information detected by the second detection device.

21. The movable body drive system according to claim 20 wherein the inspection information is an offset information related to a difference between a first position coordinate of the movable body computed from the information detected by the first detection device in at least a direction of one degree of freedom in an $n^{th}$ order coordinate system, where n is a natural number of three or less, among the direction orthogonal to the two-dimensional plane and rotational directions around two axes orthogonal to each other within the two-dimensional plane and a second position coordinate of the movable body in the $n^{th}$ order coordinate system computed from the positional information detected by the second detection device.

22. The movable body drive system according to claim 21 wherein in the case the detection information of the second detection device is confirmed to be normal as a result of the inspection, the controller computes a position coordinate of the movable body in the $n^{th}$ order coordinate system based on a sum of the offset information that has been inspected and the first position coordinate, and in the case abnormality has been detected in the detection information of the second detection device as a result of the inspection, the controller computes the position coordinate of the movable body based on a sum of the offset information which has been confirmed to be normal in the preceding inspection and the first position coordinate.

23. The movable body drive system according to claim 16 wherein the second detection device has a plurality of detection positions and has a plurality of sensor heads arranged at each detection position detecting positional information of a surface of the movable body substantially parallel to the two-dimensional plane in the direction orthogonal to the two-dimensional plane, with a reference plane parallel to the two-dimensional plane serving as a reference, and each sensor head includes a first sensor including a movable member which moves to maintain an optical positional relation with a measurement subject according to a positional change of the movable body in the direction orthogonal to the two-dimensional plane, and a second sensor which detects displacement from a reference point of the movable member.

24. The movable body drive system according to claim 23 wherein the second sensor generates a particular signal when the movable member is located at a specific position within a movement range.

25. A pattern formation apparatus that forms a pattern on an object, the apparatus comprising:

a patterning device which generates a pattern on the object; and the movable body drive system according to claim 16, wherein drive of a movable body on which the object is mounted is performed by the movable body drive system for pattern formation with respect to the object.

26. The pattern formation apparatus according to claim 25 wherein the second detection device has the detection position which is placed on at least a part of an area where the movable body on which the object is mounted passes through at the time of the pattern formation.

27. The pattern formation apparatus according to claim 25 wherein the second detection device has the detection position placed in an area where the movable body is located before the beginning of the pattern formation, in an area where the movable body passes through at the time of the pattern formation.

28. The pattern formation apparatus according to claim 25, the apparatus further comprising:

a measurement device which measures information of the position of the object, and the second detection device has the detection position which is placed on at least a part of an area where the movable body on which the object is mounted passes through when measurement processing is performed by the measurement device.

29. The pattern formation apparatus according to claim 28 wherein the second detection device has the detection position which is placed in an area where the movable body is located before the beginning of the measurement processing, in the area where the movable body on which the object is mounted passes through when the measurement processing is performed by the measurement device.

30. The pattern formation apparatus according to claim 28, the apparatus further comprising:

another movable body separate from the movable body holding a mask on which the pattern has been formed;

a position measuring device which measures positional information in the direction orthogonal to the two-dimensional plane and the tilt direction with respect to the two-dimensional plane of the another movable body; and an optical system which projects an image of the pattern onto the object, wherein the controller, as a calibration processing, performs a processing of changing an image-forming position of a pattern image by driving the movable body in at least one of the direction orthogonal to the two-dimensional plane and the tilt direction with respect to the two-dimensional plane based on positional information detected by the first detection device, and also by driving the another movable body which holds the mask where the pattern has been formed in at least one of the direction orthogonal to the two-dimensional plane and the tilt direction with respect to the two-dimensional plane, using detection information of both the position measuring device and the second detection device, at the time of the image formation of the pattern via the optical system.

* * * * *